(12) United States Patent
Omata et al.

(10) Patent No.: US 8,227,353 B2
(45) Date of Patent: Jul. 24, 2012

(54) METHOD FOR MANUFACTURING SEMICONDUCTOR DEVICE

(75) Inventors: Takatsugu Omata, Kanagawa (JP); Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 950 days.

(21) Appl. No.: 11/893,226

(22) Filed: Aug. 14, 2007

(65) Prior Publication Data

US 2008/0057718 A1    Mar. 6, 2008

(30) Foreign Application Priority Data

Aug. 31, 2006    (JP) ................. 2006-235522

(51) Int. Cl.
*H01L 21/326* (2006.01)
*H01L 21/479* (2006.01)
*H01L 21/00* (2006.01)
*G03F 7/00* (2006.01)

(52) U.S. Cl. .......... 438/709; 438/623; 430/311

(58) Field of Classification Search ........... 438/709
See application file for complete search history.

(56) References Cited

U.S. PATENT DOCUMENTS

| | | | |
|---|---|---|---|
| 4,594,471 A | 6/1986 | Yamazaki | |
| 4,603,470 A | 8/1986 | Yamazaki | |
| 4,725,558 A | 2/1988 | Yamazaki et al. | |
| 4,842,677 A * | 6/1989 | Wojnarowski et al. | 216/65 |
| 4,861,964 A | 8/1989 | Sinohara | |
| 4,927,493 A | 5/1990 | Yamazaki et al. | |
| 4,937,129 A | 6/1990 | Yamazaki | |
| 4,954,217 A | 9/1990 | Yamazaki et al. | |
| 4,970,368 A | 11/1990 | Yamazaki et al. | |
| 4,975,145 A | 12/1990 | Yamazaki et al. | |
| 5,018,164 A * | 5/1991 | Brewer et al. | 372/109 |
| 5,089,426 A | 2/1992 | Yamazaki et al. | |
| 5,187,601 A | 2/1993 | Yamazaki et al. | |
| 5,480,097 A | 1/1996 | Carter, Jr. et al. | |
| 5,585,949 A | 12/1996 | Yamazaki et al. | |
| 5,708,252 A | 1/1998 | Shinohara et al. | |

(Continued)

FOREIGN PATENT DOCUMENTS
EP    0 660 158 A2    6/1995
(Continued)

OTHER PUBLICATIONS

Yamazaki, S. et al, "Mask-Less Fabrication of A-Si Solar Cell Using Laser Scribe Process," 17th IEEE Photovoltaic Specialists Conference, May 1-4, 1984, IEEE, pp. 206-211.

(Continued)

*Primary Examiner* — Nadine G Norton
*Assistant Examiner* — Stephanie Duclair
(74) *Attorney, Agent, or Firm* — Husch Blackwell LLP

(57) ABSTRACT

A technique for increasing productivity by simplified steps in a manufacturing process of TFTs, electronic circuits using TFTs, and semiconductor devices formed of TFTs is provided. A method for manufacturing a semiconductor device includes forming a light absorbing layer, forming a light-transmitting layer on the light absorbing layer emitting a linear laser beam with a homogenized energy onto a mask and thereby splitting the linear laser beam into a plurality of laser beams and emitting the plurality of laser beams onto the light-transmitting layer on the light absorbing layer, and thereby forming a plurality of openings in the light-transmitting layer and the light absorbing layer.

8 Claims, 32 Drawing Sheets

U.S. PATENT DOCUMENTS

| | | | |
|---|---|---|---|
| 5,828,496 A | 10/1998 | Nishiwaki et al. | |
| 5,866,444 A | 2/1999 | Yamazaki et al. | |
| 6,149,988 A | 11/2000 | Shinohara et al. | |
| 6,261,856 B1 | 7/2001 | Shinohara et al. | |
| 6,399,258 B2 * | 6/2002 | O'Brien et al. | 430/17 |
| 6,445,005 B1 | 9/2002 | Yamazaki et al. | |
| 6,600,534 B1 | 7/2003 | Tanaka et al. | |
| 6,641,933 B1 | 11/2003 | Yamazaki et al. | |
| 6,670,637 B2 | 12/2003 | Yamazaki et al. | |
| 6,803,540 B2 | 10/2004 | Yamada et al. | |
| 6,894,312 B2 | 5/2005 | Yamazaki et al. | |
| 6,984,573 B2 | 1/2006 | Yamazaki et al. | |
| 7,062,849 B2 | 6/2006 | Ohashi et al. | |
| 7,067,198 B2 | 6/2006 | Yamada et al. | |
| 7,112,115 B1 | 9/2006 | Yamazaki et al. | |
| 7,112,374 B2 | 9/2006 | Yamazaki et al. | |
| 7,176,069 B2 | 2/2007 | Yamazaki et al. | |
| 7,180,197 B2 | 2/2007 | Nishi et al. | |
| 7,199,516 B2 | 4/2007 | Seo et al. | |
| 7,202,155 B2 | 4/2007 | Fukuchi | |
| 7,226,819 B2 | 6/2007 | Maekawa et al. | |
| 7,560,660 B2 | 7/2009 | Yamazaki et al. | |
| 8,049,138 B2 | 11/2011 | Yamada et al. | |
| 2001/0036755 A1 * | 11/2001 | Tanaka | 438/795 |
| 2005/0043186 A1 | 2/2005 | Maekawa et al. | |
| 2006/0158482 A1 | 7/2006 | Nakamura et al. | |
| 2006/0270175 A1 | 11/2006 | Aoki et al. | |
| 2007/0051952 A1 | 3/2007 | Yamazaki et al. | |
| 2007/0085938 A1 | 4/2007 | Yamazaki et al. | |
| 2008/0042288 A1 | 2/2008 | Yamazaki et al. | |

FOREIGN PATENT DOCUMENTS

| | | |
|---|---|---|
| JP | 60-37283 | 2/1985 |
| JP | 7-230057 | 8/1995 |
| JP | 2000-133636 | 5/2000 |
| JP | 2001-79678 | 3/2001 |
| JP | 2002-164591 | 6/2002 |
| JP | 2003-181678 | 7/2003 |
| JP | 2004-72086 | 3/2004 |
| JP | 2005-66628 | 3/2005 |

OTHER PUBLICATIONS

Yamazki, S. et al, "Fabrication of the Large-Area Integrated a-Si Solar Cells," The Materials Research Society, Mat. Res. Symp. Proc., vol. 70, Apr. 1986, pp. 487-492.

* cited by examiner

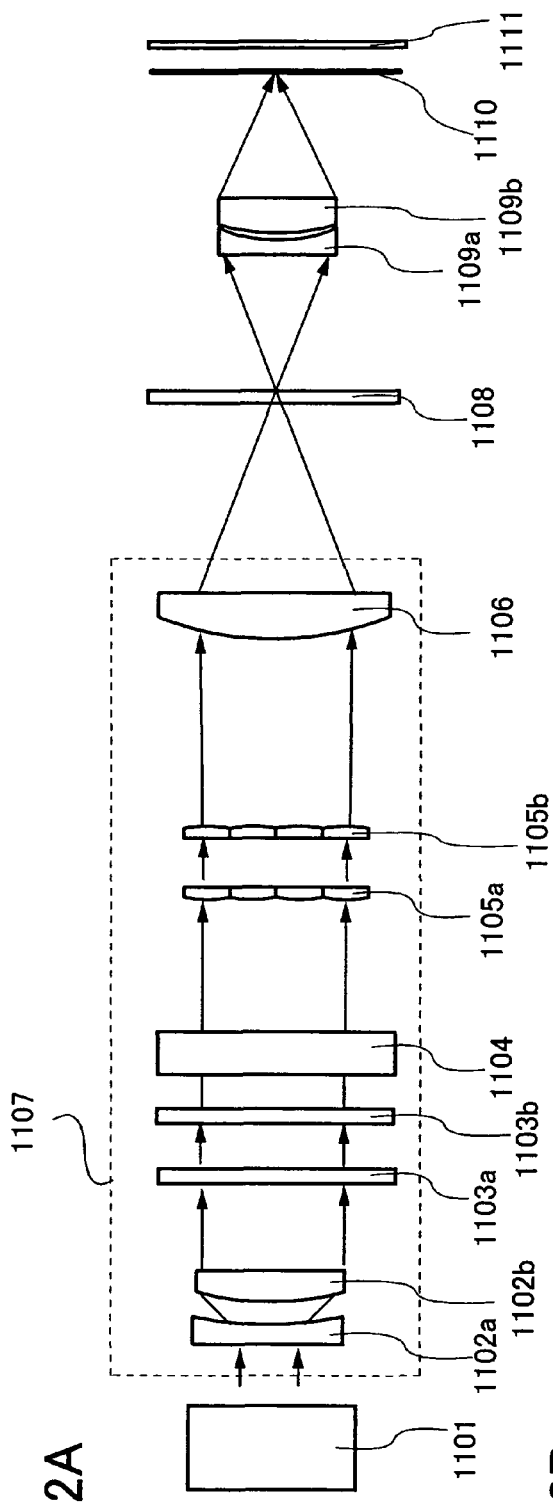
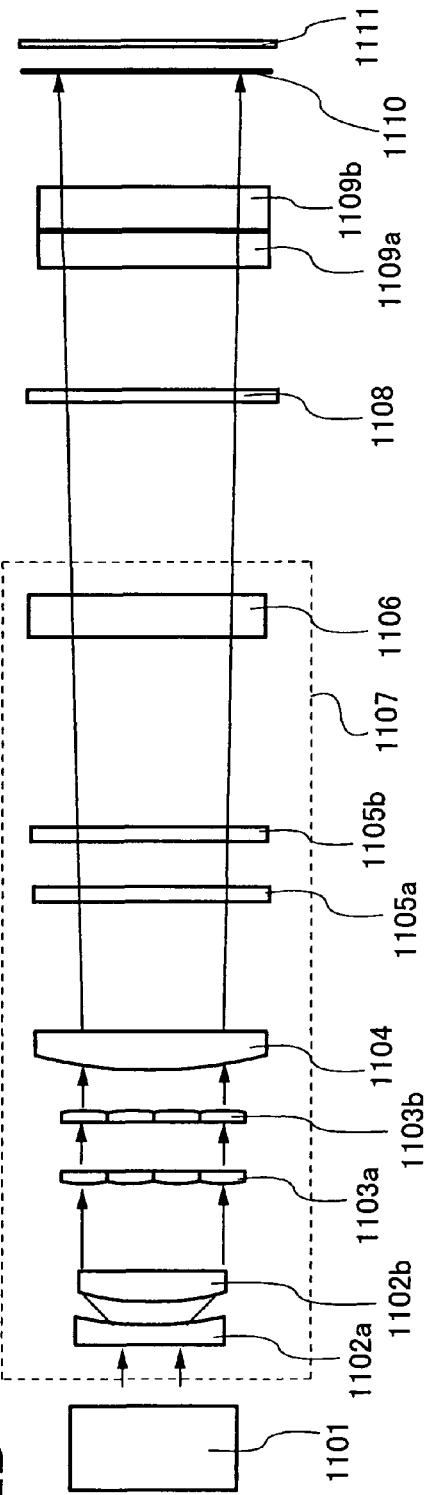
FIG. 2A
FIG. 2B 300 302 301a1 301a2 301a3 301b

METHOD FOR MANUFACTURING SEMICONDUCTOR DEVICE

BACKGROUND OF THE INVENTION

1. Field of the Invention

The present invention relates to a laser beam irradiation apparatus (an apparatus including a laser oscillator and an optical system for guiding laser light to a subject to be irradiated) and a laser light irradiation method. Further, the present invention also relates to a method for manufacturing a semiconductor device, including a step of the aforementioned laser light irradiation method. The present invention relates to a method for manufacturing a display device using a printing method.

2. Description of the Related Art

In recent years, growth in size and reduction in cost of liquid crystal televisions and plasma televisions have proceeded. Accordingly, liquid crystal televisions and plasma televisions have been capturing the television market at higher rates than CRTs (tube televisions). As a background against which reduction in cost of liquid crystal televisions and plasma televisions have proceeded, a progress in technology for manufacturing a thin film transistor (hereinafter referred to as a TFT) on a glass substrate is conceivable. In particular, productivity in the case of large substrates is remarkably increased and the amount (the number) of products obtained from one substrate is increased; therefore, prime cost is reduced and production is increased, which leads to reduction in cost of products.

Thin film transistors (hereinafter also referred to as TFTs) and an electronic circuit using a thin film transistor are manufactured by stacking thin films such as semiconductor films, insulating films, or conductive films over a substrate and forming a predetermined pattern as appropriate by a photolithography technique. A photolithography technique is a technique for transferring a pattern onto a substrate by utilizing light and a photomask. The pattern is formed on the photomask, by forming a pattern of a circuit or the like using a light-blocking material on a surface of a transparent planar plate, and it has been generally used in manufacturing processes for a semiconductor integrated circuit and the like. Then, an insulating film, a semiconductor film, a metal film, or the like is partially etched to be removed by using as a mask a pattern transferred to a substrate with the use of photolithography technique, so that the contact hole can be formed in a desired position.

For example, in the case of obtaining a contact hole having a desired shape by using photolithography technique, first, a photosensitizing agent such as a resist material is applied to a thin film on the substrate. Next, the substrate to which the photosensitizing agent is applied is irradiated with light having a wavelength, by which the photosensitizing agent is sensitized, through a photomask on which a desired pattern is formed in advance. Then, the pattern formed on the photomask is transferred to the photosensitizing agent (patterning process). From the substrate on which the pattern is formed, a portion of the photosensitizing agent, in which patterning is not performed, is removed and a portion of the photosensitizing agent, in which patterning is performed, is left as it is by appling developer (developing treatment). Thereafter, from the substrate, a portion of the thin film, over which a resist is not left, is removed by a dry etching method or a wet etching method (etching treatment) and at last, the left photosensitizing agent is removed by remover (removing treatment). Accordingly, the contact hole having a desired shape can be formed.

A conventional manufacturing process using a photolithography technique requires multiple steps of at least exposure, development, baking, removing, and the like. Therefore, as the number of the photolithography steps increases, the manufacturing cost inevitably increases. In order to solve this problem, attempts have been made to manufacture TFTs using a smaller number of photolithography steps (for example, see Patent Document 1: Japanese Published Patent Application No. 2000-133636). In Patent Document 1, after a resist mask formed by photolithography steps is used once, its volume expands and then is used again as a resist mask having a different shape.

SUMMARY OF THE INVENTION

However, for the photolithography process, at least five processing steps including application of a photosensitizing agent, patterning, developing treatment, etching treatment, and removing treatment have to be performed; therefore, it takes a long time to complete the steps and production is reduced. In addition, various chemical solutions such as a photosensitizing agent, a developer, and a remover are used; therefore, a harmful waste solution is generated in the process and thereby disposal cost of such a waste solution is added to manufacturing cost as well as prime cost of the chemical solution. Further, environmental pollution due to the chemical solution might be caused.

An object of the present invention is to provide a technique for increasing productivity by simplified steps in a manufacturing process of TFTs, electronic circuits using TFTs, and display devices formed of TFTs.

A laser irradiation apparatus of the present invention includes an optical system which forms laser light delivered from a laser oscillator into a linear beam on a surface of a subject to be irradiated, in which the linear beam delivered from the optical system is split into a plurality of laser beams through a mask. Note that as for the subject to be irradiated, a light absorbing layer and a light-transmitting layer are sequentially stacked over a substrate, and the light-transmitting layer is irradiated with the plurality of split laser beams, so that a plurality of openings are formed in the light-transmitting layer and the light absorbing layer concurrently.

A laser irradiation apparatus of the present invention includes a laser oscillator which emits a laser beam, an optical system which shapes the laser beam into a linear beam on a surface of a subject to be irradiated, and a mask which is provided between the optical system and the subject to be irradiated, in which the linear beam is split into a plurality of laser beams through the mask, and the plurality of laser beams are delivered to the subject to be irradiated.

A laser irradiation apparatus of the present invention includes a laser oscillator which emits a laser beam, an optical system which shapes the laser beam into a linear beam on a surface of a subject to be irradiated, a mask, and a micro lens array which is formed of a plurality of lenses, in which the mask and the micro lens array are provided between the optical system and the subject to be irradiated, the linear beam is split into a plurality of laser beams through the mask, and the plurality of laser beams are condensed through the micro lens array and then delivered to the subject to be irradiated.

In the laser irradiation apparatus of the present invention, the mask and the subject to be irradiated are provided so as to have a conjugate relation by the micro lens array.

In the laser irradiation apparatus of the present invention, the mask is a mask in which a plurality of holes are formed, a binary mask, or a phase shift mask.

In the laser irradiation apparatus of the present invention, the subject to be irradiated is a stack of a light absorbing layer and a light-transmitting layer.

In a method for manufacturing a semiconductor device of the present invention includes forming a light absorbing layer, forming a light-transmitting layer on the light absorbing layer, emitting a linear laser beam with a homogenized energy onto a mask and thereby splitting the linear laser beam into a plurality of laser beams, and emitting the plurality of laser beams onto the light-transmitting layer on the light absorbing layer, and thereby forming a plurality of openings in the light-transmitting layer and the light absorbing layer.

In a method for manufacturing a semiconductor device of the present invention includes forming a light absorbing layer, forming a light-transmitting layer on the light absorbing layer, emitting a linear laser beam with a homogenized energy onto a mask and thereby splitting the linear laser beam into a plurality of laser beams, condensing the plurality of laser beams through a micro lens array comprising a plurality of lenses; and emitting the condensed laser beams onto the light-transmitting layer on the light absorbing layer and thereby forming a plurality of openings in the light-transmitting layer and light absorbing layer.

In a method for manufacturing a semiconductor device of the present invention includes forming a first conductive layer, forming an insulating layer on the first conductive layer, emitting a linear laser beam with a homogenized energy onto a mask and thereby splitting the linear laser beam into a plurality of laser beams, emitting the plurality of laser beams onto the insulating layer on the first conductive layer, and thereby forming a plurality of openings in the insulating layer and the first conductive layer, and forming a second conductive layer in the plurality of openings and on the insulating layer, wherein the second conductive layer is electrically connected to the first conductive layer in the plurality of openings. The first conductive layer is a light absorbing layer, and the insulating layer is a light-transmitting layer.

In a method for manufacturing a semiconductor device of the present invention includes forming a first conductive layer, forming an insulating layer on the first conductive layer, emitting a linear laser beam with a homogenized energy onto a mask and thereby splitting the linear laser beam into a plurality of laser beams, condensing the plurality of laser beams through a micro lens array comprising a plurality of lenses, emitting the condensed laser beams onto the insulating layer on the first conductive layer, and thereby forming a plurality of openings in the insulating layer and the first conductive layer, and forming a second conductive layer in the plurality of openings and on the insulating layer, wherein the second conductive layer is electrically connected to the first conductive layer in the plurality of openings. The first conductive layer is a light absorbing layer, and the insulating layer is a light-transmitting layer.

In a method for manufacturing a semiconductor device of the present invention, the mask is a mask in which a plurality of hole are formed, a binary mask, or a phase shift mask.

In the aforementioned structure, a material formed of an element such as titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), or barium (Ba) can be used for the light absorbing layer. Alternatively, a single layer of an alloy material which includes the above element as a main component, a nitrogen compound, an oxygen compound, a carbon compound, or a halogen compound, or stacked layers thereof may be used. Alternatively, an insulating film in which particles capable of absorbing light are dispersed, typically, a silicon oxide film in which silicon microcrystals are dispersed may be used. Alternatively, an insulting film in which pigments are dissolved or dispersed may be used. A light-transmitting layer may be formed of any material as long as it transmits laser light and for example, a light-transmitting organic resin or the like can be used.

The present invention can also be applied to a display device. A display device using the present invention may be a light-emitting display device in which a TFT is connected to a light-emitting element including a layer containing an organic material, an inorganic material, or a mixture of an organic material and an inorganic material which causes light emission called electroluminescence (hereinafter also referred to as EL) between electrodes; a liquid crystal display device; or the like.

In the present invention, a linear beam is delivered into a plurality of openings in a mask, which are formed in a longitudinal direction of the linear beam. Accordingly, the linear beam can be split into a plurality of laser beams and a plurality of contact holes can be formed concurrently in an interlayer insulating layer irradiated with the laser beams. Further, by arranging a micro lens array in accordance with the openings of the mask, the condensed laser beam can be delivered to a surface of a subject to be irradiated, thereby a contact hole can be miniaturized. By using the present invention, the plurality of contact holes can be easily formed in the interlayer insulating layer in a single step.

By using the present invention, it is not necessary to use a complicated photolithography process including many steps for forming a contact hole; therefore, the steps can be simplified and productivity can be increased. Accordingly, loss of materials and the cost can be reduced. By the present invention, a high-performance and highly reliable semiconductor device can be manufactured with a high yield.

BRIEF DESCRIPTION OF DRAWINGS

FIGS. 2A and 2B are schematic views showing the present invention.

DETAILED DESCRIPTION OF THE INVENTION

Figure 1:
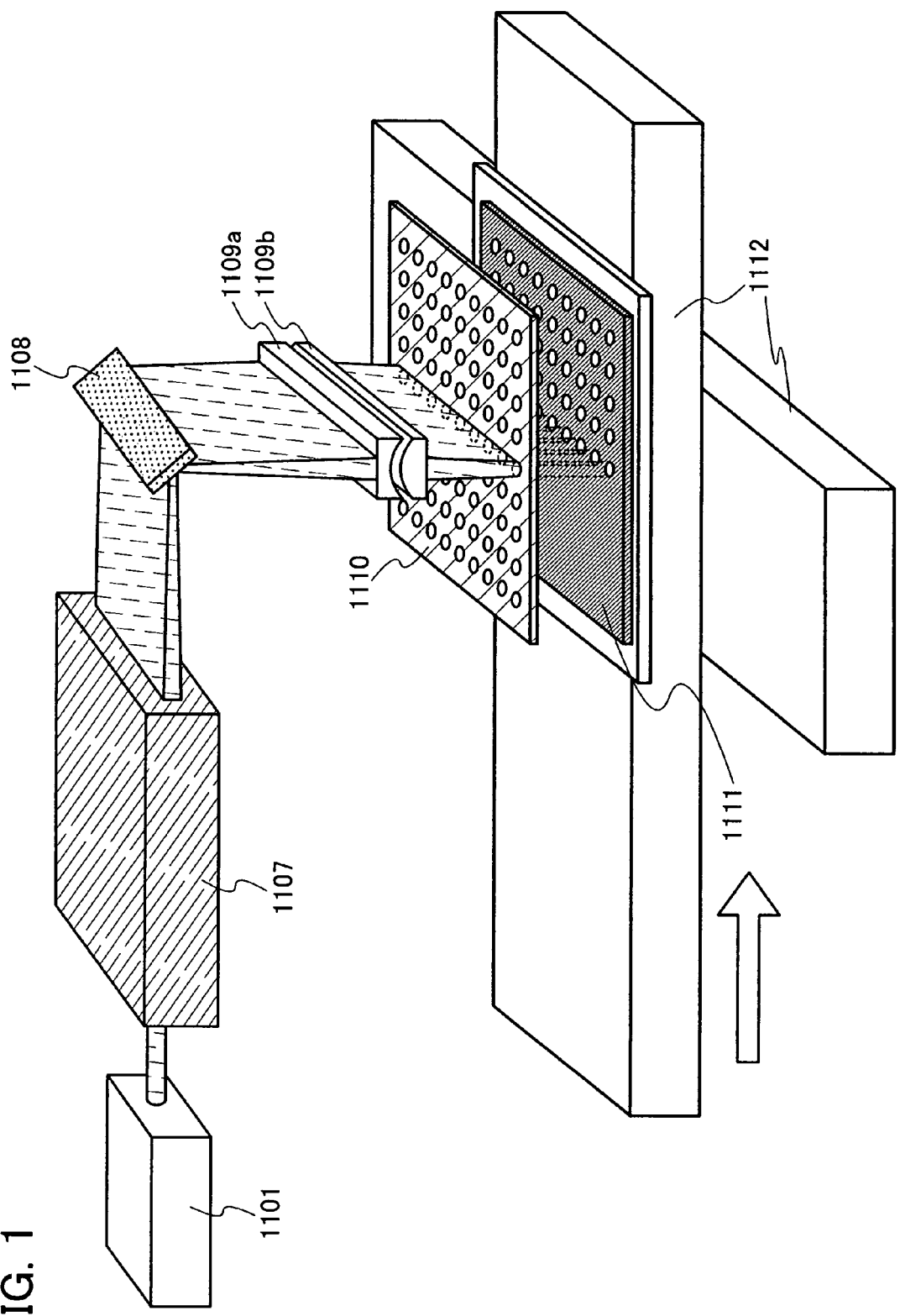
FIG. 1 is a schematic view showing the present invention.

Although the invention will be fully described by way of embodiment modes with reference to the accompanying drawings, it is to be understood by those skilled in the art that various changes and modifications can be made without departing from the spirit and scope of the invention. Therefore, the present invention should not be construed as being limited to the description in the following embodiment modes. Note that common portions and portions having a similar function are denoted by the same reference numerals in all diagrams for describing embodiment modes, and repetitive description thereof is omitted. Note that embodiment modes described below can be implemented in free combination.

(Embodiment Mode 1)

This embodiment mode provides a laser beam irradiation apparatus and a manufacturing method of a semiconductor device, which are for forming openings (so-called contact holes) in a light-transmitting layer by laser ablation. Note that laser ablation means a method for processing a thin film or a substance, in which a hole is formed in or cut from a thin film or a substance by using a laser beam. A thin film of a substance is irradiated with a laser beam and the laser beam is absorbed in the thin film or the substance to be converted into heat, thereby a part of the thin film or the substrate is removed so that a hole is formed or cut.

In this embodiment mode, a mask in which a plurality of holes having the same or approximately the same diameter as a contact hole in desired positions is irradiated with a laser beam shaped to have a linear shape (linear beam) and a substrate before a step of contact opening formation, which is provided under the mask, is irradiated with only the laser beam transmitted through the mask. In this embodiment mode, by irradiation with the linear beam through the mask in which the plurality of holes are formed, a plurality of contact holes can be formed concurrently.

Note that in this specification, a laser beam having a linear shape on a surface to be irradiated is referred to as a linear beam. The term "linear" used herein means not a line in a strict sense but a rectangle with a large aspect ratio (for example, an aspect ratio of 10 or more (preferably 100 or more). Incidentally, the laser beam has a linear shape for improving efficiency of laser ablation; therefore, the laser beam may have a rectangular shape or an elliptical shape instead.

First, an example of a laser beam irradiation apparatus for irradiating a processing region with laser light (also referred to as a laser beam) is described with reference to FIG. 1. The laser beam irradiation apparatus shown in FIG. 1 includes a laser oscillator 1101, an optical unit 1107, a reflecting mirror 1108, doublet lenses 1109a and 1109b, and a mask 1110. Note that the reflecting mirror 1108 or the doublet lenses 1109a and 1109b are not necessarily provided, and it is only necessary to provide an optical system, which shapes the laser beam delivered from the laser oscillator 1101 into a linear beam on a surface of the mask 1110, between the laser oscillator 1101 and the mask 1110.

Here, an example of the optical unit 1107 in the laser beam irradiation apparatus shown in FIG. 1 is described with reference to FIGS. 2A and 2B. FIG. 2B is a top plan schematic view showing the laser beam irradiation apparatus shown in FIG. 1. In this embodiment mode, the optical unit 1107 is provided with a homogenizer and sequentially includes spherical lenses 1102a and 1102b, cylindrical lens arrays 1103a and 1103b, a cylindrical lens 1104, cylindrical lens arrays 1105a and 1105b, and a cylindrical lens 1106 from the laser oscillator 1101 side. Here, a cylindrical lens array refers to a plurality of cylindrical lenses having the same curvature, which are arranged side by side, and has a function of splitting the incident laser beam into laser beams of the same number as included cylindrical lenses. Note that in this embodiment mode, a short side direction of the linear beam corresponds to a direction in which a width of a spot of the linear beam, which is formed on the surface of the mask 1110, is narrow. While, a long side direction of the linear beam corresponds to a direction in which a width of a spot of the linear beam, which is formed on the surface of the mask 1110, is wide. The laser beam from the laser oscillator 1101 is delivered in a direction shown by arrows.

In FIG. 2B, the laser beam delivered from the laser oscillator 1101 is broadened by the spherical lenses 1102a and 1102b. Note that the spherical lenses 1102a and 1102b are not necessary in the case where a spot of the beam delivered from the laser oscillator 1101 is sufficiently broad. Subsequently, the spot is split in a long-side (long-axis) direction of a linear shape by the cylindrical lens arrays 1103a and 1103b. Thereafter, the split laser beam is combined into a linear beam on the mask 1110 by the cylindrical lens 1104 provided behind the cylindrical lens array 1103b. Accordingly, energy distribution of the spot of the linear beam in a long side direction is homogenized (long-axis homogenization), so that a length in the long-side direction is determined.

Next, a schematic view of a side of the optical system of this embodiment mode is described with reference to FIG. 2A. The laser beam delivered from the laser oscillator 1101 is broadened by the spherical lenses 1102a and 1102b. This structure is not necessary in the case where a spot of the beam delivered from the laser oscillator 1101 is sufficiently broad. Subsequently, the spot is split in a short-side (short-axis) direction by the cylindrical lens arrays 1105a and 1105b. Thereafter, the split laser beam is combined into one beam by the cylindrical lens 1106 provided behind the cylindrical lens array 1105b and then condensed by the doublet lenses 1109a and 1109b. Accordingly, energy distribution of the spot of the linear beam in a short side direction is homogenized (short-axis homogenization), and a subject to be irradiated 1111 is irradiated with the linear beam with homogenized energy distribution.

In general, to uniform energy distribution of a laser beam is referred to as "homogenize", and an optical system for homogenization is referred to as a "homogenizer". Note that a structure of the optical unit 1107 is not limited to that shown in FIGS. 2A and 2B.

Note that in the laser beam irradiation apparatus shown in FIG. 1, the laser beam delivered from the laser oscillator 1101 passes through the optical unit 1107. Subsequently, the laser beam is reflected by the reflecting mirror 1108 so that the subject to be irradiated 1111 is irradiated with the laser beam perpendicularly. The laser beam reflected by the reflecting mirror 1108 is condensed in a short-side direction of a linear beam by the doublet lenses 1109a and 1109b. The condensed linear beam reaches the mask 1110 in which holes having a diameter the same or approximately the same as a contact diameter are formed in desired positions and the subject to be irradiated 1111 is irradiated with only the laser beam transmitted through the mask 1110. Contact openings are formed by irradiation with the laser beam. Note that there is no particular limitation on a material of the mask 1110 as long as it is a material which does not transmit or absorb a laser beam.

Further, a transfer mechanism 1112 and the mask 1110 are transferred with constant speed in a direction shown by the arrow in FIG. 1, and thereby laser irradiation is performed to the subject to be irradiated 1111 entirely. In this embodiment mode, a linear beam can be delivered into a plurality of holes formed in the mask 1110 concurrently, thereby the linear beam can be split into a plurality of laser beams through the mask. Therefore, with the plurality of laser beams can be delivered into a plurality of portions on the subject to be irradiated 1111 all at once. In this embodiment mode, the transfer mechanism 1112 is an XY stage and has a mechanism which moves in an X axis or Y axis direction. The transfer mechanism 1112 may also have a mechanism which rotates. Note that in this embodiment mode, the subject to be irradiated corresponds to a stack of a light absorbing layer and a light-transmitting layer over a substrate.

Note that the mask 1110 necessarily may have the same size as the subject to be irradiated 1111 when a substrate size is large enough to be irradiated with the laser by one (one-way) scan. In addition, for example, laser irradiation is performed twice (two way) and positions of contact holes formed by a first scan and a second scan are the same, the mask 1110 can be used again; therefore, the mask 1110 may have a size for one scan.

Next, a method for forming openings by the laser beam irradiation apparatus shown in FIG. 1 is described with reference to FIGS. 3A to 3D. In this embodiment mode, as shown in FIGS. 3A to 3D, a stacked film including a conductive layer 721a and a conductive layer 721b is formed as a light absorbing layer over a substrate 720 and an insulating layer 722 is formed as a light-transmitting layer.

The conductive layer 721a and the conductive layer 721b have a stacked-layer structure. In this embodiment mode, the conductive layer 721b is formed using a low-melting point metal that is relatively easily vaporized (chromium in this embodiment mode), and the conductive layer 721a is formed using a high-melting point metal that is not easily vaporized compared to the conductive layer 721b (tungsten in this embodiment mode). Note that in this embodiment mode, as conductive layers under the insulating layer, conductive layers having different melting points are stacked; however, it is needless to say that a single-layer structure may be employed. Note that there is no limitation on the insulating layer 722 as long as it is a layer formed of a material which transmits laser light. For example, a light-transmitting organic resin or the like can be used.

The layer provided under the insulating layer is not necessarily a conductive layer, and the layer is not particularly limited as long as it is a layer formed of a material which absorbs laser light (also referred to as a light absorbing layer) so that laser ablation can be performed. For example, for the light absorbing layer, a material formed of an element such as titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), or barium (Ba) can be used. Alternatively, an alloy material which includes the above element as a main component, a single layer of a nitrogen compound, an oxygen compound, a carbon compound, or a halogen compound, or stacked layers thereof may be used. Alternatively, an insulating film in which particles capable of absorbing light are dispersed, typically, a silicon oxide film in which silicon microcrystals are dispersed may be used. Alternatively, an insulting film in which pigments are dissolved or dispersed may be used. A light absorbing layer can be formed as a single layer or stacked layers by a layer formed of any of the aforementioned materials.

Note that as a method for forming the light absorbing layer, an application method, an electrolytic plating method, a PVD (Physical Vapor Deposition) method, or a CVD (Chemical Vapor Deposition) method can be used.

Figure 3A:
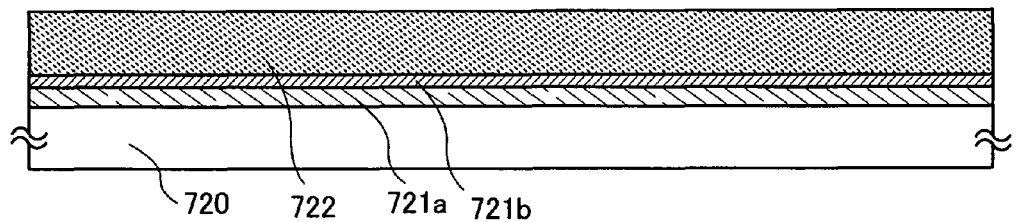
FIGS. 3A to 3D are schematic views showing the present invention.
Figure 3B:
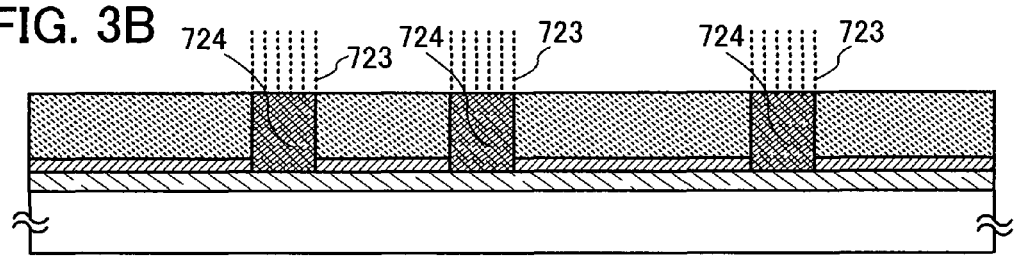
Figure 3C:
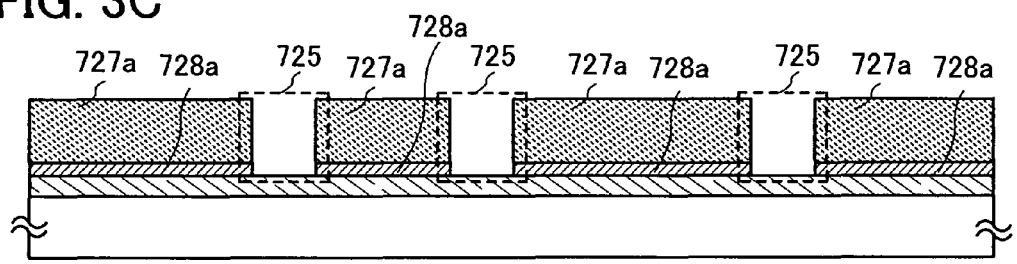
Figure 3D:
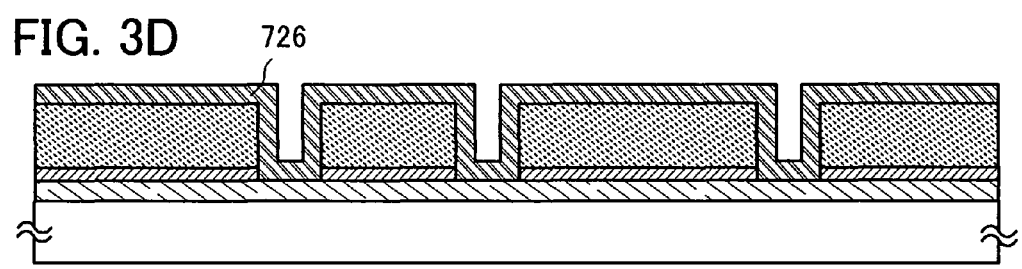

Next, as shown in FIG. 3B, the conductive layer 721a and the conductive layer 721b (a plurality of irradiation regions 724) are selectively irradiated with laser light 723 from the insulating layer 722 side. Note that the laser light 723 is delivered from the laser beam irradiation apparatus shown in FIG. 1. Here, the laser light 723 transmits through the insulating layer 722 but is absorbed in the conductive layer 721b. The irradiation regions of the conductive layer 721b are heated to be vaporized by an energy of the delivered laser light, and thereby damaging the insulating layer 722. Thus, portions of the insulating layer 722, which are over the irradiation regions of the conductive layer 721b, are removed, so that a plurality of openings 725 where the conductive layer 721a and the conductive layer 721b are partially exposed can be formed (see FIG. 3C). The conductive layer 721b is patterned to be a conductive layer 728a, and the insulating layer 722 is patterned to be an insulating layer 727a (see FIG. 3C). After that, a conductive layer 726 is formed in the openings 725 where the conductive layer 721a and the conductive layer 721b are exposed and thereby the conductive layers 721a and 721b can be electrically connected to the conductive layer 726 (see FIG. 3D).

By the laser beam irradiation apparatus of this embodiment mode, a plurality of contact holes can be formed concurrently without using a complicated photolithography process. In addition, in this embodiment mode, a linear beam with homogenized energy distribution is used; therefore, laser ablation for forming contact holes can be easily performed as compared to the case where a laser beam with Gaussian distribution.

As the laser oscillator 1101, a laser oscillator capable of emitting ultraviolet light, visible light, or infrared light can be used. The following laser oscillators can be used: an excimer laser oscillator of KrF, ArF, XeCl, Xe, or the like; a gas laser oscillator of He, He—Cd, Ar, He—Ne, HF, or the like; a solid-state laser oscillator using a crystal such as YAG; GdVO$_4$, YVO$_4$, YLF, or YAlO$_3$ doped with Cr, Nd, Er, Ho, Ce, Co, Ti, or Tm; and a semiconductor laser oscillator of GaN, GaAs, GaAlAs, InGaAsP, or the like. In the case of the solid-state laser oscillator, first to fifth harmonics of fundamental waves are preferably used. In order to adjust the shape or path of a laser beam delivered from the laser oscillator, an optical system including a shutter, a reflector such as a mirror or a half mirror, a cylindrical lens, a convex lens, and the like may be provided.

An example where in the apparatus shown in FIG. 1, a front surface of the substrate is irradiated with laser light is shown. Alternatively, a structure in which a back surface of the substrate is irradiated with laser light may be used by changing the optical system and the transfer mechanism 1112 as appropriate.

Here, the substrate is moved and selectively irradiated with the laser beam; however, the present invention is not limited thereto. The laser beam can be delivered while scanning the laser beam in the x-axis and y-axis directions.

The conductive layers 721*a* and 721*b* can be formed by an evaporation method, a sputtering method, a PVD (Physical Vapor Deposition) method, a CVD (Chemical Vapor Deposition) method such as a low-pressure CVD (LPCVD) method or a plasma CVD method, or the like. Alternatively, a method by which a component can be formed into a desired pattern by transferring or drawing, for example, various printing methods (a method for forming a component into a desired pattern, such as screen (mimeograph) printing, offset (planograph) printing, relief printing, or gravure (intaglio) printing), a dispensing method, a selective-coating method, or the like may be used. As the conductive layers 721*a* and 721*b*, one or a plurality of chromium, molybdenum, nickel, titanium, cobalt, copper, tungsten, and aluminum can be used.

In FIGS. 3A to 3D, an example is shown, in which the conductive layer 721*b* is vaporized by irradiation with the laser light 723, the openings 725 are formed in the insulating layer 722, and the conductive layer 72*a* to be stacked remains. FIGS. 4A to 4D show other examples in which an opening is formed to reach a conductive layer formed below an insulating layer. Note that FIGS. 4A to 4D show other examples in which one opening is formed; however, it is needless to say that a plurality of openings can be formed concurrently in a similar manner to those shown in FIGS. 3A to 3D.

Figure 4A:
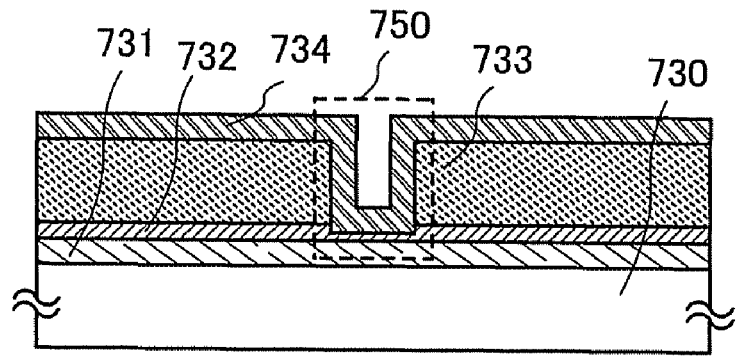
FIGS. 4A to 4D are schematic views showing the present invention.

FIG. 4A shows an example in which laser ablation is performed to only an upper portion of an upper conductive layer of conductive layers which are stacked below an insulating layer. Conductive layers 731 and 732, and an insulating layer 733 are provided over a substrate 730, and a conductive layer 734 is provided in an opening 750 formed in the conductive layer 732 and the insulating layer 733. In the opening 750, the conductive layer 732 is exposed and in contact with and electrically connected to the conductive layer 734.

Figure 4B:
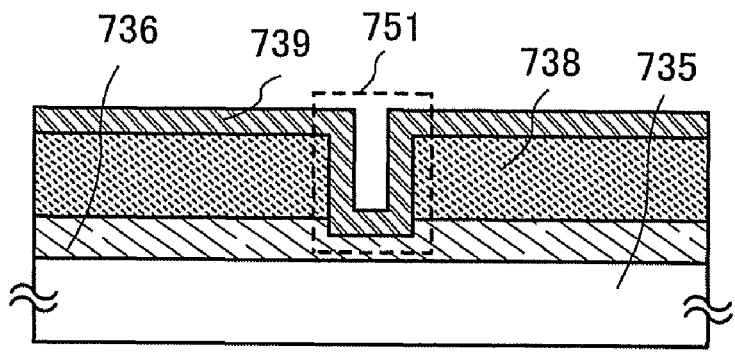
Figure 4C:
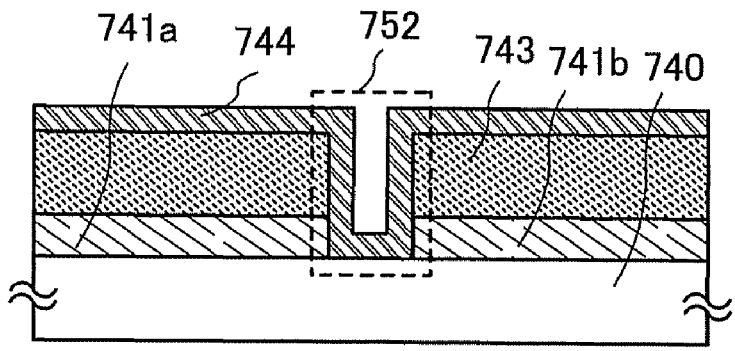

The conductive layer below the insulating layer may be a stack of a plurality of kinds of conductive layers with different melting points, or needless to say, may be a single layer. FIGS. 4B and 4C show examples in which a conductive layer below an insulating layer is a single layer. FIG. 4B is an example in which laser ablation is performed to only an upper portion of a conductive layer below an insulating layer. FIG. 4C is an example in which a portion of a conductive layer below an insulating layer is removed by laser ablation to expose a substrate 740.

In FIG. 4B, a conductive layer 736 and an insulating layer 738 are provided over a substrate 735, and a conductive layer 739 is provided in an opening 751 formed in the conductive layer 736 and the insulating layer 738. In the opening 751, the conductive layer 736 is exposed and is in contact with and electrically connected to the conductive layer 739. As shown in FIG. 4B, when only the upper portion of the conductive layer is partially removed in a thickness direction, laser beam irradiation conditions (such as energy and irradiation time) may be controlled, or the conductive layer 736 may be formed thick.

In FIG. 4C, conductive layers 741*a* and 741*b*, and an insulating layer 743 are provided over a substrate 740, and a conductive layer 744 is provided in an opening 752 and over the insulating layer 743. In the opening 752, the conductive layers 741*a* and 741*b* are exposed and are in contact with and electrically connected to the conductive layer 744. The upper conductive layer and the lower conductive layer are not necessarily in contact with each other at the bottom of the opening, and the upper conductive layer may be formed so as to be in contact with and electrically connected to the lower conductive layer exposed on the side surface of the opening.

Figure 4D:
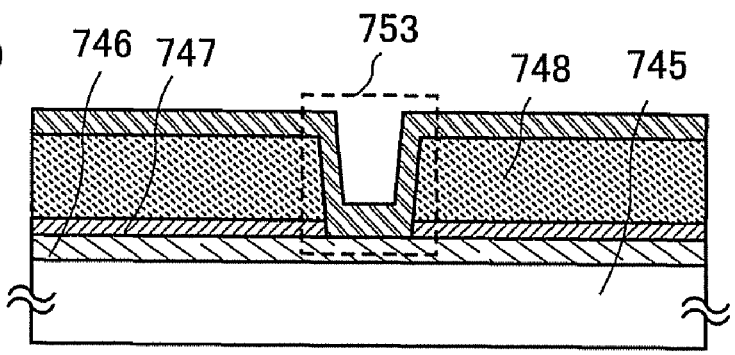

Further, as for the shape of the opening functioning as a contact hole, the side surface does not need to be perpendicular to the bottom surface, and the side of the opening may be tapered as shown in FIG. 4D. In FIG. 4D, conductive layers 746 and 747, and an insulating layer 748 are formed over a substrate 745, and an opening 753 is formed in the insulating layer 748 and the conductive layer 747. The opening 753 has a mortar shape and the side surface of the opening 753 is tapered to the bottom surface.

Thus, in the opening provided in the insulating layer, the lower conductive layer below the insulating layer is electrically connected to the upper conductive layer over the insulating layer. In this embodiment mode, a second conductive layer is formed of a metal which is easily vaporized over a first conductive layer and the second conductive layer is vaporized by laser light, thereby an opening is formed in an insulating layer formed over the first and second conductive layers. The size and shape of the opening formed in the insulating layer and the conductive layer can be controlled by laser beam irradiation conditions (such as energy intensity and irradiation time) and properties of materials for the insulating layer and the conductive layer (such as thermal conductivity, melting point, and boiling point). FIGS. 5A to 5D show an example of the size of the laser beam spot and the size of the formed opening. Note that FIGS. 5A to 5D show an example in which one opening is formed; however, it is needless to say that a plurality of openings can be formed concurrently similarly to those shown in FIGS. 3A to 3D.

Over a substrate 300, a first conductive layer 301*a* (301*a*1, 301*a*2, and 301*a*3) and a second conductive layer 301*b* are stacked, and an insulating layer 302 is formed so as to cover the first conductive layer 301*a* (301*a*1, 301*a*2, and 301*a*3) and the second conductive layer 301*b*. In FIGS. 5A to 5D, the first conductive layer 301*a* (301*a*1, 301*a*2, and 301*a*3) has a stacked-layer structure including a plurality of thin films. For example, titanium can be used for the first conductive layer 301*a*1, aluminum can be used for the first conductive layer 301*a*2, titanium can be used for the first conductive layer 301*a*3, and chromium can be used for the second conductive layer 301*b*. For the first conductive layer 301*a*3, tungsten, molybdenum, or the like may be used instead. It is needless to say that the second conductive layer 301b can also have a stacked-layer structure, and stacked layers including copper and chromium, or the like can be used.

Figure 5A:
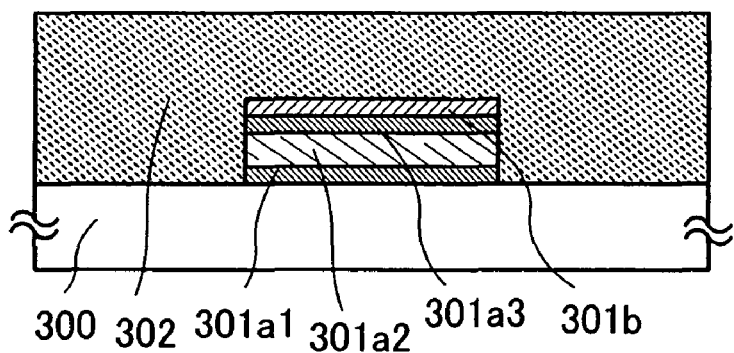
FIGS. 5A to 5D are schematic views showing the present invention.
Figure 5B:
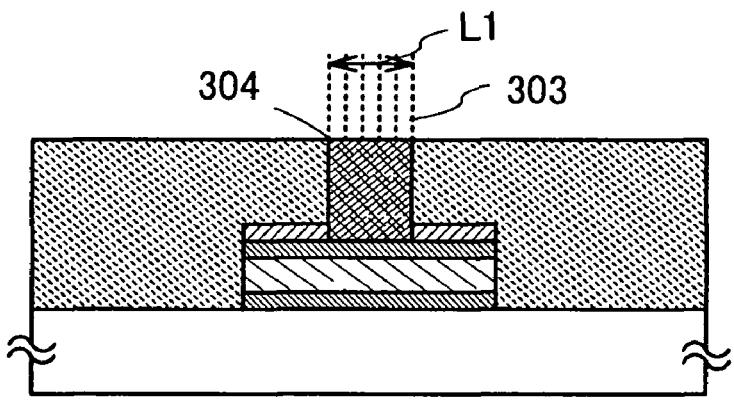
Figure 5C:
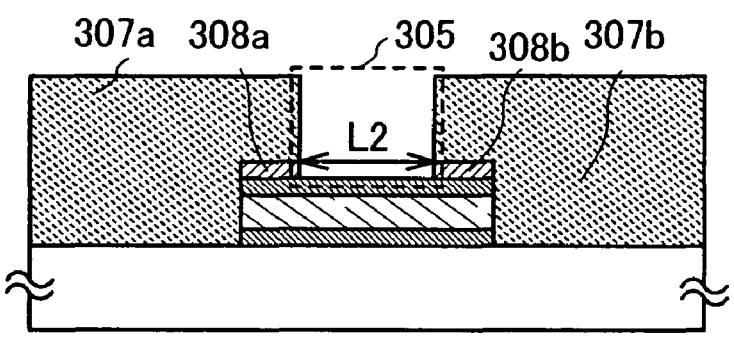
Figure 5D:
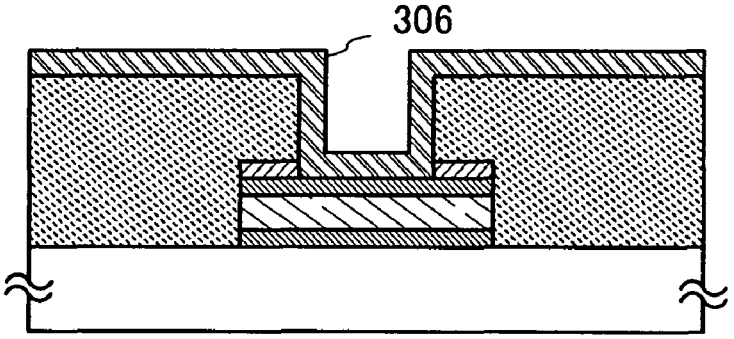

The insulating layer 302 and the second conductive layer 301b are irradiated with laser light 303 having a diameter L1, so that an irradiated region 304 is selectively formed in the insulating layer 302 and the second conductive layer 301b. When the energy of the laser light 303 is high, the second conductive layer 301b receives high energy and heat is transmitted to the irradiated region and also to the periphery thereof in the second conductive layer 301b, as shown in FIG. 5C. Therefore, in the second conductive layer 301b, an opening having a diameter L2 that is larger than the diameter L1 of the laser light 303 is formed, and the opening is also formed in the insulating layer 302 formed over the second conductive layer 301b. As described above, the second conductive layer 301b is separated into second conductive layers 308a and 308b and the insulating layer 302 is separated into insulating layers 307a and 307b, so that an opening 305 is formed. A conductive film 306 is formed in the opening 305 where the first conductive layer 301a3 is exposed, and is electrically connected to the first conductive layer 301a (301a1, 301a2, and 301a3) and the second conductive layers 308a and 308b (see FIG. 5D).

The size of the opening with respect to the size of the irradiated region determined in accordance with the diameter of the laser light depends on an energy level of the laser light, and when the energy of the laser light is high enough to vaporize the second conductive layer, the energy is transmitted also to the periphery of the irradiated region and the second conductive layer is vaporized; therefore, the opening that is larger than the region irradiated with the laser light is formed in the second conductive layer. On the other hand, when the energy of the laser light is low, an opening with almost the same size as that of the irradiated region is formed in the second conductive layer. In addition, when the second conductive layer is formed using a metal material which has high thermal conductivity and is easily vaporized, energy of a laser light can be easily transmitted; therefore, an opening that is larger than the irradiated region can be formed. Note that in the case where the energy of the laser light is higher than the threshold, the size of the opening depends not on the energy level but on the diameter of a hole in a mask.

As described above, by the control of the energy of the laser light, the vaporization area of the second conductive layer which is irradiated with the laser light can be controlled to some extent; thus, the size of the opening formed in the second conductive layer and the insulating layer can also be controlled as appropriate.

After the opening is formed by irradiation with laser light, a conductive material and an insulating material remaining around the opening may be washed with a liquid to remove the remnant. In this case, a non-reactive substance such as water may be used for washing, or a chemical solution such as etchant which reacts with (dissolves in) the insulating layer may be used. With etchant, the opening is over-etched, and dusts and the like are removed, so that the surface is further planarized. Further, the opening can be widened.

In this embodiment mode, a linear beam is delivered into a plurality of openings in a mask, which are formed in a longitudinal direction of the linear beam. Accordingly, the linear beam can be split into a plurality of laser beams and a plurality of contact holes can be formed concurrently in an interlayer insulating layer irradiated with the laser beams. By the laser irradiation apparatus and the laser irradiation method of this embodiment mode, the plurality of contact holes can be easily formed in the interlayer insulating layer in a single step.

According to this embodiment mode, it is not necessary to use a complicated photolithography process including many steps for forming a contact hole; therefore, the steps can be simplified and productivity can be increased. Accordingly, loss of materials and the cost can be reduced.

(Embodiment Mode 2)

In this embodiment mode, a laser beam irradiation apparatus having a structure different from that of Embodiment Mode 1, which is for forming a plurality of contact holes concurrently by laser ablation using a linear beam, is described. In this embodiment mode, a laser beam irradiation apparatus is described, which can form narrower contact holes by combining a mask and a micro lens array.

Figure 6:
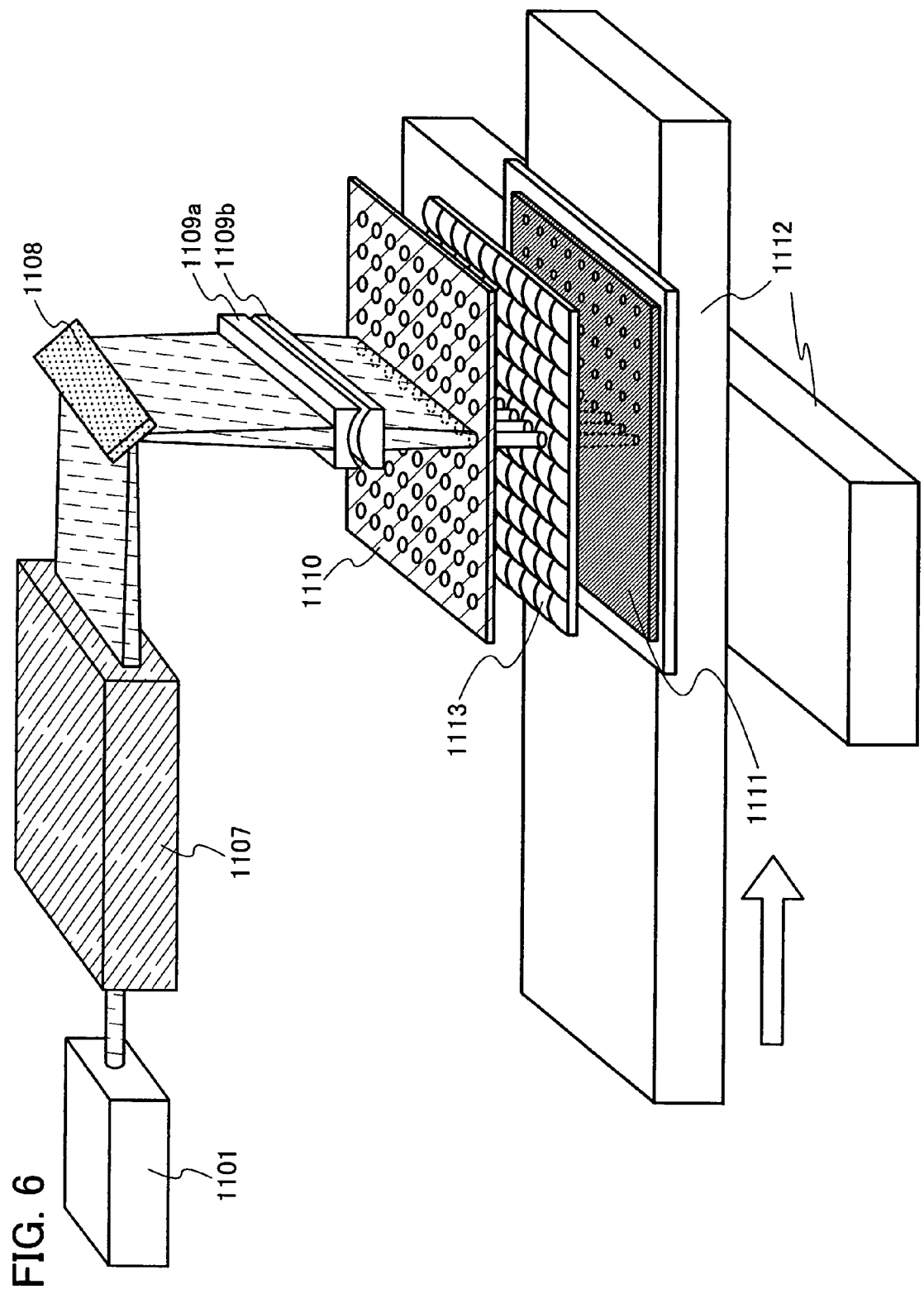
FIG. 6 is a schematic view showing the present invention.

An example of the laser beam irradiation apparatus of this embodiment mode is described with reference to FIG. 6. As shown in FIG. 6, the laser beam irradiation apparatus of this embodiment mode includes a laser oscillator 1101, an optical unit 1107, a reflecting mirror 1108, doublet lenses 1109a and 1109b, a mask 1110, and a micro lens array 1113. Note that the micro lens array 1113 is provided with many lenses and has a function of narrowing the spot of a laser beam transmitted through each lens, and thereby projecting the laser beam on the subject to be irradiated 1111. In addition, the laser oscillator 1101, the optical unit 1107, the reflecting mirror 1108, the doublet lenses 1109a and 1109b, and the mask 1110 may be similar to those of Embodiment Mode 1. Note that the reflecting mirror 1108 or the doublet lenses 1109a and 1109b are not necessarily provided, and it is only necessary to provide an optical system, which shapes the laser beam delivered from the laser oscillator 1101 into a linear beam on a surface of the mask 1110, between the laser oscillator 1101 and the mask 1110.

In this embodiment mode, the laser oscillator 1101, the optical unit 1107 in which a homogenizer is incorporated, the reflecting mirror 1108, the doublet lenses 1109a and 1109b, and the mask 1110 may be provided on a surface of the mask 1110 so that energy distribution of the linear beam is homogenized, similarly to those in Embodiment Mode 1. In addition, the micro lens array 1113 is provided such that the mask 1110 and the subject to be irradiated 1111 have a conjugated relation, thereby a surface of the subject to be irradiated can be irradiated with the laser beam while energy distribution on a surface of the mask 1110 is held. That is, in this embodiment mode, energy distribution of the laser beam is homogenized on the surface of the mask 1110; therefore, the mask 1110 and the subject to be irradiated 1111 provided so that they have a conjugated relation and thereby the subject to be irradiated 1111 can be irradiated with the laser beam with homogenized energy distribution. Each of a plurality of laser beams obtained by splitting the laser beam transmitted through the mask 1110 enters one of the plurality of lenses included in the micro lens array 1113.

Such an arrangement allows the laser beam to be narrowed to be projected on the surface of the subject to be irradiated 1111 through the micro lens array 1113 while energy distribution on a surface of the mask 1110 is held. That is, the surface of the subject to be irradiated 1111 can be irradiated with the laser beam which is narrowed and has homogenized energy distribution.

Note that in this embodiment mode, the subject to be irradiated is formed by sequentially stacking a light absorbing layer and a light-transmitting layer over a substrate. By irradiating a surface of the subject to be irradiated with a laser beam with the use of the laser beam irradiation apparatus of this embodiment mode, a plurality of contact holes can be formed in the subject to be irradiated concurrently without using a complicated photolithography process. In addition, in this embodiment mode, a linear beam with homogenized energy distribution is used; therefore, laser ablation for forming contact holes can be easily performed as compared to the case where a laser beam with Gaussian distribution is used.
(Embodiment Mode 3)

This embodiment mode provides a laser beam irradiation apparatus and a manufacturing method of a semiconductor device, which are for forming a plurality of openings (contact holes) in a light-transmitting layer by laser ablation, which are different from those of Embodiment Mode 1 or 2.

First, an example of a laser beam irradiation apparatus for irradiating a processing region with laser light (also referred to as a laser beam) is described with reference to FIG. 7. The laser beam irradiation apparatus shown in FIG. 7 includes a laser oscillator 1101, an optical unit 1107, a reflecting mirror 1108, doublet lenses 1109*a* and 1109*b*, a mask 1110, and a chopper fin 1116. Note that the reflecting mirror 1108 or the doublet lenses 1109*a* and 1109*b* are not necessarily provided, and it is only necessary to provide an optical system, which shapes the laser beam delivered from the laser oscillator 1101 into a linear beam on a surface of the mask 1110, between the laser oscillator 1101 and the mask 1110. In this embodiment mode, the laser oscillator 1101, the optical unit 1107 in which a homogenizer is incorporated, the reflecting mirror 1108, the doublet lenses 1109*a* and 1109*b*, and the mask 1110 may be provided so that energy distribution of the linear beam is homogenized on a surface of the mask 1110, similarly to those in Embodiment Mode 1 or 2.

Figure 7:
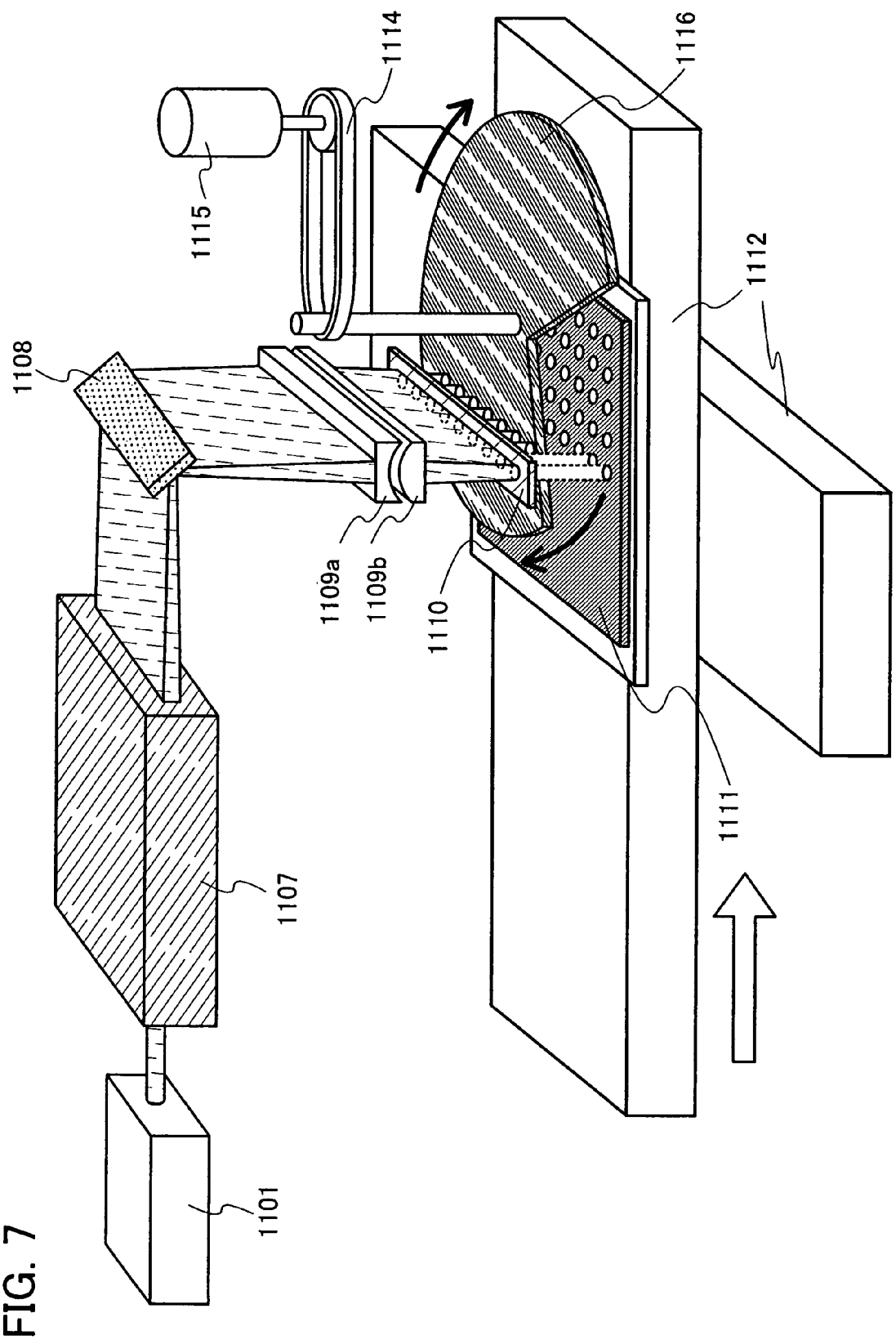
FIG. 7 is a schematic view showing the present invention.

In the laser beam irradiation apparatus shown in FIG. 7, the laser beam delivered from the laser oscillator 1101 passes through the optical unit 1107. Subsequently, the laser beam is reflected by the reflecting mirror 1108 so that the subject to be irradiated 1111 is irradiated with the laser beam perpendicularly. The laser beam reflected by the reflecting mirror 1108 is condensed by the doublet lenses 1109*a* and 1109*b* in a short-side direction of a linear beam. The condensed linear beam reaches the mask 1110 in which holes each having the same or approximately the same diameter as a contact hole are formed in desired positions, and only the laser beam transmitted through the mask 1110 reaches the chopper fin 1116. The chopper fin 1116 is a circular plate lacking a fan shape. A rotating power of a motor 1115 is transmitted to the chopper fin 1116 through a driving belt 1114, so that the chopper fin 1116 rotates. Note that a plate which is rotated to transform continuous light into intermittent light such as blink by repeating transmitting and shielding light, like the chopper fin 1116, is generally called a chopper.

In this embodiment mode, the laser beam transmitted to the chopper fin 1116 is delivered to the subject to be irradiated 1111 only when passing through the fan-shaped portion which is cut off from the chopper fin 1116. Then, a plurality of contact holes can be formed in the subject to be irradiated 1111 by irradiation with the laser beam. Conversely, when the laser beam is delivered to a portion other than the fan-shaped portion, the laser beam is absorbed in a fin portion and is not delivered to the subject to be irradiated 1111.

In general, in the case where a mask is irradiated with a linear beam continuously, when the position of the mask is fixed and only the subject to be irradiated is moved, a linear opening along a moving direction of the subject to be irradiated is formed instead of a hole having approximately the same size as a hole formed in the mask. Therefore, in the case where a mask is irradiated with a linear beam continuously, the mask and the subject to be irradiated need to be moved together.

However, by using the chopper fin in this embodiment mode, continuous light can be transformed into intermittent light. Therefore, even in the case where the mask is continuously irradiated with a laser beam, when the mask is fixed and only the subject to be irradiated 1111 is moved, contact holes each having the same or approximately the same diameter as a hole in the mask can be formed in a plurality of positions of the subject to be irradiated. Accordingly, the mask can be reduced in size. Note that there is no particular limitation on a material of the mask 1110 and the chopper fin 1116 as long as it is a material which does not transmit a laser beam.

Subsequently, a transfer mechanism 1112 is transferred with constant speed in a direction shown by a bold arrow in FIG. 7, and thereby laser irradiation is performed to the subject to be irradiated 1111 entirely. In this embodiment mode, the transfer mechanism 1112 is an XY stage and has a mechanism which moves in an X axis or Y axis direction. The transfer mechanism 1112 may also have a mechanism which rotates. Note that in this embodiment mode, the subject to be irradiated is formed by sequentially stacking a light absorbing layer and a light-transmitting layer over a substrate.

In this embodiment mode, a linear beam can be delivered into the plurality of holes formed in the mask 1110 concurrently, thereby the linear beam can be split into a plurality of laser beams through the mask. Then, the plurality of portions of the subject to be irradiated 1111 can be irradiated with the laser beams all at once. By thus irradiating the surface of the subject to be irradiated 1111 with the laser beams with the use of the laser beam irradiation apparatus of this embodiment mode, a plurality of contact holes can be formed in the subject to be irradiated 1111 concurrently without the use of a complicated photolithography process. In addition, by employing the chopper, the time for laser beam irradiation can be controlled; therefore, for example, in the case where aligned contact holes are successively formed in the whole substrate, it is only necessary to prepare a mask in which aligned holes of one line are formed which leads to reduction in mask size.
(Embodiment Mode 4)

For a mask which can be used for splitting a linear beam into a plurality of beams when a plurality of contact holes are formed concurrently by laser ablation using the linear beam, various structures different from those described in Embodiment Modes 1 to 3 can be used. In this embodiment mode, an example of a mask which can be used for splitting the linear beam into a plurality of beams is described with reference to drawings. Note that the mask described in this embodiment mode can be used as appropriate instead of the mask described in any one of Embodiment Modes 1 to 3.

Figure 8A:
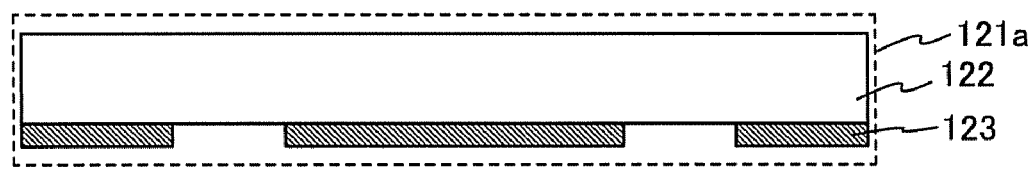
FIGS. 8A and 8B are schematic views showing the present invention.

As the mask of this embodiment mode, a binary mask 121*a* shown in FIG. 8A can be used. The binary mask 121*a* is obtained by selectively forming a light-shielding layer 123 absorbing light, which is formed of chromium, chromium oxide, or the like, over a substrate 122 having a light-transmitting property, which is formed of a quartz or the like. The binary mask 121*a* can transmit light in a region other than a region where the light-shielding layer 123 is formed.

Figure 8B:
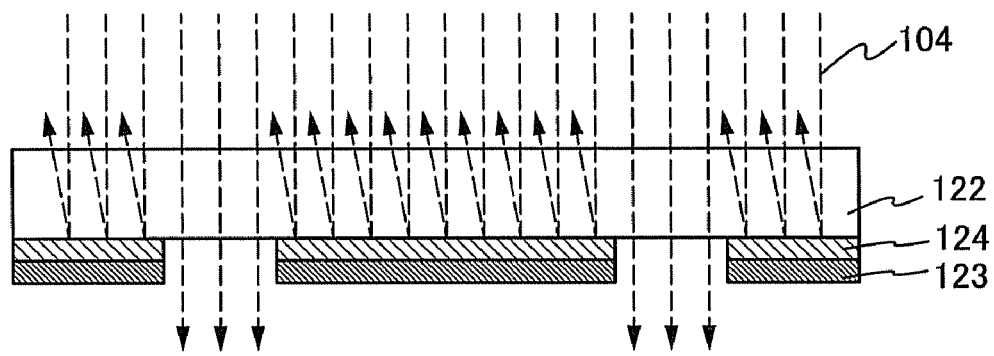

Further, when energy of a laser beam delivered to the light-shielding layer 123 is high, it is preferable that a reflective layer 124 be formed between the substrate 122 having a light-transmitting property and the light-shielding layer 123 as shown in FIG. 8B. By providing the reflective layer 124, the amount of laser beam absorbed in the light-shielding layer can be reduced. Therefore, conversion of energy generated by absorption of a laser beam 104 into heat and transformation of a pattern of the light-shielding layer due to the heat can be prevented.

Note that, as the reflective layer 124, a dielectric mirror or a layer having reflectivity can be used. The dielectric mirror corresponds to a stack in which two kinds of transparent insulating layers having different refractive indexes are alternately provided. In that case, as the refractive indexes of the two kinds of transparent insulating layers are higher or the number of layers is larger, reflection efficiency is improved. Note that, for the dielectric mirror, a material to be stacked is appropriately selected in accordance with a wavelength of an irradiation laser beam. For example, as a stacked-layer structure of a dielectric mirror reflecting visible light, a stacked-layer structure of titanium dioxide and silicon dioxide, a stacked-layer structure of zinc sulfide and magnesium fluoride, a stacked-layer structure of amorphous silicon and silicon nitride, or the like can be employed.

Alternatively, as the reflective layer, a layer formed of aluminum, gold, silver, nickel, or the like may be used. Further, the dielectric mirror and the reflective layer may be stacked.

By using the binary mask, the linear beam can be split into a plurality of laser beams. Therefore, a plurality of portions of a subject to be irradiated can be irradiated with the laser beams all at once.

Alternatively, as the mask of this embodiment mode, a phase shift mask may be used. By the phase shift mask, a fine shape, typically, a layer with a narrow width or a layer with a narrow width and a short length can be formed.

As the phase shift mask, for example, a Levenson shift mask can be used. A Levenson shift mask refers to a mask having periodical many fine projections and depressions on a substrate surface, like a phase shift mask 131. By the projections and depressions, phase of a laser beam which transmits through the phase shift mask is modulated and annihilation interference is partially caused, thereby intensity of the laser beam can be modulated periodically. Here, the projections and depressions are provided so that a phase difference between a concavity and a convexity adjacent to each other is 180°. Accordingly, as shown in FIG. 9B, a difference of 180° is generated between phases 132. The laser beam which transmits the phase shift mask 131 is interfered and thereby the laser beam having intensity distribution 133 shown in FIG. 9C is formed.

Figure 9A:
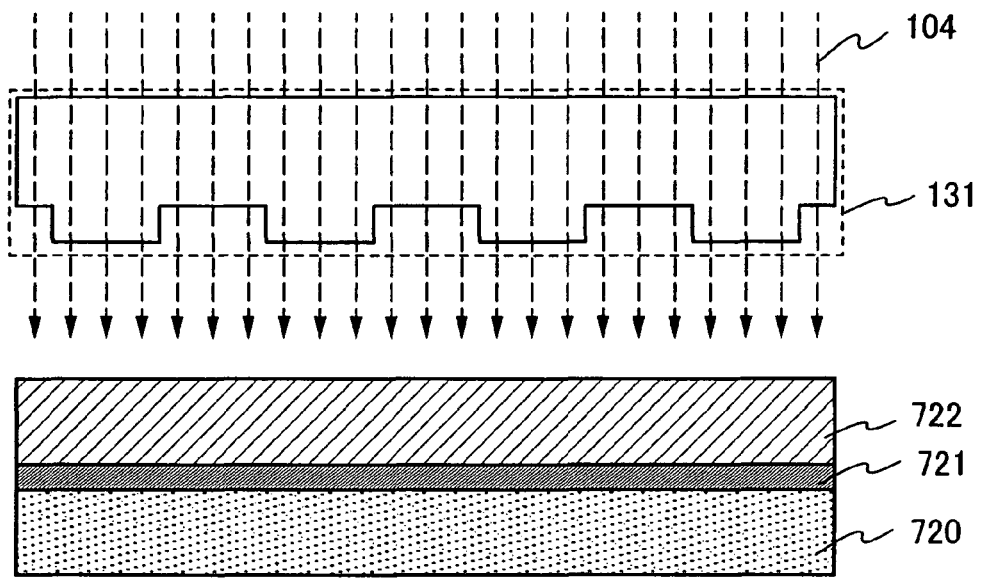
FIGS. 9A to 9D are schematic views showing the present invention.
Figure 9B:
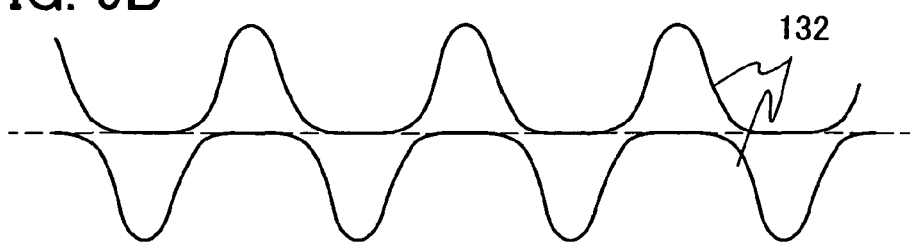
Figure 9C:
Figure 9D:
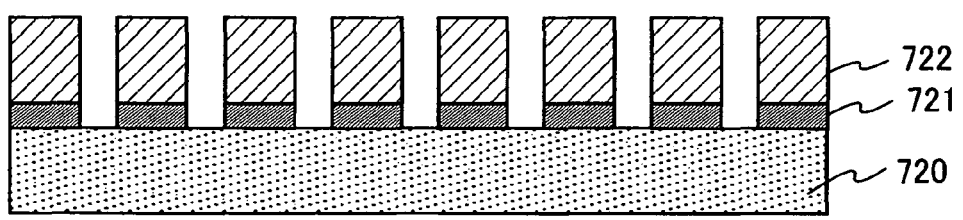

The insulating layer 722 and the light absorbing layer 721 are irradiated with a laser beam shown in FIG. 9C as shown in FIG. 9A, thereby a difference can be sufficiently held between a region where the laser beam is absorbed in the light absorbing layer and a region where the laser beam is not absorbed in the light absorbing layer. Accordingly, as shown in FIG. 9D, a plurality of openings can be formed concurrently in the light absorbing layer 721 and the insulating layer 722 which are formed over the substrate 720.

Note that a mode in which a phase difference of the laser beam is generated by forming the projections and depressions on the surface of the substrate having a light transmitting property is shown in FIGS. 9A to 9D. Instead of this, a phase shift mask which generates a phase difference of a laser beam by using a light-shielding layer and a phase shifter material may be used. Alternatively, a binary mask and a phase shift mask may be used in combination.

Next, as another phase shift mask, a halftone shift mask is described.

Figure 10A:
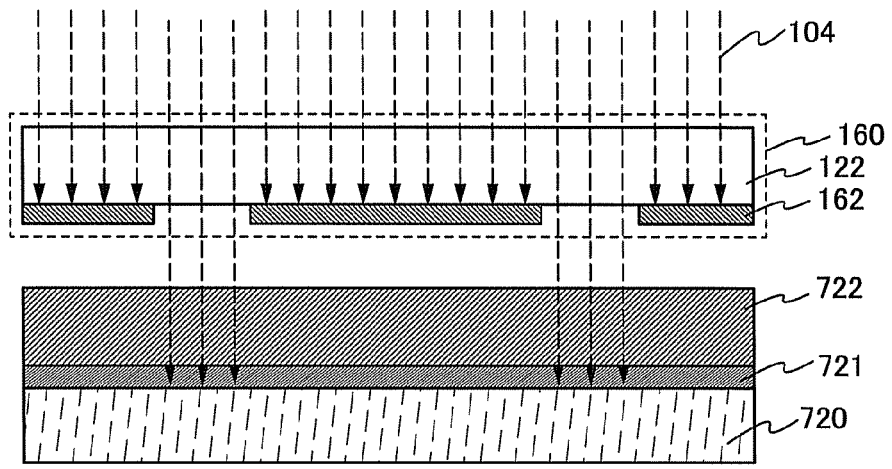
FIGS. 10A to 10D are schematic views showing the present invention.
Figure 10B:

As shown in FIG. 10A, for a halftone phase shift mask 160, a semi-transmissive phase shifter material 162 instead of a light-shielding layer is selectively formed over the substrate 122 having a light-transmitting property, which is formed of quartz or the like. As for laser beam amplitude distribution 163 in that case, phase of light which transmits through the phase shifter material 162 is inverted with respect to that of light which transmits through a region other than a region where the phase shifter material 162 is not provided, as shown in FIG. 10B. Accordingly, laser beam intensity distribution 164 is steeply increased at an interface of the phase shifter material 162, as shown in FIG. 10C.

Figure 10C:
Figure 10D:
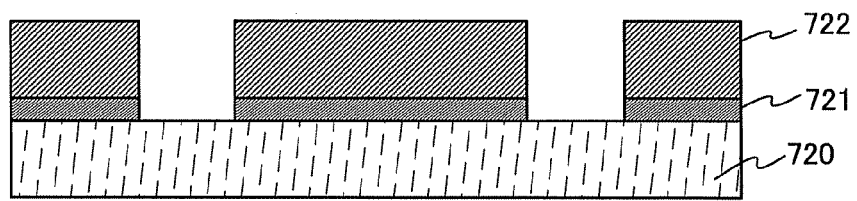

The light absorbing layer 103 is irradiated with a laser beam having intensity distribution shown in FIG. 10C, thereby a difference can be sufficiently held between a region where the laser beam is absorbed in the light absorbing layer and a region where the laser beam is not absorbed in the light absorbing layer. Accordingly, as shown in FIG. 10D, openings with extremely-narrow width can be formed in the light absorbing layer 721 and the insulating layer 722 which are formed over the substrate 720.

Figure 11A:
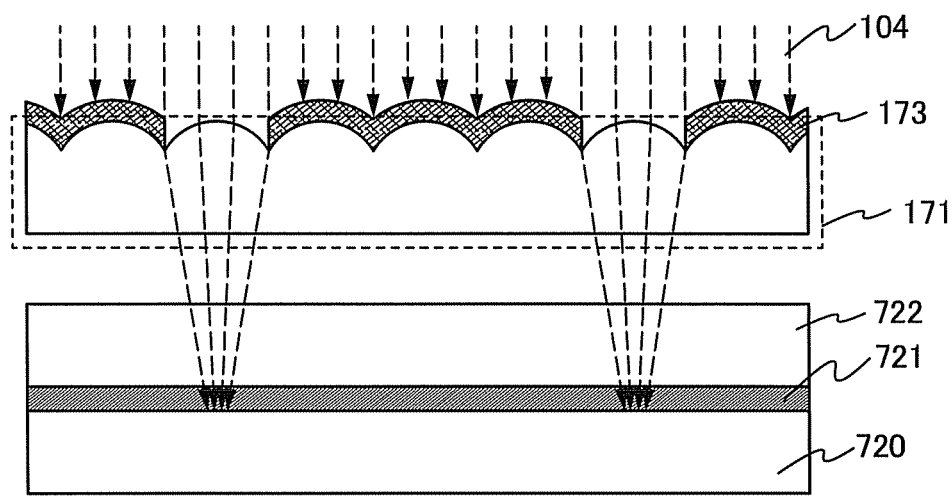
FIGS. 11A and 11B are schematic views showing the present invention.
Figure 11B:
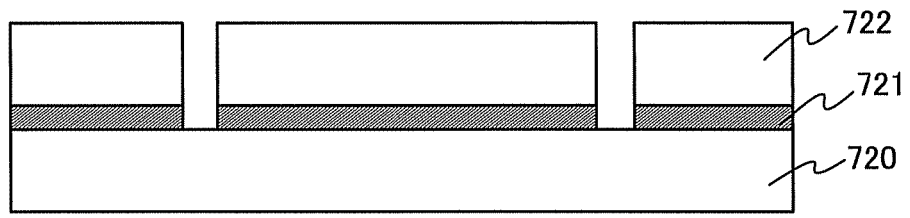

As the mask of this embodiment mode, a mask which has a micro lens, a micro lens array, or the like having curvature at least at the periphery of a top portion, preferably, having a hemispherical shape as a whole like a convex lens can be used. In FIGS. 11A and 11B, a mask having a micro lens array is described.

A micro lens array is formed on a surface of a mask 171. In addition, in a region which does not need to be irradiated with a laser beam, a light-shielding layer 173 is provided. Note that the light-shielding layer 173 can be formed of the same material as the reflective layer 124 shown in FIG. 8B.

As shown in FIG. 11A, the light absorbing layer 721 is irradiated with the laser beam 104 through the mask 171 and the insulating layer 722 having a light-transmitting property. The laser beam 104 is partially shielded by the light-shielding layer 173. Light is condensed by each lens of the micro lens array. Thus, the light absorbing layer 721 is selectively irradiated with the laser beam 104 which is condensed.

Accordingly, as shown in FIG. 11B, fine openings can be formed in the light absorbing layer 721 and the insulating layer 722 which are formed over the substrate 720.

Note that a micro lens may be formed over a transparent substrate by selectively discharging and baking a transparent composition, instead of the micro lens array. Such a micro lens can be formed using polyimide, acrylic, a vinyl acetate resin, polyvinyl acetal, polystyrene, an AS resin, a methacrylic resin, polypropylene, polycarbonate, celluloid, acetyl cellulose plastic, polyethylene, a methylpentene resin, a vinyl chloride resin, a polyester resin, a urea resin, or the like. Alternatively, PSG (phosphorous silicate glass), BPSG (boron phosphorous silicate glass), silicate-based SOG (Spin on Glass), polysilazane-based SOG, alkoxy silicate-based SOG; and $SiO_2$ including a Si—$CH_3$ bond, which is typified by polymethyl siloxane, may be used.

By splitting a linear beam with the use of the mask described in this embodiment mode, a plurality of fine openings can be selectively formed concurrently in a light absorbing layer formed over a substrate. Accordingly, miniaturization of a semiconductor device can be achieved.

(Embodiment Mode 5)

In this embodiment mode, a method for manufacturing a display device by using the laser beam irradiattion apparatus and the laser beam irradiation method which are described in any one of Embodiment modes 1 to 4 is described.

Figure 12A:
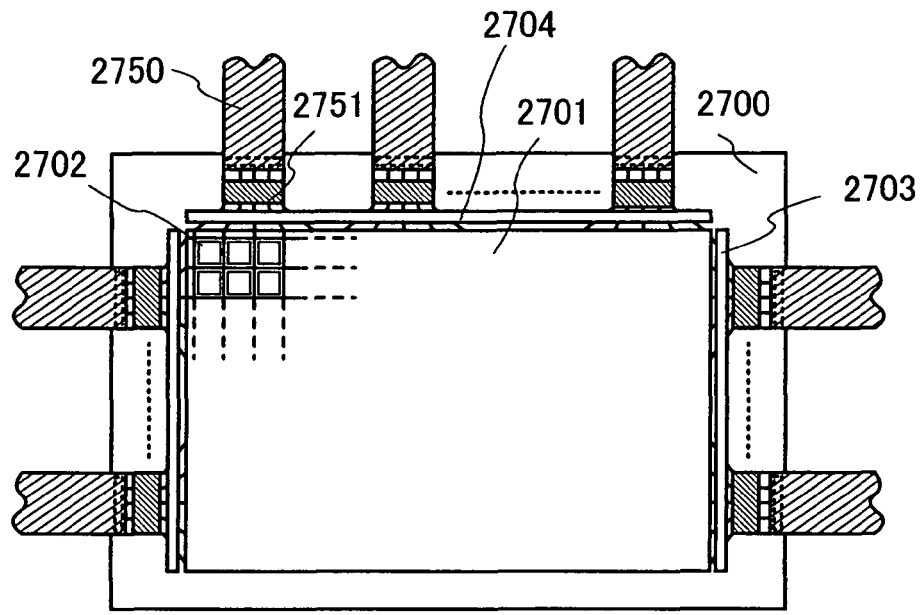
FIGS. 12A and 12B are views each showing a structure of a display panel.

FIG. 12A is a top plan view showing a structure of a display panel of this embodiment mode, in which a pixel portion 2701 where pixels 2702 are arranged in matrix, a scan line input terminal 2703, and a signal line input terminal 2704 are formed over a substrate 2700 having an insulating surface. The number of pixels may be set in accordance with various standards: the number of pixels of XGA for RGB full-color display may be 1024×768×3 (RGB), that of UXGA for RGB full-color display may be 1600×1200×3 (RGB), and that corresponding to a full-speck high vision for RGB full-color display may be 1920×1080×3 (RGB).

Scan lines which extend from the scan line input terminal 2703 intersect with signal lines which extend from the signal line input terminal 2704, so that the pixels 2702 are arranged in matrix. Each of the pixels 2702 is provided with a switching element and a pixel electrode connected to the switching element. A typical example of the switching element is a TFT. A gate electrode side of the TFT is connected to the scan line, and a source or drain side thereof is connected to the signal line, so that each pixel can be controlled independently by a signal inputted externally.

Figure 12B:
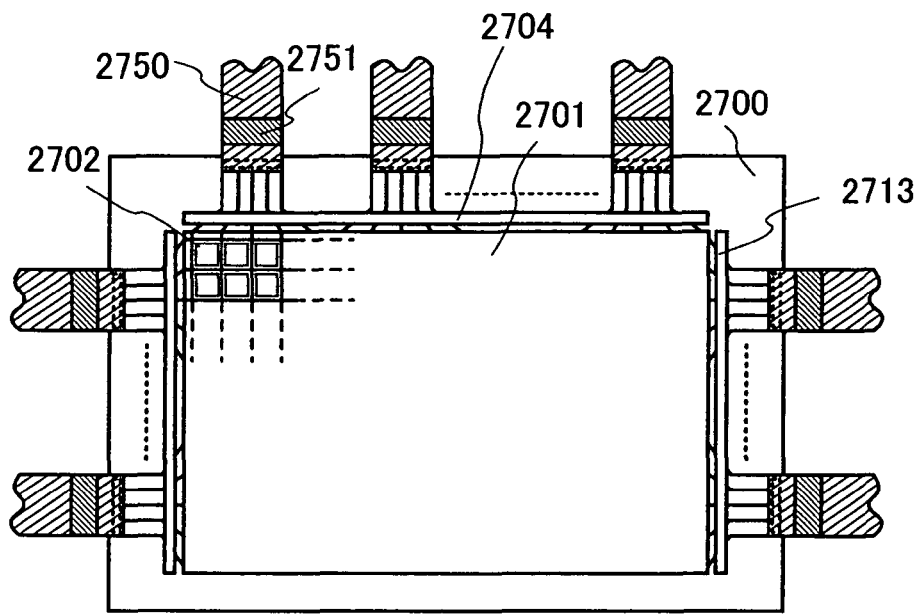

FIG. 12A shows a structure of the display panel in which signals inputted to a scan line and a signal line are controlled by an external driver circuit. Alternatively, driver ICs 2751 may be mounted on the substrate 2700 by a COG (Chip on Glass) method, as shown in FIG. 12A. Alternatively, as another embodiment mode, a TAB (Tape Automated Bonding) method may be employed as shown in FIG. 12B. The driver ICs may be ones formed over a single crystalline semiconductor substrate or may be circuits that are each formed using a TFT over a glass substrate. In FIGS. 12A and 12B, each driver IC 2751 is connected to an FPC 2750. Further, in the case where a TFT provided in a pixel is formed using a polycrystalline (microcrystalline) semiconductor having high crystallinity, a scan line driver circuit may be formed over a substrate. In the case where a TFT provided in a pixel is formed using a polycrystalline (microcrystalline) semiconductor, a single crystalline semiconductor, or the like with high mobility, a scan line driver circuit and a signal line driver circuit can be formed over one substrate.

Figure 20A:
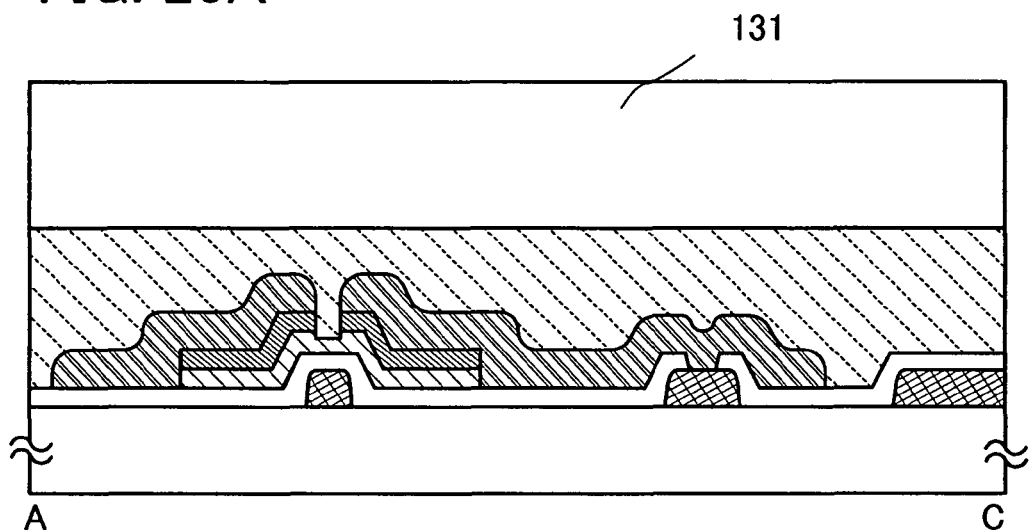
FIGS. 20A and 20B are views each showing a display device of the present invention.
Figure 20B:
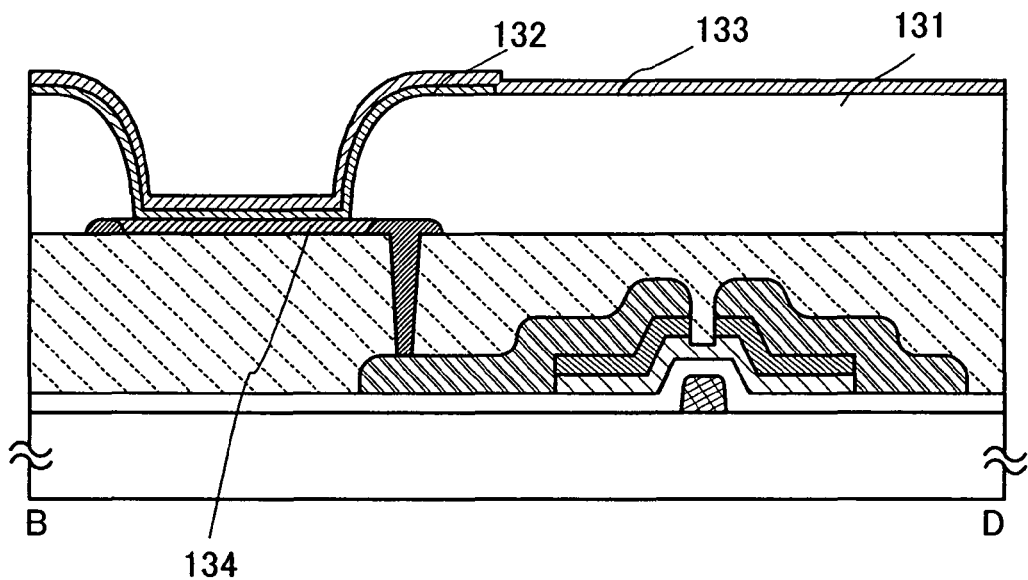

Next, a method for manufacturing a display device having an inverse staggered thin film transistor is described with reference to FIGS. 13A to 20B. FIGS. 13A, 14A, 15A, 16A, 17A, 18A, and 19A are top plan views each showing a pixel portion of the display device. FIGS. 13B, 14B, 15B, 16B, 17B, 18B, and 19B are cross sectional views each taken along a dashed dotted line A-C in FIGS. 13A, 14A, 15A, 16A, 17A, 18A, and 19A. FIGS. 13C, 14C, 15C, 16C, 17C, 18C, and 19C are cross sectional views each taken along a dashed dotted line B-D in FIGS. 13A, 14A, 15A, 16A, 17A, 18A, and 19A. FIGS. 20A and 20B are cross sectional views of the display device.

As a substrate 100, a glass substrate made of barium borosilicate glass, aluminoborosilicate glass, or the like; a quartz substrate; a metal substrate; or a plastic substrate having heat resistance that can withstand a process temperature of this manufacturing process is used. The surface of the substrate 100 may be polished by a CMP method or the like so that it is planarized. An insulating layer may be formed over the substrate 100. The insulating layer may be formed to have a single-layer or stacked-layer structure using an oxide material containing silicon or a nitride material containing silicon by various methods such as a CVD method, a plasma CVD method, a sputtering method, and a spin coating method. This insulating layer is not necessarily formed; however, this insulating layer has an advantageous effect of blocking contamination substances and the like from the substrate 100.

A conductive film is formed over the substrate 100. The conductive film can be formed by a sputtering method, a PVD (Physical Vapor Deposition) method, a CVD (Chemical Vapor Deposition) method such as a low-pressure CVD (LPCVD) method or a plasma CVD method, or the like. The conductive film may be formed using an element selected from Ag, Au, Ni, Pt, Pd, Ir, Rh, Ta, W, Ti, Mo, Al, and Cu, or an alloy material or compound material containing any of the above elements as its main component. Alternatively, a semiconductor film typified by a polycrystalline silicon film doped with an impurity element such as phosphorus, or an AgPdCu alloy may be used. Alternatively, a single layer structure or a structure including a plurality of layers may be used. For example, a two-layer structure of a tungsten nitride film and a molybdenum (Mo) film or a three-layer structure in which a tungsten film with a thickness of 50 nm, an alloy film of aluminum and silicon with a thickness of 500 nm, and a titanium nitride film with a thickness of 30 nm are sequentially stacked may be used. In the case of the three-layer structure, tungsten nitride may be used instead of tungsten of a first conductive film, an alloy film of aluminum and titanium may be used instead of the alloy film of aluminum and silicon of a second conductive film, and a titanium film may be used instead of the titanium nitride film of a third conductive film.

In this embodiment mode, a gate electrode layer is formed by selectively discharging a composition. Thus selectively forming the gate electrode layer makes an effect that processing steps can be simplified.

Figure 13A:
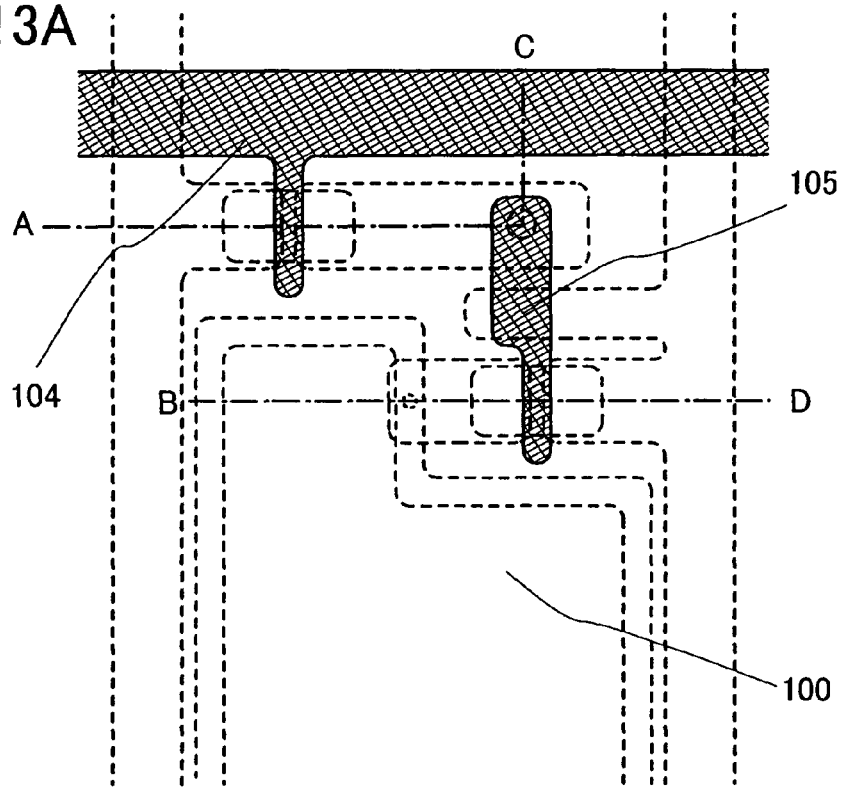
FIGS. 13A to 13C are views showing a method for manufacturing a display device of the present invention.
Figure 13B:
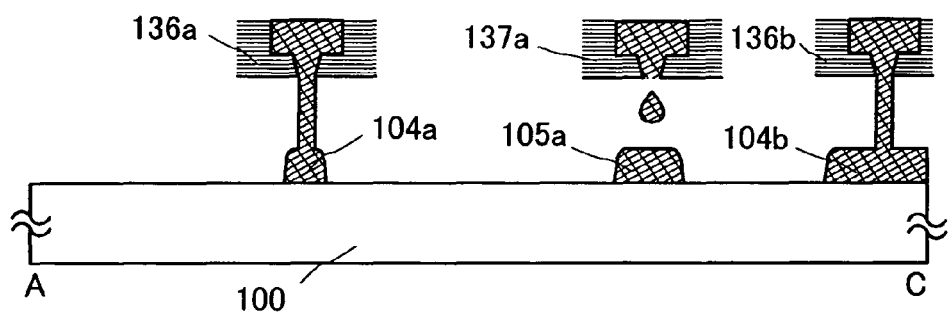
Figure 13C:
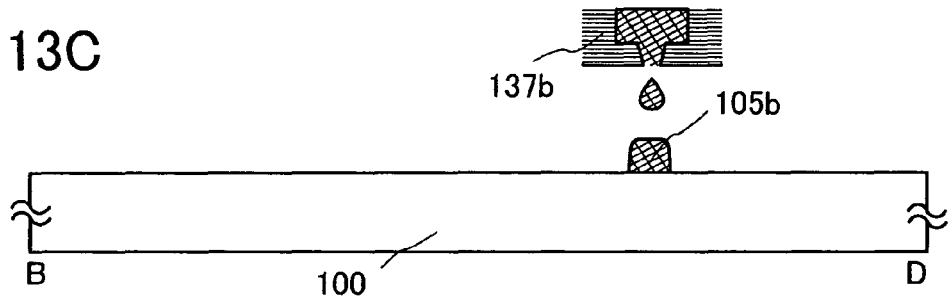

This embodiment mode has a feature that a method for discharging a composition from a discharging outlet of a droplet discharging apparatus is varied depending on the size and shape of a region where a conductive layer is formed. A gate electrode layer 104 (104a and 104b) corresponding to a gate wiring which is formed in a relatively wide area is formed by continuously discharging the composition from droplet discharging apparatuses 136a and 136b as shown in FIG. 13B. On the other hand, a gate electrode layer 105 (105a and 105b) which is formed in a relatively small area is formed by dripping the composition from droplet discharging apparatuses 137a and 137b as shown in FIGS. 13B and 13C. Thus, a method for discharging a liquid composition may be varied depending on a pattern to be formed.

The gate electrode layer 104 (104a and 104b) and the gate electrode layer 105 (105a and 105b) may be formed of an element selected from Ag, Au, Ni, Pt, Pd, Ir, Rh, Ta, W, Ti, Mo, Al, and Cu, or an alloy material or compound material containing any of the above elements as its main component. Alternatively, a mixture of any of the above elements may be used. Not only a single layer structure but also a stacked layer structure including two or more layers may also be used.

Note that, when shapes of the gate electrode layer 104 (104a and 104b) and the gate electrode layer 105 (105a and 105b) are necessarily processed, a mask layer may be formed and the gate electrode layer 104 (104a and 104b) and the gate electrode layer 105 (105a and 105b) may be processed by dry etching or wet etching. An ICP (Inductively Coupled Plasma) etching method may be used, and by adjusting etching conditions (the amount of power applied to a coiled electrode, the amount of power applied to an electrode on a substrate side, the electrode temperature on the substrate side, and the like) as appropriate, the electrode layers can be etched into tapered shapes. It is to be noted that as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be used as appropriate.

As a mask layer, a resin material such as an epoxy resin, a phenol resin, a novolac resin, an acrylic resin, a melamine resin, or a urethane resin is used. Moreover, the mask layer is formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing photosensitizer may be used. For example, a positive resist or a negative resist may be used. In using any material, the surface tension and the viscosity of a material are adjusted as appropriate, for example, by adjustment of the concentration of a solvent or by addition of a surfactant or the like.

Figure 14A:
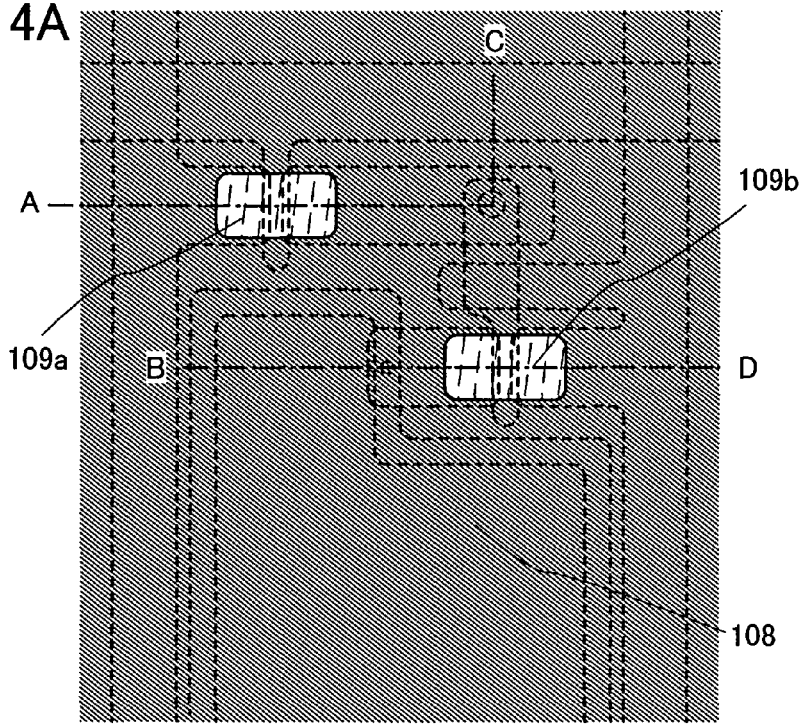
FIGS. 14A to 14C are views showing a method for manufacturing a display device of the present invention.
Figure 14B:
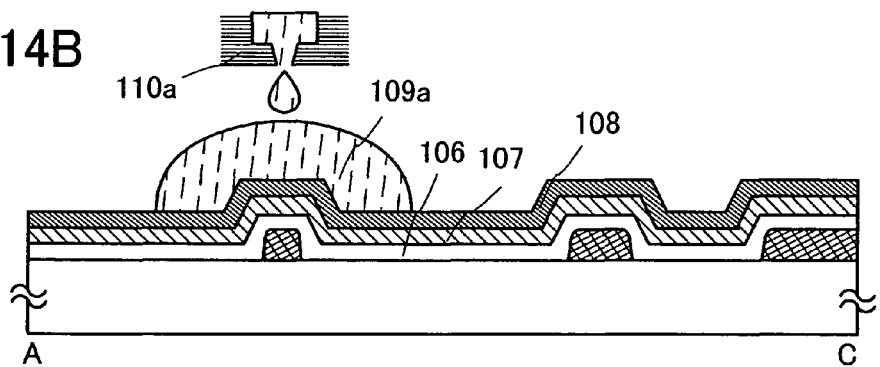
Figure 14C:
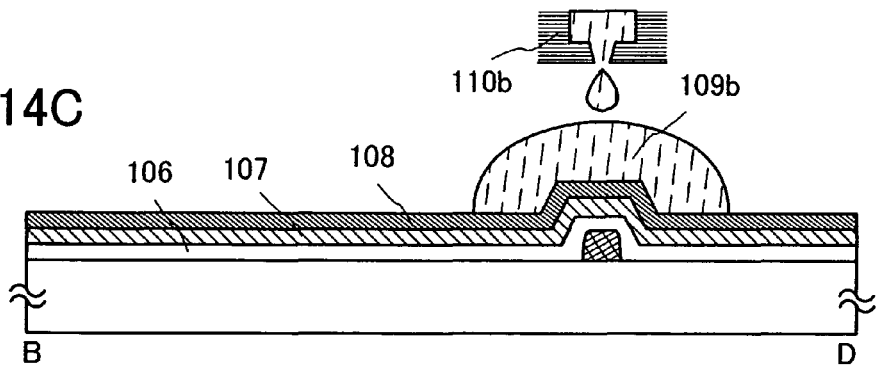

Next, a gate insulating layer 106 is formed over the gate electrode layers 104a, 104b, 105a, and 105b (FIGS. 14B and 14C). The gate insulating layer 106 may be formed of an oxide material of silicon, a nitride material of silicon, or the like, and a single-layer or stacked-layer structure may be used. In this embodiment mode, a two-layer structure of a silicon nitride film and a silicon oxide film is used. Alternatively, a single-layer structure of a silicon oxynitride film or a stacked-layer structure of three or more layers may be used. Preferably, a silicon nitride film which is a dense film is used. When silver, copper, or the like is used for a conductive layer formed by a droplet discharging method, by forming a silicon nitride film or an NiB film as a barrier film thereover, advantageous effects in that diffusion of an impurity is prevented and the surface is planarized can be obtained. In order to form a dense insulating film with less gate leakage current at a low deposition temperature, a reaction gas containing a rare gas element such as argon may be mixed into an insulating film.

Next, a semiconductor layer is formed. A semiconductor layer having one conductivity type may be formed as needed. Further, an NMOS structure including an n-channel thin film transistor in which an n-type semiconductor layer is formed, a PMOS structure including a p-channel thin film transistor in which a p-type semiconductor layer is formed, or a CMOS structure including an n-channel thin film transistor and a p-channel thin film transistor can be formed. In order to impart conductivity, the semiconductor layer may be doped with an element imparting conductivity to form an impurity region in the semiconductor layer, so that an n-channel TFT and a p-channel TFT can be formed. Instead of formation of the n-type semiconductor layer, plasma treatment with a $PH_3$ gas may be performed, so that conductivity is imparted to the semiconductor layer.

A material for forming the semiconductor layer can be an amorphous semiconductor (hereinafter also referred to as "AS") formed by a vapor deposition method using a semiconductor material gas typified by silane or germane or a sputtering method, a polycrystalline semiconductor formed by crystallization of the amorphous semiconductor with the use of light energy or thermal energy, a semi-amorphous semiconductor (also referred to as microcrystal and hereinafter also referred to as "SAS"), or the like. The semiconductor layer can be formed by various methods (a sputtering method, an LPCVD method, a plasma CVD method, and the like).

An SAS is a semiconductor having an intermediate structure between an amorphous structure and a crystalline structure (including single crystal and polycrystal) and a third state which is stable in free energy. Moreover, an SAS includes a crystalline region with a short-distance order and lattice distortion. A crystal region having a diameter of 0.5 to 20 nm can be observed in at least a portion of a film. In the case where silicon is contained as a main component, Raman spectrum is shifted to the side of lower frequency than 520 $cm^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$, $Si_2H_6$, $SiH_2Cl_2$, $SiHCl_3$, $SiCl_4$, $SiF_4$, or the like can be used. Further, $F_2$ or $GeF_4$ may be mixed. The gas containing silicon may be diluted with $H_2$, or $H_2$ and one or a plurality of kinds of rare gas elements selected from He, Ar, Kr, and Ne. The dilution ratio is 1:2 to 1:1000, pressure is approximately 0.1 to 133 Pa, and a power source frequency is 1 to 120 MHz, preferably, 13 to 60 MHz. A temperature for heating the substrate is preferably 300° C. or lower, and an SAS can be formed at 100 to 200° C. as well. It is preferable here that the concentration of impurities of atmospheric components such as oxygen, nitrogen, and carbon as impurity elements taken into the film mainly in deposition be $1 \times 10^{20}$ $cm^{-3}$ or lower. In particular, an oxygen concentration is preferably $5 \times 10^{19}$ $/cm^{-3}$ or lower, and more preferably, $1 \times 10^{19}$ $/cm^{-3}$ or lower. Further, when a rare gas element such as helium, argon, krypton, or neon is contained to further promote the lattice distortion, stability can be enhanced, and a favorable SAS can be obtained. Further, as the semiconductor layer, an SAS layer formed using a hydrogen-based gas may be stacked over an SAS layer formed using a fluorine-based gas.

As a typical example of an amorphous semiconductor, hydrogenated amorphous silicon can be given, and polysilicon or the like can be given as a typical example of a crystalline semiconductor. Polysilicon (polycrystalline silicon) may be so-called high-temperature polysilicon formed using polysilicon which is formed at processing temperatures of 800° C. or higher as a main material, so-called low-temperature polysilicon formed using polysilicon which is formed at processing temperatures of 600° C. or lower as a main material, polysilicon crystallized by the addition of an element which promotes crystallization, or the like. It is needless to say that a semi-amorphous semiconductor or a semiconductor which includes a crystalline phase in a portion thereof may be used as described above.

When a crystalline semiconductor layer is used for the semiconductor layer, the crystalline semiconductor layer may be formed by various methods (a laser crystallization method, a thermal crystallization method, a thermal crystallization method using an element such as nickel which promotes crystallization, and the like). Further, a microcrystalline semiconductor that is an SAS may be crystallized by laser irradiation to enhance crystallinity. In the case where an element which promotes crystallization is not introduced, before the amorphous silicon film is irradiated with laser light, the amorphous silicon film is heated at 500° C. for one hour in a nitrogen atmosphere to discharge hydrogen so that a hydrogen concentration in the amorphous silicon film is $1 \times 10^{20}$ atoms/$cm^3$ or lower. This is because, if the amorphous silicon film contains a lot of hydrogen, the amorphous silicon film may be broken by laser beam irradiation.

There is no particular limitation on a method for introducing a metal element into the amorphous semiconductor layer as long as it is a method for introducing the metal element to a surface or inside of the amorphous semiconductor layer. For example, a sputtering method, a CVD method, a plasma treatment method (including a plasma CVD method), an adsorption method, or a method for applying a solution of metal salt can be used. Among these methods, a method using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like to improve wettability of the surface of the amorphous semiconductor layer so that an aqueous solution is diffused on the entire surface of the amorphous semiconductor layer.

In order to crystallize the amorphous semiconductor layer, heat treatment and irradiation with laser light may be performed in combination, or one of heat treatment and irradiation with laser light may be performed multiple times.

Further, the crystalline semiconductor layer may be directly formed over the substrate by a plasma method. Alternatively, the crystalline semiconductor layer may be selectively formed over the substrate by a linear plasma method.

The semiconductor layer may be formed of an organic semiconductor material by a printing method, a dispenser method, a spray method, a spin coating method, a droplet discharging method, or the like. In this case, the etching step is not necessary; therefore, the number of steps can be reduced. As the organic semiconductor, a low-molecular material such as pentacene, a high-molecular material, an organic dye, a conductive high-molecular material, or the like can be used. As the organic semiconductor material used in the present invention, a π-electron conjugated high-molecular material whose skeleton includes a conjugated double bond is desirable. Typically, a soluble high-molecular material such as polythiophene, polyfluorene, poly(3-alkylthiophene), a polythiophene derivative, or pentacene can be used.

In addition, as the organic semiconductor material which can be used in the present invention, there is a material which can form a semiconductor layer by performing of a process after forming of a soluble precursor. Note that such an organic semiconductor material may be polythienylenevinylene, poly (2,5-thienylenevinylene), polyacetylene, polyacetylene derivatives, polyallylenevinylene, or the like.

The precursor is changed into the organic semiconductor not only by heat treatment but also by the addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, ybutyllactone, butylcellosolve, cyclohexane, N-methyl-2-pyrrolidone (NMP), cyclohexanone, 2-butanon, dioxane, dimethylformamide (DMF), tetrahydrofuran (THF), and the like can be used.

A semiconductor film 107 and a semiconductor film 108 which has one conductivity type are formed over the gate electrode layer 106 (FIGS. 14B and 14C). In this embodiment mode, amorphous semiconductor layers are formed as the semiconductor film 107 and the semiconductor film 108 which has one conductivity type. In this embodiment mode, an n-type semiconductor film containing phosphorus (P) that is an impurity element imparting n-type conductivity is formed as the semiconductor film having one conductivity type. The semiconductor film having one conductivity type functions as a source region and a drain region. The semiconductor film having one conductivity type may be formed as needed, and an n-type semiconductor film containing an impurity element imparting n-type conductivity (P or As) or a p-type semiconductor film containing an impurity element imparting p-type conductivity (B) can be formed.

Similarly to the gate electrode layers 104 and 105, the semiconductor film 107 and the semiconductor film 108 which has one conductivity type are formed into desired shapes with the use of a mask layer. A composition containing a material for forming the mask layer is discharged to the semiconductor film 107 and the semiconductor film 108 which has one conductivity type by droplet discharging apparatuses 110a and 110b, thereby mask layers 109a and 109b are selectively formed (see FIGS. 14A to 14C).

Figure 15A:
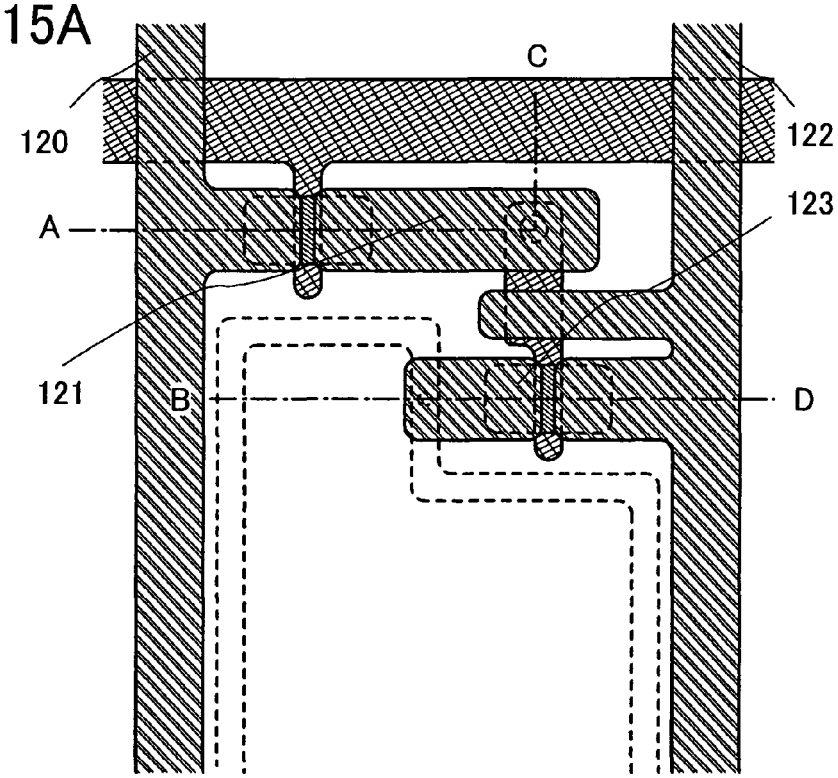
FIGS. 15A to 15C are views showing a method for manufacturing a display device of the present invention.
Figure 15B:
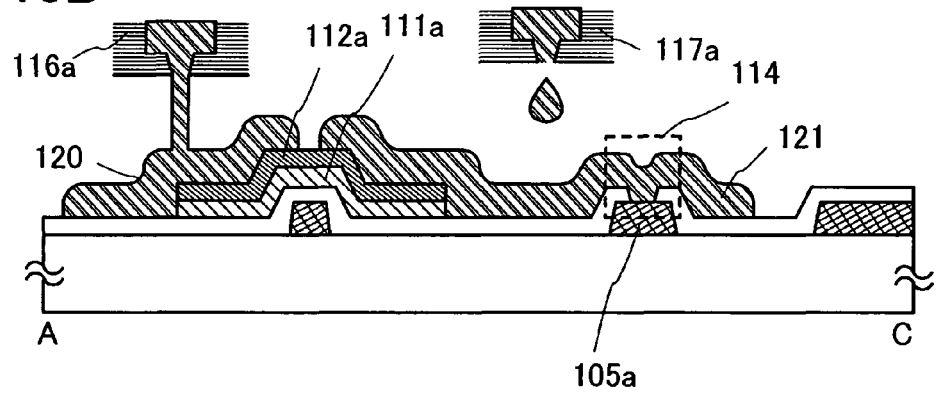
Figure 15C:
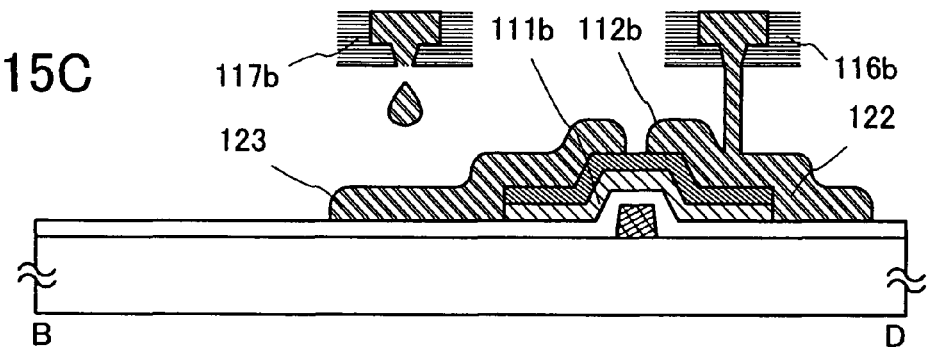

The semiconductor film 107 and the semiconductor film 108 which has one conductivity type are processed with the use of the mask layers 109a and 109b, thereby semiconductor layers 111a and 111b, and semiconductor layers 112a and 112b which have one conductivity type are formed (see FIGS. 15B and 15C).

Next, by using the laser beam irradiation apparatus described in any one of Embodiment Modes 1 to 3, an opening 114 is formed in part of the gate electrode layer 106, so that part of the gate electrode layer 105a provided on a lower layer side is exposed (FIG. 15B). In this embodiment mode, the gate electrode layer 105a is selectively irradiated with laser light from the gate insulating layer 106 side, and then part of an irradiated region of the gate electrode layer 105a is vaporized by irradiation energy. Then, the gate insulating layer 106 over the irradiated region of the gate electrode layer 105a can be removed to form the opening 114. Subsequently, a source electrode layer or drain electrode layer 121 is formed in the opening 114 where the gate electrode layer 105a is exposed, and the gate electrode layer 105a and the source electrode layer or drain electrode layer 121 can be electrically connected to each other. Part of the source electrode layer or drain electrode layer forms a capacitor (FIGS. 15A and 15B).

In this embodiment mode, the source electrode layer or drain electrode layer is formed by selectively discharging a composition. Thus selectively forming the source electrode layer or drain electrode layer makes an effect that processing steps can be simplified.

This embodiment mode has a feature that a method for discharging a composition from a discharging outlet of a droplet discharging apparatus is varied depending on the size and shape of a region where the source electrode layer or drain electrode layer is formed. Source electrode layers or drain electrode layers 120 and 122 corresponding to source wirings or drain wirings formed in a relatively wide area are formed by continuously discharging a composition from droplet discharging apparatuses 116a and 116b as shown in FIGS. 15B and 15C. On the other hand, source electrode layers or drain electrode layers 121 and 123 formed in a relatively small area are formed by dripping a composition intermittently from droplet discharging apparatuses 117a and 117b as shown in FIGS. 15B and 15C. Thus, a method for discharging a liquid composition may be varied depending on the pattern to be formed.

As a conductive material for forming the source electrode layer or drain electrode layer 120, the source electrode layer or drain electrode layer 121, the source electrode layer or drain electrode layer 122, and the source electrode layer or drain electrode layer 123, a composition containing a particle of a metal such as Ag (silver), Au (gold), Cu (copper), W (tungsten), or Al (aluminum) as its main component can be used. Alternatively, indium tin oxide (ITO), indium tin oxide containing silicon oxide (ITSO), organic indium, organic tin, zinc oxide, titanium nitride, or the like which has a light-transmitting property, may be used.

In addition, by combination of droplet discharging methods, loss of materials and the cost can be reduced, as compared to formation over the entire surface by a spin coating method or the like. In accordance with the present invention, even when wirings and the like are arranged in a dense and complicated manner due to downsizing and thinning, the wirings and the like can be stably formed with good adhesion.

Further, in this embodiment mode, when the source electrode layer or drain electrode layer is formed into a desired shape by a droplet discharging method, regions having different wettability may be formed in a region where the source electrode layer or drain electrode layer is to be formed and a peripheral portion thereof as pre-treatment. In the present invention, when components such as a conductive layer, an insulating layer, and a mask layer are formed by discharging a droplet by a droplet discharging method, a region having low wettability and a region having high wettability with respect to a material for forming the components are formed in formation regions of the components, thereby the shapes of the components can be controlled. By such treatment in the formation regions, regions with different wettability are formed in the formation region; therefore, droplets remain only in the region having high wettability, and the components can be formed into desired patterns with high controllability. This step can be used as pre-treatment for any component (such as an insulating layer, a conductive layer, a mask layer, or a wiring layer) when a liquid material is used.

The source electrode layer or drain electrode layer 120 also functions as a source wiring layer, and the source electrode layer or drain electrode layer 122 also functions as a power source line. After the source electrode layers or drain electrode layers 120, 121, 122, and 123 are formed, the semiconductor layers 111a and 111b, and the semiconductor layers 112a and 112b having one conductivity type are formed into a desired shape. In this embodiment mode, the semiconductor layers 111a and 111b, and the semiconductor layers 112a and 112b having one conductivity type are processed by etching using the source electrode layers or drain electrode layers 120, 121, 122, and 123 as masks, thereby semiconductor layers 118a and 118b, and semiconductor layers 119a, 119b, 119c and 119d having one conductivity type are formed (FIGS. 16B and 16C).

Figure 16A:
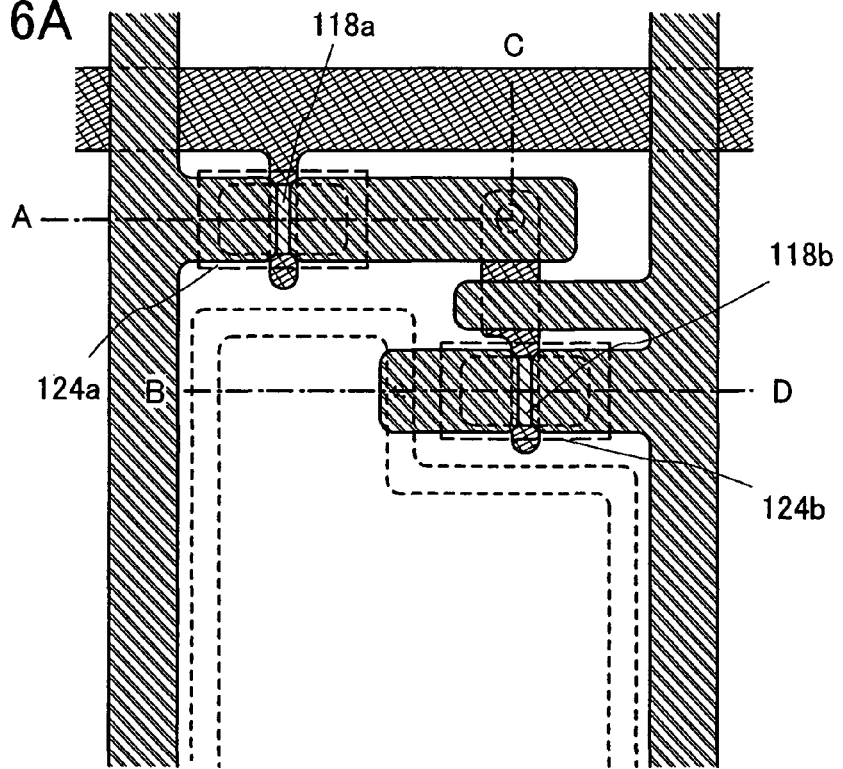
FIGS. 16A to 16C are views showing a method for manufacturing a display device of the present invention.
Figure 16B:
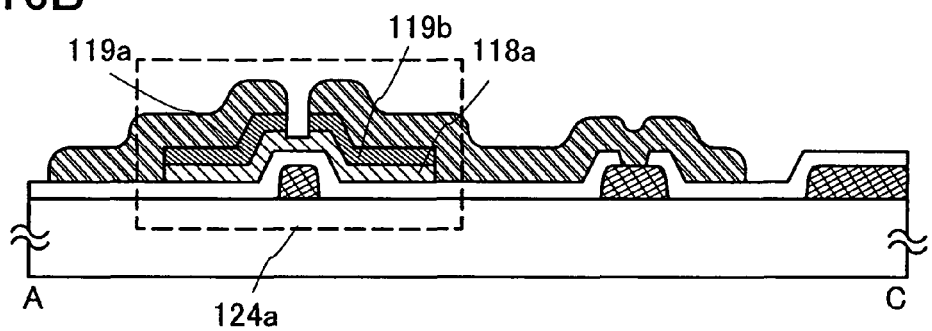
Figure 16C:
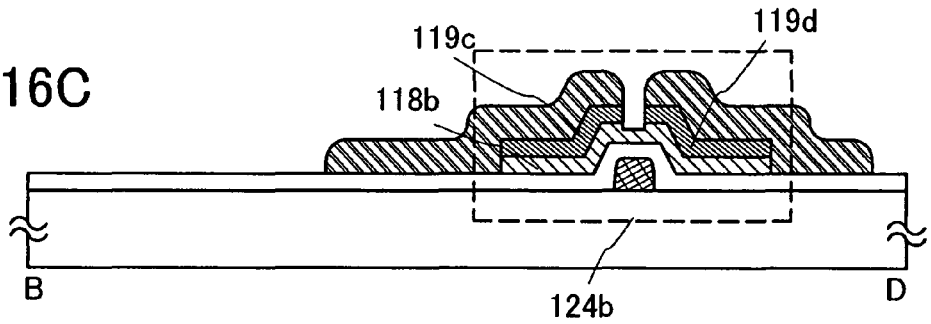

Through the above process, transistors 124a and 124b which are inverse staggered transistors are formed (FIGS. 16A to 16C).

Figure 17A:
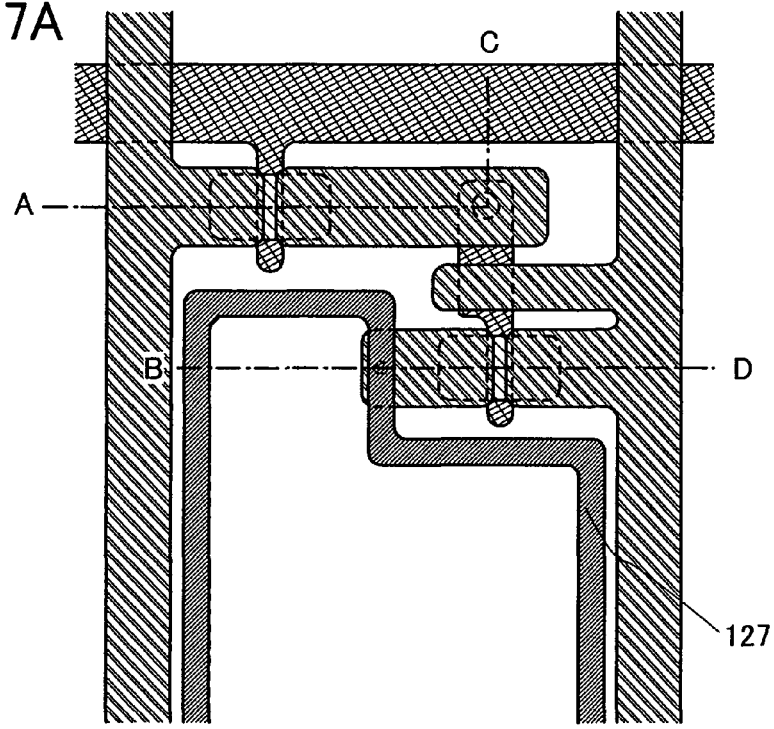
FIGS. 17A to 17C are views showing a method for manufacturing a display device of the present invention.
Figure 17B:
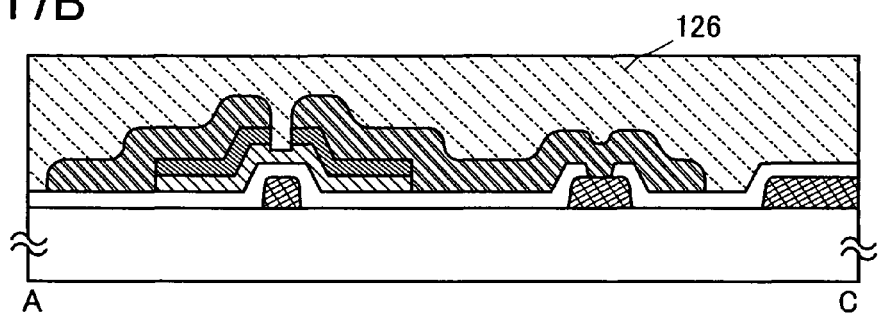
Figure 17C:
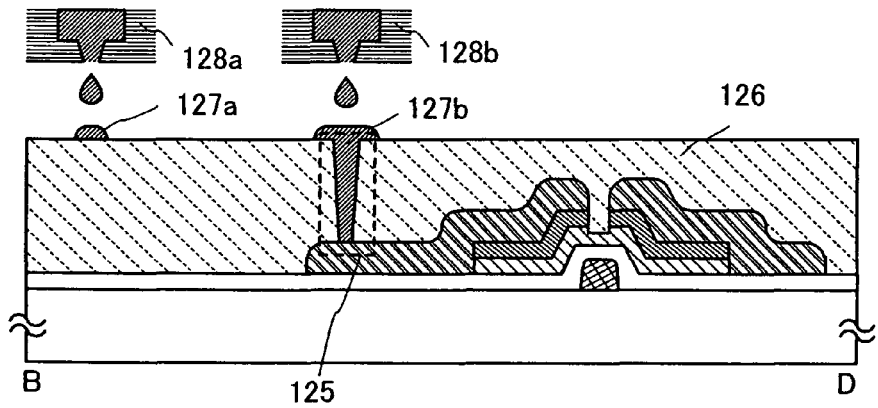

Next, an insulating layer 126 is formed over the gate insulating layer 106, and the transistors 124a and 124b (FIGS. 17B and 17C). As the insulating layer 126, an inorganic material (such as silicon oxide, silicon nitride, silicon oxynitride, or silicon nitride oxide), a photosensitive or nonphotosensitive organic material (organic resin material such as polyimide, acrylic, polyamide, polyimide amide, resist, or benzocyclobutene), a film formed of one or a plurality of kinds of low-dielectric constant materials, a stacked-layer structure thereof, or the like may be used. Alternatively, a siloxane material may be used.

An opening 125 is formed in the insulating layer 126 (FIG. 17C). In this embodiment mode, the opening 125 is formed using the laser beam irradiation apparatus described in any one of Embodiment Modes 1 to 3. In this embodiment mode, the source electrode layer or drain electrode layer 123 is selectively irradiated with laser light from the insulating layer 126 side, thereby part of an irradiated region of the source electrode layer or drain electrode layer 123 is vaporized by irradiation energy. The insulating layer 126 over the irradiated region of the source electrode layer or drain electrode layer 123 is removed to form the opening 125. A first electrode layer is formed in the opening 125 where the source electrode layer or drain electrode layer 123 is exposed, and the source electrode layer or drain electrode layer 123 and the first electrode layer can be electrically connected to each other.

A composition containing a conductive material is selectively discharged to the insulating layer 126 to form the first electrode layer. When light is delivered from the substrate 100 side, the first electrode layer may be formed by forming a predetermined pattern using a composition containing indium tin oxide (ITO), indium tin oxide containing silicon oxide (ITSO), indium zinc oxide containing zinc oxide (ZnO) (IZO (indium zinc oxide)), zinc oxide (ZnO), ZnO doped with gallium (Ga), tin oxide ($SnO_2$), or the like and baking the composition.

In this embodiment mode, the first electrode layer is formed by selectively discharging a composition. In such a manner, when the first electrode layer is selectively formed, the process can be simplified.

In this embodiment mode, the first electrode layer is formed through at least two steps. In this embodiment mode, the first electrode layer is formed using a first conductive layer and a second conductive layer. When the first electrode layer is formed, a first liquid composition containing a conductive material is applied on the outer side of a pattern that is desired to be formed (corresponding to a contour or an edge portion of the pattern) and thereby a first conductive layer having a frame shape is formed. As shown in FIGS. 17A to 17C, a first conductive layer 127 (127a and 127b) having a frame-shape is formed over the insulating layer 126 by droplet discharging apparatuses 128a and 128b.

Figure 18A:
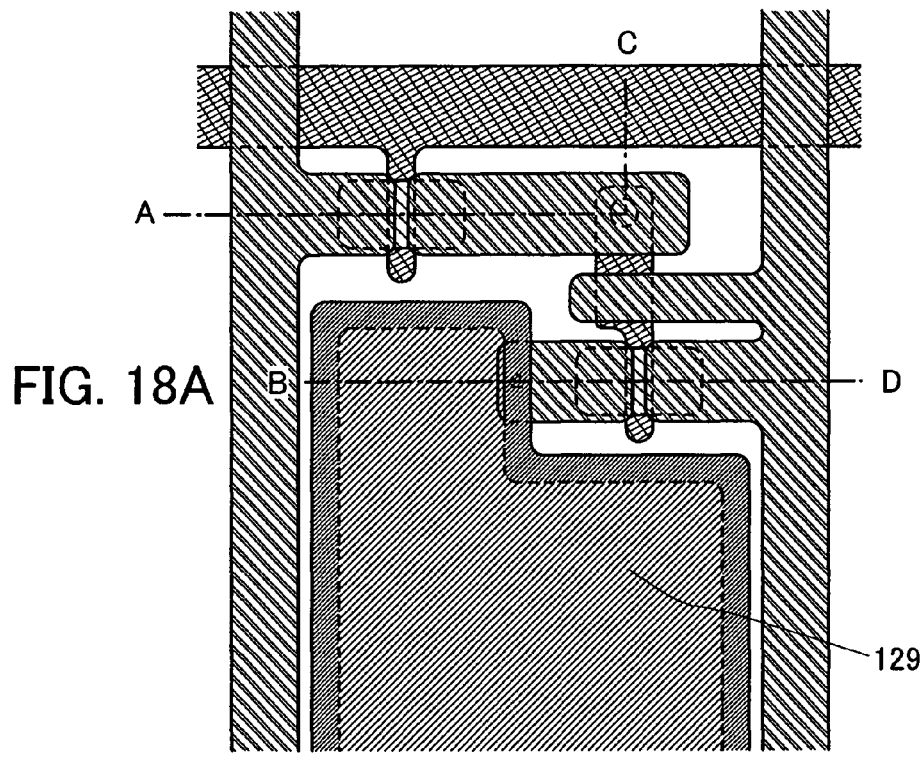
FIGS. 18A to 18C are views showing a method for manufacturing a display device of the present invention.
Figure 18B:
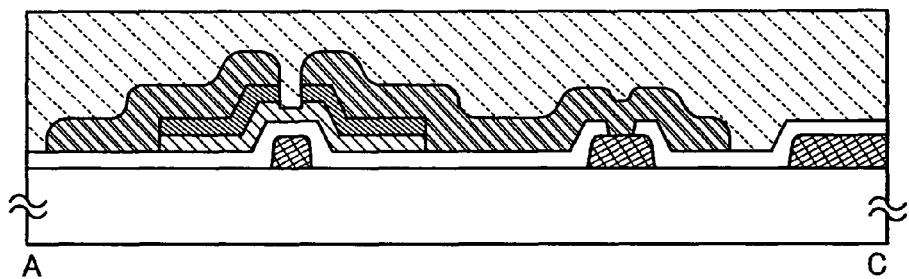
Figure 18C:
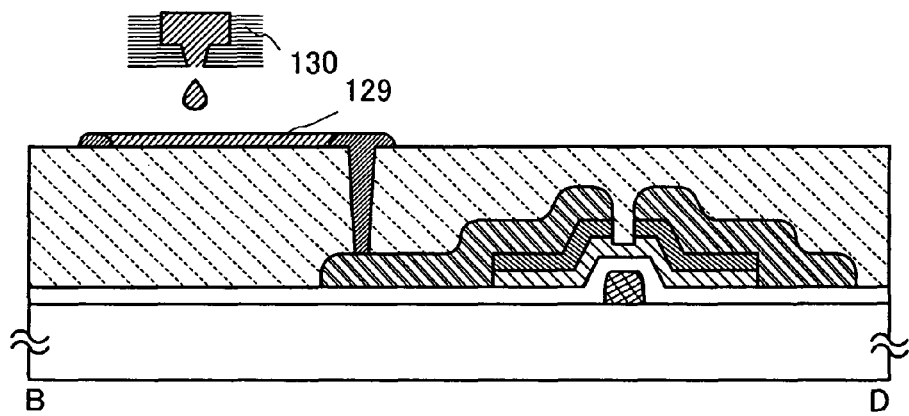
Figure 19A:
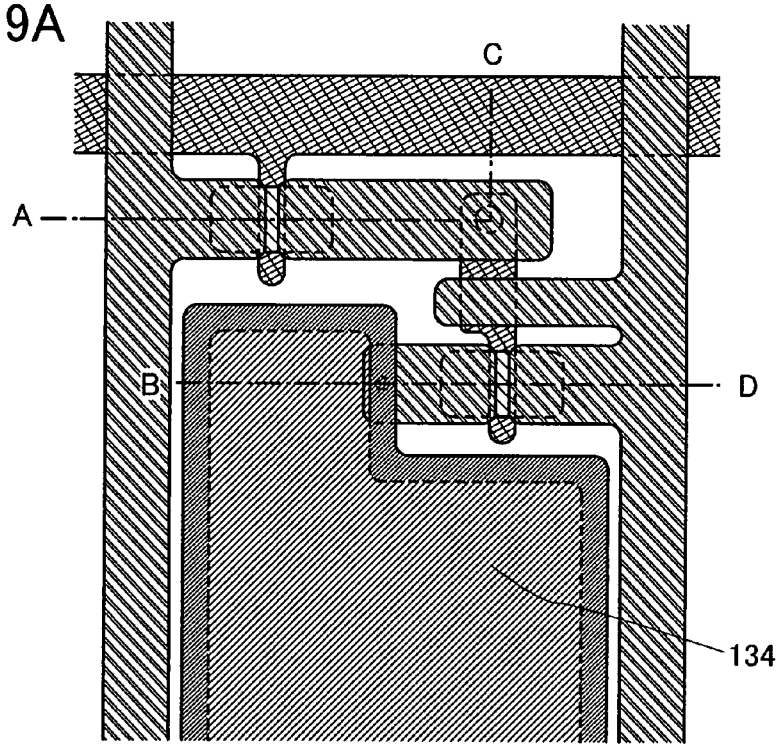
FIGS. 19A to 19C are views showing a method for manufacturing a display device of the present invention.
Figure 19B:
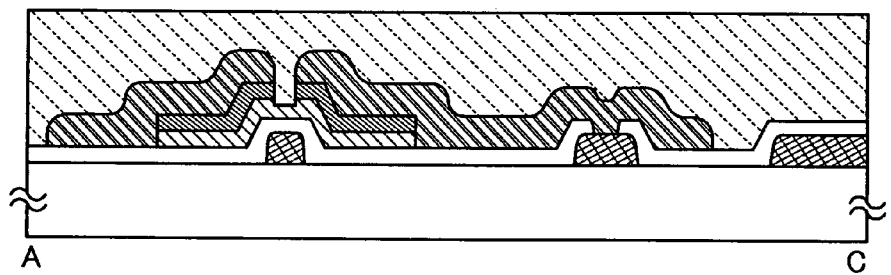
Figure 19C:
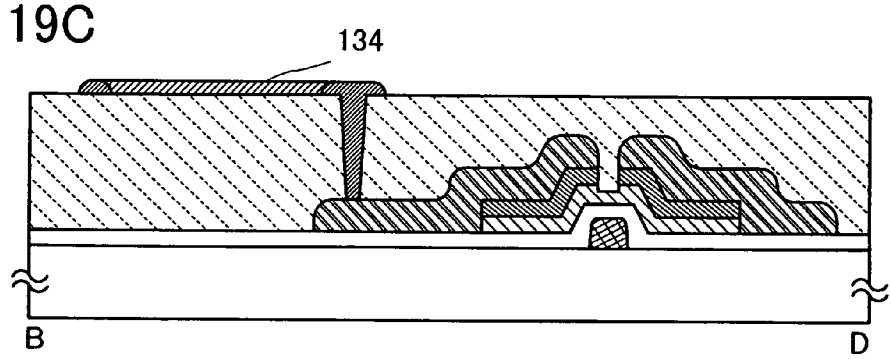

It is preferable that the first conductive layer be a closed region like a frame. Next, a second liquid composition containing a conductive material is applied so that the space inside the first conductive layer having a frame-shape is filled, thereby a second electrode layer is formed. As shown in FIGS. 18A to 18C, a second conductive layer 129 is formed by a droplet discharging apparatus 130 inside the frame of the first conductive layer 127 over the insulating layer 126. The first conductive layer 127 and the second conductive layer 129 are formed to be in contact with each other, and the first conductive layer 127 is formed to surround the second conductive layer 129; therefore, the first conductive layer 127 and the second conductive layer 129 can be used as a first electrode layer 134 that is continuous (see FIGS. 19A to 19C).

When a conductive layer or the like is formed using a liquid composition, a shape of a conductive layer to be formed is greatly influenced by the viscosity of a composition, drying conditions in solidification (such as temperature or pressure), wettability with respect to a formation region, and the like. Therefore, with low viscosity or high wettability with respect to a formation region, a liquid composition spreads over a region where a conductive layer or the like is formed. On the other hand, with high viscosity or low wettability with respect to a formation region, there is a problem in that space (also referred to as pin holes) and unevenness are formed in or on the surface of the conductive layer and a level of planarity is decreased.

Therefore, in the present invention, when the first conductive layer which determines a contour of a region where the conductive layer is formed is formed by applying a composition with relatively high viscosity and low wettability with respect to a formation region, a side edge portion which becomes a contour of a desired pattern can be formed with high controllability. When a liquid composition with low viscosity and high wettability with respect to a formation region is applied inside a frame of the first conductive layer, space, unevenness, and the like due to bubbles and the like generated in or on the surface of the conductive layer are reduced, and the conductive layer which is very flat and uniform can be formed. Therefore, by separate formation of an outer-side conductive layer and an inner-side conductive layer, a conductive layer that has a high level of planarity, less defects, and a desired pattern can be formed with high controllability.

The first electrode layer 126 may be cleaned and polished by a CMP method or with the use of a polyvinyl alcohol-based porous material so that the surface thereof is planarized. In addition, after being polished using a CMP method, the surface of the first electrode layer 126 may be subjected to ultraviolet light irradiation, oxygen plasma treatment, or the like.

Through the above process, a TFT substrate for a display panel where a bottom-gate TFT and the first electrode layer 126 are connected to each other over the substrate 100 is completed. The TFT in this embodiment mode is an inverse staggered TFT.

Next, an insulating layer 131 (also referred to as a partition wall) is selectively formed (FIGS. 20A and 20B). The insulating layer 131 is formed so as to have an opening portion over the first electrode layer 126. In this embodiment mode, the insulating layer 131 is formed over the entire surface and processed by etching with the use of a mask such as resist. When the insulating layer 131 is formed by a droplet discharging method, a printing method, a dispenser method, or the like by which it can be formed directly and selectively, processing by etching is not always necessary.

The insulating layer 131 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular such as polyimide, aromatic polyamide, or polybenzimidazole; an insulating material of inorganic siloxane including a Si—O—Si bond among compounds which are formed using a siloxane-based material as a starting material and which contain silicon, oxygen, and hydrogen; or an organic siloxane-based insulating material in which hydrogen bonded to silicon is substituted with an organic group such as methyl or phenyl. Alternatively, a photosensitive or nonphotosensitive material such as acrylic or polyimide may be used. It is preferable that the insulating layer 131 be formed to have a continuously-changing curvature radius because the coverage by an electroluminescent layer 132 and a second electrode layer 133 to be formed over the insulating layer 131 is improved.

After the insulating layer 131 is formed by discharging of a composition by a droplet-discharging method, a surface thereof may be planarized by being pressed with pressure to enhance a level of planarity. As a pressing method, concavity and convexity of the surface may be reduced by scanning of the surface by a roller-shaped object, or the surface may be pressed perpendicularly by a flat plate-shaped object. Alternatively, concavity and convexity of the surface may be removed with an air knife after the surface is softened or melted with a solvent or the like. Alternatively, a CMP method may be used for polishing the surface. This step can be employed to planarize the surface when the surface becomes uneven due to a droplet-discharging method. When a level of planarity is enhanced by this step, uneven display of the display panel can be prevented, and thus a high-definition image can be displayed.

A light-emitting element is formed over the substrate 100 that is a TFT substrate for the display panel (see FIGS. 20A and 20B).

Before an electroluminescent layer 132 included in the light-emitting element is formed, heat treatment is performed at 200° C. in atmospheric pressure to remove moisture that is in the first electrode layer 134 and the insulating layer 131 or moisture adsorbed on their surfaces. It is preferable to perform the heat treatment at 200 to 400° C., more preferably 250 to 350° C., under low pressure and to form the electroluminescent layer 132 successively without exposing the substrate to the air by a vacuum evaporation method or a droplet discharging method under low pressure.

As the electroluminescent layer 132, materials emitting light of red (R), green (G), and blue (B) are selectively formed by an evaporation method or the like using evaporation masks. Alternatively, the materials emitting light of red (R), green (G), and blue (B) may be formed by a droplet discharging method similarly to a color filter (such as a low-molecular material or a high-molecular material), and thus materials for R, G, and B can be individually formed without the use of masks, which is preferable. A second electrode layer 133 is formed over the electroluminescent layer 132, and a display device having a display function using a light-emitting element is completed.

Although not shown in the drawings, it is effective to provide a passivation film so as to cover the second electrode layer 133. A passivation (protection) film provided when a display device is formed may have a single-layer structure or a multilayer structure. The passivation film can be formed using an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide containing more nitrogen than oxygen (AlNO), aluminum oxide, diamond-like carbon (DLC), or carbon-containing nitrogen ($CN_x$) with a single-layer structure or a stacked-layer structure. For example, a stacked layer of a carbon-containing nitrogen ($CN_x$) film and a silicon nitride (SiN) film, an organic material, or a stacked layer of a high molecular such as a styrene polymer may be used. Alternatively, a siloxane material may be used.

In that case, it is preferable to use a film which provides favorable coverage as the passivation film, and it is effective to use a carbon film, particularly, a DLC film as the passivation film. A DLC film can be formed in the range from room temperature to 100° C.; therefore, it can also be formed easily over an electroluminescent layer with low heat resistance. A DLC film can be formed by a plasma CVD method (typically, an RF plasma CVD method, a microwave CVD method, an electron cyclotron resonance (ECR) CVD method, a thermal-filament CVD method, or the like), a combustion flame method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge. Then, the ions are accelerated so that they impact a cathode to which negative self bias is applied. Further, a CN film may be formed with the use of a $C_2H_4$ gas and a $N_2$ gas as a reaction gas. A DLC film has a high blocking effect against oxygen; therefore, oxidization of the electroluminescent layer can be suppressed. Accordingly, a problem such as oxidation of the electroluminescent layer during a sealing step which is subsequently performed can be prevented.

A sealing material is formed, and sealing is performed using a sealing substrate. Thereafter, a flexible wiring board may be connected to a gate wiring layer that is formed so as to be electrically connected to the gate electrode layer 103, so that electrical connection to an external portion is obtained. This is also applied to a source wiring layer that is formed to be electrically connected to the source electrode layer or drain electrode layer 116 that is also a source wiring layer.

A space between the substrate 100 having an element and the sealing substrate is filled with a filler and thus is sealed. A dripping method may be used instead of filling the space with the filler. Instead of the filler, an inert gas such as nitrogen may be filled. In addition, when a drying agent is provided in the display device, deterioration due to moisture in the light-emitting element can be prevented. The drying agent may be provided on the sealing substrate side or the substrate 100 side having the element. Alternatively, a concave portion may be formed in a region where the sealing material is formed in the substrate, and the drying agent may be provided there. Further, when the drying agent is provided in a place corresponding to a region which does not contribute to display such as a driver circuit region or a wiring region of the sealing substrate, an aperture ratio is not decreased even if the drying agent is an opaque substance. The filler may contain a hygroscopic material and have a function as a drying agent. Thus, a display device having a display function using a light-emitting element is completed.

In this embodiment mode, the switching TFT has a single-gate structure; however, a multi-gate structure such as a double-gate structure may be employed instead. When the semiconductor layer is formed of SAS or a crystalline semiconductor, an impurity region can be formed by addition of an impurity imparting one conductivity type. In this case, the semiconductor layer may have impurity regions with different concentrations. For example, the vicinity of a channel region and a region overlapping with the gate electrode layer may be a low-concentration impurity region, and a region on an outer side of the low-concentration region may be a high-concentration impurity region.

By the present invention, it is not necessary to use a complicated photolithography process including many steps for forming a contact hole; therefore, the steps can be simplified and productivity can be increased. Accordingly, loss of materials and the cost can be reduced. As a result, a high-performance and highly reliable display device can be manufactured with a high yield.

According to this embodiment mode, a linear beam is irradiated using the mask in which openings are formed, thereby the contact holes can be formed efficiently in a manufacturing process of a display panel. For example, in the case of a full-spec high definition panel, it is necessary to form approximately 6.22 million contact holes. According to this embodiment mode, even in such a case, a plurality of contact holes can be formed concurrently by a linear beam, so that productivity is not reduced. Further, it is not necessary to use a complicated photolithography process including many steps for forming a contact hole; therefore, the steps can be simplified. Furthermore, since it is not necessary to use a large amount of chemical solution, a waste solution does not need to be disposed; therefore, adverse effects to environment can be reduced.

Embodiment Mode 6)

In this embodiment mode, a light-emitting display device using a light-emitting element for a display element is described. A method for manufacturing a display device in this embodiment mode is described with reference to FIGS. 21A and 21B.

As a base film over a substrate 150 having an insulating surface, a base film 151a is formed using a silicon nitride oxide film to a thickness of 10 to 200 nm (preferably, 50 to 150 nm), and a base film 151b is formed using a silicon oxynitride film to a thickness of 50 to 200 nm (preferably, 100 to 150 nm) by a sputtering method, a PVD (Physical Vapor Deposition) method, or a CVD (Chemical Vapor Deposition) method such as a low pressure CVD (LPCVD) method or a plasma CVD method. Alternatively, an acrylic acid, a methacrylic acid, or a derivative thereof; a heat-resistant high molecule such as polyimide, aromatic polyamide, or polybenzimidazole; or a siloxane resin may be used. Other resin materials such as a vinyl resin, for example, polyvinyl alcohol or polyvinyl butyral, an epoxy rein, a phenol resin, a novolac resin, an acrylic rein, a melamine resin, and a urethane resin may be used. Alternatively, an organic material such as benzocyclobutene, parylene, fluorinated arylene ether, or polyimide, or a composition material containing water-soluble homopolymers and water-soluble copolymers may be used. Further alternatively, an oxazole resin such as photo-curable polybenzoxazole may be used.

Alternatively, a droplet discharging method, a printing method (a method by which a pattern can be formed, such as screen printing or offset printing), a coating method such as a spin coating method, a dipping method, a dispenser method, or the like may be used. In this embodiment mode, the base films 151a and 151b are formed by a plasma CVD method. As the substrate 150, a glass substrate, a quartz substrate, a silicon substrate, a metal substrate, or a stainless steel substrate having an insulating film formed on its surface may be used. Alternatively, a plastic substrate having heat resistance which can withstand the processing temperature in this embodiment mode, or a flexible substrate such as a film may be used. As a plastic substrate, a substrate made of PET (polyethylene terephthalate), PEN (polyethylene naphthalate), or PES (polyethersulfone) can be used. As a flexible substrate, a synthetic resin such as acrylic can be used. Since a display device manufactured in this embodiment mode has a structure in which light is extracted from the light-emitting element through the substrate 150, it is necessary for the substrate 150 to have a light-transmitting property.

As the base film, silicon oxide, silicon nitride, silicon oxynitride, silicon nitride oxide, or the like can be used, and either a single layer structure or a stacked-layer structure including two or three layers may be employed.

Next, a semiconductor film is formed over the base film. The semiconductor film may be formed to a thickness of 25 to 200 nm (preferably, 30 to 150 nm) by various methods (such as a sputtering method, an LPCVD method, and a plasma CVD method). In this embodiment mode, it is preferable to use a crystalline semiconductor layer which is obtained by crystallization of an amorphous semiconductor film by laser.

The semiconductor film obtained as described above may be doped with a slight amount of an impurity element (boron or phosphorus) in order to control a threshold voltage of a thin film transistor. Such doping with the impurity element may be performed to the amorphous semiconductor film before the crystallization step. When the amorphous semiconductor film is doped with an impurity element and then subjected to heat treatment to be crystallized, activation of the impurity element can also be performed. In addition, a defect caused in doping or the like can be ameliorated.

Then, the crystalline semiconductor film is processed by etching into a desired shape, so that a semiconductor layer is formed.

Concerning an etching process, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be added to the etching gas as appropriate. When an etching process using an atmospheric discharge is employed, local discharge process is also possible, and it is not necessary to form the conductive over the entire surface of the substrate.

In the present invention, a conductive layer for forming a wiring layer or an electrode layer, a mask layer for forming a predetermined pattern, and the like may be formed by a method by which a pattern can be selectively formed, such as a droplet discharging method. By a droplet discharging (jetting) method (also called an ink-jet method depending on its system), a droplet of a composition which is mixed for a particular purpose is selectively discharged (jetted) to form a predetermined pattern (such as a conductive layer or an insulating layer). At that time, treatment to control wettability or adhesion may be performed on a formation region. Alternatively, a method by which a pattern can be transferred (transferred) or drawn, for example, a printing method (a method for forming a pattern, such as screen printing or offset printing), a dispenser method, or the like may be used. In this embodiment mode, a gate electrode layer, a semiconductor layer, a source electrode layer, a drain electrode layer, and the like can be formed using a conductive layer or a semiconductor layer which is formed selectively and precisely in a plurality of steps by a droplet discharging method or the like as described in Embodiment Mode 1. Accordingly, the process can be simplified and loss of materials can be prevented; therefore, the cost can be reduced.

In this embodiment mode, as a mask, a resin material such as an epoxy resin, an acrylic resin, a phenol resin, a novolac resin, a melamine resin, or an urethane resin is used. Alternatively, an organic material such as benzocyclobutene, parylene, fluorinated arylene ether, or polyimide having a light transmitting property; a compound material formed by polymerization of siloxane-based polymers or the like; a composition material containing a water-soluble homopolymer and a water-soluble copolymer; or the like may be used. Further alternatively, a commercial resist material containing a photosensitizer may also be used. For example, a positive resist or a negative resist may be used. A droplet discharging method is used with any material, and the surface tension and the viscosity of the material are adjusted as appropriate, for example, by adjustment of the concentration of a solvent or by addition of a surfactant or the like.

A gate insulating layer which covers the semiconductor layer is formed. The gate insulating layer is formed using an insulating film containing silicon to a thickness of 10 to 150 nm by a plasma CVD method, a sputtering method, or the like. The gate insulating layer may be formed using a material such as an oxide material or a nitride material of silicon, typified by silicon nitride, silicon oxide, silicon oxynitride, and silicon nitride oxide, and may be a stacked layer or a single layer. For example, the insulating layer may have a stacked-layer structure of three layers including a silicon nitride film, a silicon oxide film, and a silicon nitride film, or a single-layer structure or a stacked-layer structure of two layers of a silicon oxynitride film.

Next, a gate electrode layer is formed over the gate insulating layer. The gate electrode layer can be formed by a sputtering method, an evaporation method, a CVD method, or the like. The gate electrode layer may be formed using an element selected from tantalum (Ta), tungsten (W), titanium (Ti), molybdenum (Mo), aluminum (Al), copper (Cu), chromium (Cr), and neodymium (Nd), or an alloy material or a compound material containing these elements as its main component. Alternatively, as the gate electrode layer, a semiconductor film typified by a polycrystalline silicon film doped with an impurity element such as phosphorus, or AgPdCu alloy may be used. The gate electrode layer may have a single-layer structure or a stacked-layer structure.

In this embodiment mode, the gate electrode layer is formed into a tapered shape; however, the present invention is not limited thereto. The gate electrode layer may have a stacked layer structure, where only one layer has a tapered shape while the other is given a perpendicular side surface by anisotropic etching. The taper angles may differ between the stacked gate electrode layers as in this embodiment mode or may be the same. Due to the tapered shape, coverage by a film that is stacked thereover is improved and defects are reduced; therefore, reliability is enhanced.

The gate insulating layer may be etched to some extent and reduced in thickness (so-called film reduction) by the etching step for forming the gate electrode layer.

An impurity element is added to the semiconductor layer to form an impurity region. The impurity region can be formed as a high concentration impurity region and a low concentration impurity region by the control of the concentration of the impurity element. A thin film transistor having a low concentration impurity region is referred to as a thin film transistor having an LDD (Light Doped Drain) structure. In addition, the low concentration impurity region can be formed so as to overlap with the gate electrode. Such a thin film transistor is referred to as a thin film transistor having a GOLD (Gate Overlapped LDD) structure. The polarity of the thin film transistor is made to be an n type by addition of phosphorus (P) or the like to an impurity region thereof. In a case of forming a p-channel thin film transistor, boron (B) or the like may be added.

Figure 21A:
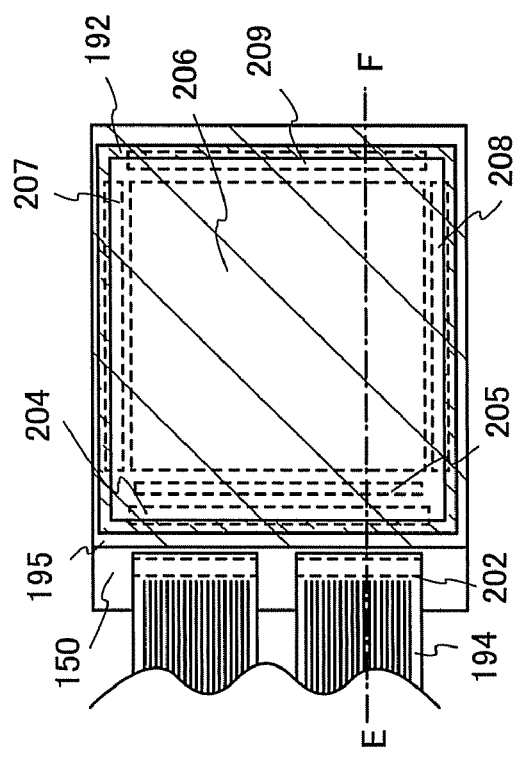
FIGS. 21A and 21B are views each showing a display device of the present invention.
Figure 21B:
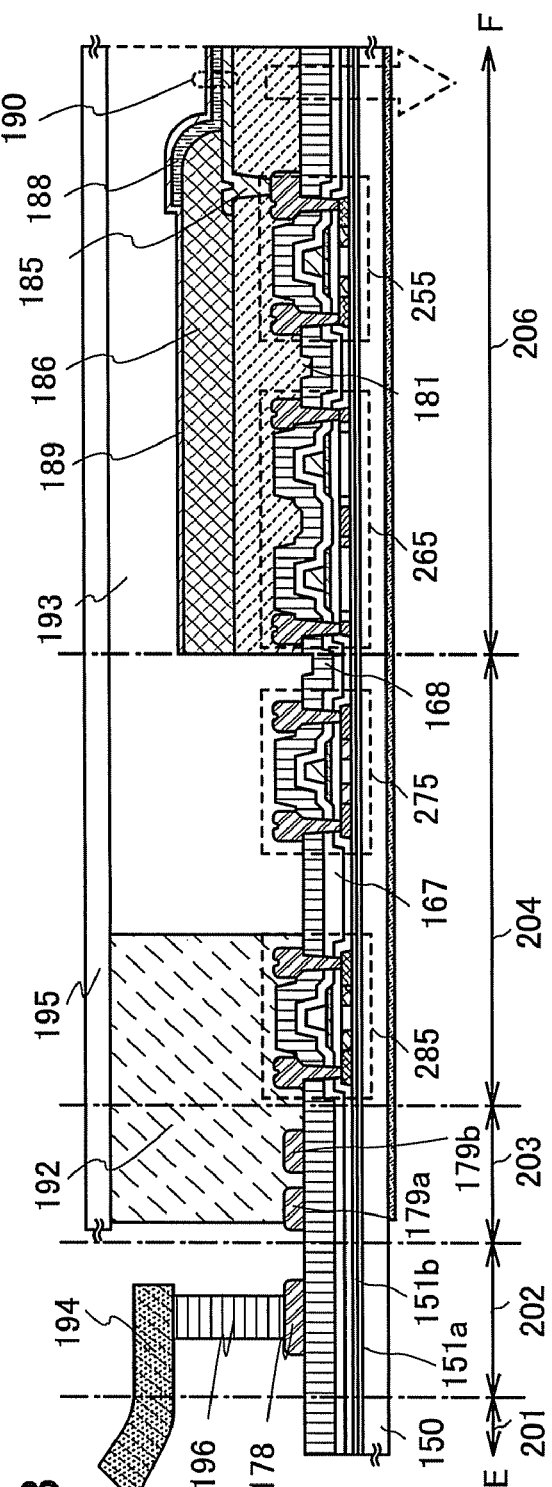

In this embodiment mode, a region of the impurity region, which overlaps with the gate electrode layer with the gate insulating layer interposed therebetween, is denoted as an Lov region. Further, a region of the impurity region, which does not overlap with the gate electrode layer with the gate insulating layer interposed therebetween, is denoted as an Loff region. In FIG. 21B, the impurity regions are shown by hatching and a blank. This does not mean that the blank is not doped with an impurity element, but makes it easy to understand that the concentration distribution of the impurity element in the impurity regions reflects the mask and the doping condition. It is to be noted that this also applies to other drawings in this specification.

In order to activate the impurity element, heat treatment, intense light irradiation, or laser beam irradiation may be performed. At the same time as the activation, plasma damage to the gate insulating layer and plasma damage to the interface between the gate insulating layer and the semiconductor layer can be ameliorated.

Next, a first interlayer insulating layer covering the gate electrode layer and the gate insulating layer is formed. In this embodiment mode, a stacked-layer structure of insulating films 167 and 168 is employed. As the insulating films 167 and 168, a silicon nitride film, a silicon nitride oxide film, a silicon oxynitride film, a silicon oxide film, or the like can be formed by a sputtering method or a plasma CVD method. Alternatively, other insulating film containing silicon may be used as a single layer or a stacked-layer structure including three or more layers.

Further, heat treatment is performed at 300 to 550° C. for 1 to 12 hours in a nitrogen atmosphere to hydrogenate the semiconductor layer. Preferably, this heat treatment is performed at 400 to 500° C. In this step, dangling bonds in the semiconductor layer are terminated by hydrogen contained in the insulating film 167 that is an interlayer insulating layer. In this embodiment mode, heat treatment is performed at 410° C.

The insulating films 167 and 168 may be formed using a material selected from aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and other substances containing an inorganic insulating material. A material containing siloxane may be used. Alternatively, an organic insulating material such as polyimide, acrylic, polyamide, polyimide amide, resist, or benzocyclobutene may be used. Further alternatively, an oxazole resin can be used, and for example, photo-curable polybenzoxazole or the like can be used.

Next, a contact hole (opening), which reaches the semiconductor layer, is formed in the insulating films 167 and 168, and the gate insulating layer by using a mask formed of a resist. A conductive film is formed so as to cover the opening and is etched, so that a source electrode layer or drain electrode layer electrically connected to part of a source region or a drain region is formed. In order to form the source electrode layer or drain electrode layer, a conductive film is formed by a PVD method, a CVD method, an evaporation method, or the like, and then, the conductive film is etched to have a desired shape. Alternatively, a conductive layer can be selectively formed in a predetermined position by a droplet discharging method, a printing method, a dispenser method, an electrolytic plating method, or the like. Alternatively, a reflow method or a damascene method may be used. The source electrode layer or drain electrode layer is formed of a metal such as Ag, Au, Cu, Ni, Pt, Pd, Ir, Rh, W, Al, Ta, Mo, Cd, Zn, Fe, Ti, Si, Ge, Zr, or Ba, or an alloy or metal nitride of any of the above materials. Alternatively, a stacked-layer structure of any of these materials may be used.

In this embodiment mode, a gate electrode layer, a semiconductor layer, a source electrode layer, a drain electrode layer, a wiring layer, a first electrode layer, and the like included in a display device may be formed by discharging a liquid composition including a formation material by a plurality of steps. For example, a frame-shaped first conductive layer is formed along a contour of a pattern of the conductive layer by a first discharging step, and a second conductive layer is formed so as to fill the frame of the first conductive layer by a second discharging step. In that case, when the first conductive layer (insulating layer), which determines a contour of a region where the conductive layer (insulating layer) is formed, is formed by applying a composition with relatively high viscosity and low wettability with respect to the formation region, a side edge portion which becomes a contour of a desired pattern can be formed with high controllability. When a liquid composition with low viscosity and high wettability with respect to the formation region is applied inside the frame of the first conductive layer (insulating layer), space, unevenness, and the like due to bubbles and the like generated in or on the conductive layer are reduced, and the conductive layer (insulating layer) which has high planarity and uniformity can be formed. Therefore, by separate formation of an outer side and an inner side of a conductive layer (insulating layer), the conductive layer (insulating layer) that has a high level of planarity, less defects, and a desired pattern can be formed with high controllability.

Through the above steps, an active matrix substrate can be manufactured, in which a p-channel thin film transistor 285 having a p-type impurity region in an Lov region and an n-channel thin film transistor 275 having an n-channel impurity region in an Lov region are provided in a peripheral driver circuit region 204; and a multi-channel type n-channel thin film transistor 265 having an n-type impurity region in an Loff region and a p-channel thin film transistor 255 having a p-type impurity region in an Lov region are provided in a pixel region 206.

The structure of the thin film transistor in the pixel region is not limited to that of this embodiment mode. A single-gate structure in which one channel formation region is formed, a double-gate structure in which two channel formation regions are formed, or a triple-gate structure in which three channel formation regions are formed may be employed. Further, the thin film transistor in the peripheral driver circuit region may also employ a single gate structure, a double gate structure, or a triple gate structure.

Next, an insulating film 181 is formed as a second interlayer insulating layer. In FIGS. 21A and 21B, a separation region 201 for separation by scribing, an external terminal connection region 202 to which an FPC is attached, a wiring region 203 that is a lead wiring region for the peripheral portion, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed using a material selected from silicon oxide, silicone nitride, silicon oxynitride, silicon nitride oxide, aluminum nitride (AlN), aluminum oxide containing nitrogen (also referred to as aluminum oxynitride) (AlON), aluminum nitride oxide containing oxygen (also referred to as aluminum nitride oxide) (AlNO), aluminum oxide, diamond-like carbon (DLC), nitrogen-containing carbon (CN), PSG (phosphorous silicate glass), BPSG (boron phosphorous silicate glass), alumina, and other substances containing an inorganic insulating material. A siloxane resin may also be used. Alternatively, an organic insulating material which is photosensitive or non-photosensitive such as polyimide, acrylic, polyamide, polyimide amide, resist, benzocyclobutene, polysilazane, or a low-dielectric constant material (Low-k material) may be used. Further alternatively, an oxazole resin can be used. For example, photo-curable polybenzoxazole or the like may be used. It is necessary that an interlayer insulating layer provided for planarization have high heat resistance, a high insulating property, and a high level of planarity. Thus, the insulating film 181 is preferably formed by a coating method typified by a spin coating method.

The insulating film 181 can be formed by a dipping method, spray coating, a doctor knife, a roll coater, a curtain coater, a knife coater, a CVD method, an evaporation method, or the like. Instead, the insulating film 181 may be formed by a droplet discharging method. In the case of a droplet discharging method, a material solution can be economized on. Alternatively, a method by which a pattern can be transferred or drawn, like a droplet discharging method, for example, a printing method (a method for forming a pattern, such as screen printing or offset printing), a dispenser method, or the like may be used.

A minute opening, that is, a contact hole, is formed in the insulating film 181 in the pixel region 206. The source electrode layer or drain electrode layer is electrically connected to a first electrode layer 185 through the opening formed in the insulating film 181. The opening formed in the insulating film 181 can be formed by irradiation with laser light as shown in Embodiment Modes 1 to 4. In this embodiment mode, the source electrode layer or drain electrode layer is formed using a low-melting point metal that is relatively easily vaporized (chromium in this embodiment mode). The source electrode layer or drain electrode layer is selectively irradiated with laser light from the insulating film 181 side, and then part of the irradiated region of the source electrode layer or drain electrode layer is vaporized by irradiation energy. The insulating film 181 over the irradiation region of the source electrode layer or drain electrode layer is removed to form an opening. The first electrode layer 185 is formed in the opening where the source electrode layer or drain electrode layer is exposed, and the source electrode layer or drain electrode layer and the first electrode layer 185 can be electrically connected to each other.

The first electrode layer 185 functions as an anode or a cathode and may be formed from a film mainly containing an element selected from Ti, Ni, W, Cr, Pt, Zn, Sn, In, and Mo, or an alloy material or a compound material containing any of the above elements as its main component, such as TiN, TiSi$_x$N$_y$, WSi$_x$, WN$_x$, WSi$_x$N$_y$, or NbN; or a stacked film thereof with a total thickness of 100 to 800 nm.

In this embodiment mode, a light-emitting element is used as a display element, and the first electrode layer 185 has a light-transmitting property so that light from the light-emitting element is extracted from the first electrode layer 185 side. The first electrode layer 185 is formed using a transparent conductive film which is etched into a desired shape.

In the present invention, the first electrode layer 185 that is a light-transmitting electrode layer may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like may be used instead.

In addition, even in the case of a material that does not have a light-transmitting property, such as a metal film, when the thickness is made thin (preferably, approximately 5 to 30 nm) so that light can be transmitted, light can be delivered through the first electrode layer 185. As a metal thin film that can be used for the first electrode layer 185, a conductive film formed of titanium, tungsten, nickel, gold, platinum, silver, aluminum, magnesium, calcium, lithium, or alloy thereof, or the like can be used.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 is preferably formed to a total thickness of 100 to 800 nm.

The first electrode layer 126 may be cleaned and polished by a CMP method or with the use of a polyvinyl alcohol-based porous material so that the surface thereof is planarized. In addition, after being polished using a CMP method, the surface of the first electrode layer 126 may be subjected to ultraviolet light irradiation, oxygen plasma treatment, or the like.

Heat treatment may be performed after the first electrode layer 185 is formed. By the heat treatment, moisture contained in the first electrode layer 185 is discharged. Accordingly, degassing or the like does not occur in the first electrode layer 185. Thus, even when a light-emitting material that easily deteriorates due to moisture is formed over the first electrode layer, the light-emitting material does not deteriorate. Therefore, a highly reliable display device can be manufactured.

Next, an insulating layer 186 (also referred to as a partition wall or a barrier) covering the edge of the first electrode layer 185 and the source electrode layer or drain electrode layer is formed.

The insulating layer 186 may be formed using silicon oxide, silicon nitride, silicon oxynitride, silicon nitride oxide, or the like and has a single layer structure or a stacked-layer structure of two or three layers. Alternatively, the insulating films 186 may be formed using a material selected from aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, and other substances containing an inorganic insulating material. A material containing siloxane may be used. Alternatively, an organic insulating material which is photosensitive or non-photosensitive such as polyimide, acrylic, polyamide, polyimide amide, resist, or benzocyclobutene may be used. Further alternatively, an oxazole resin can be used. For example, photo-curable polybenzoxazole or the like can be used.

The insulating layer 186 can be formed by a sputtering method, a PVD (Physical Vapor Deposition) method, a CVD (Chemical Vapor Deposition) method such as a low-pressure CVD (LPCVD) method or a plasma CVD method, or the like. Alternatively, a droplet discharging method by which a pattern can be selectively formed, a printing method by which a pattern can be transferred or drawn (a method for forming a pattern, such as screen printing or offset printing), a dispenser method, a coating method such as a spin-coating method, a dipping method, or the like may be used.

As for an etching process for the processing into desired shapes, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used. An inert gas such as He or Ar may be added to the etching gas as appropriate. When an etching process using an atmospheric discharge is employed, local electric discharging process is also possible, and it is not necessary to form the mask layer over the entire surface of the substrate.

In a connection region 205 shown in FIG. 21A, a wiring layer formed of the same material and in the same step as a second electrode layer is electrically connected to a wiring layer formed of the same material and in the same step as the gate electrode layer.

A light-emitting layer 188 is formed over the first electrode layer 185. Although only one pixel is shown in FIGS. 21A and 21B, electrical field electrode layers corresponding to R (red), G (green) and B (blue) are formed separately in this embodiment mode.

Then, a second electrode layer 189 formed of a conductive film is provided over the light-emitting layer 188. As the second electrode layer 189, Al, Ag, Li, Ca, or an alloy or a compound thereof such as MgAg, MgIn, AlLi, or $CaF_2$, or calcium nitride may be used. Thus, a light-emitting element 190 including the first electrode layer 185, the light-emitting layer 188, and the second electrode layer 189 is formed (see FIG. 21B).

In the display device of this embodiment mode shown in FIGS. 21A and 21B, light from the light-emitting element 190 is delivered through the first electrode layer 185 side and transmitted in a direction indicated by the arrow in FIG. 21B.

In this embodiment mode, an insulating layer may be provided as a passivation film (protective film) over the second electrode layer 189. It is effective to provide a passivation film in this manner so as to cover the second electrode layer 189. The passivation film may be formed using an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon, and the insulating film can have a single-layer structure or a stacked-layer structure. Alternatively, a siloxane resin may be used.

In that case, it is preferable to use a film by which favorable coverage is provided as the passivation film, and it is effective to use a carbon film, particularly, a DLC film as the passivation film. A DLC film can be formed in the range from room temperature to 100° C.; therefore, it can also be formed easily over the light-emitting layer 188 with low heat resistance. A DLC film can be formed by a plasma CVD method (typically, an RF plasma CVD method, a microwave CVD method, an electron cyclotron resonance (ECR) CVD method, a thermal-filament CVD method, or the like), a combustion flame method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge, and the ions are accelerated to impact against a cathode to which negative self bias is applied. Further, a CN film may be formed with the use of a $C_2H_4$ gas and a $N_2$ gas as a reaction gas. A DLC film has a high blocking effect against oxygen; therefore, oxidization of the light-emitting layer 188 can be suppressed. Accordingly, a problem such as oxidation of the light-emitting layer 188 during a sealing step which is subsequently performed can be prevented.

The substrate 150 over which the light-emitting element 190 is formed and a sealing substrate 195 are firmly attached to each other with a sealing material 192, so that the light-emitting element is sealed (FIGS. 21A and 21B). As the sealing material 192, typically, a visible light curable resin, an ultraviolet curable resin, or a thermosetting resin is preferably used. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis epoxy resin, a glycidyl ester resin, a glycidyl amine-based resin, a heterocyclic epoxy resin, a modified epoxy resin, or the like can be used. It is to be noted that a region surrounded by the sealing material may be filled with a filler 193, or may be filled with nitrogen or the like by sealing in a nitrogen atmosphere. Since a bottom emission type is employed in this embodiment mode, it is not necessary for the filler 193 to have a light-transmitting property. However, in the case where light is extracted through the filler 193, it is necessary for the filler to have a light-transmitting property. Typically, a visible light curable epoxy resin, an ultraviolet curable epoxy resin, or a thermosetting epoxy resin may be used. Through the aforementioned steps, a display device having a display function using the light-emitting element of this embodiment mode is completed. Further, the filler may be dripped in a liquid state to fill the display device. In the case of using a hygroscopic substance such as a drying agent as the filler, a further moisture absorption can be achieved. Therefore, deterioration of the element can be prevented.

A drying agent is provided in an EL display panel to prevent deterioration due to moisture in the element. In this embodiment mode, the drying agent is provided in a concave portion that is formed on the sealing substrate so as to surround the pixel region and thus, a thin design may be employed. Further, when the drying agent is also formed in a region corresponding to a gate wiring layer so that a moisture absorbing area is increased, the EL display can have high moisture absorption. In addition, when the drying agent is formed over a gate wiring layer which is not self light-emitting, light extraction efficiency is not decreased.

The light-emitting element is sealed by a glass substrate in this embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet light curable resin, and a method for sealing the light-emitting element by a thin film having a high barrier property such as a metal oxide film or a metal nitride film is used. As the cover material, glass, ceramics, plastics, or metal can be used, and it is necessary to use a material having a light-transmitting property in the case where light is delivered to the cover material side. The cover material and the substrate over which the light-emitting element is formed are attached to each other with a sealing material such as a thermosetting resin or an ultraviolet curable resin, and the resin is cured by heat treatment or ultraviolet light irradiation treatment to form a sealed space. It is also effective to provide a moisture absorbing material typified by barium oxide in this sealed space. This moisture absorbing material may be provided on and be in contact with the sealing material, or may be provided over or in the periphery of the partition wall so as not to shield light from the light-emitting element. Further, the space between the cover material and the substrate over which the light-emitting element is formed can be filled with a thermosetting resin or an ultraviolet light curable resin. In this case, it is effective to add a moisture absorbing material typified by barium oxide in the thermosetting resin or the ultraviolet light curable resin.

In addition, it is not necessary for the source electrode layer or drain electrode layer and the first electrode layer to be in direct contact with each other to be electrically connected. They may be connected to each other through a wiring layer.

In addition, in an EL display module, reflected light of light entering from an external portion may be blocked with the use of a retardation plate or a polarizing plate. In a top-emission display device, an insulating layer serving as a partition wall may be colored to be used as a black matrix. This partition wall can be formed by a droplet discharging method or the like. Carbon black or the like may be mixed into a black resin of a pigment material or a resin material such as polyimide to be used, and instead, a stacked layer thereof may be used. By a droplet discharging method, different materials may be discharged to the same region plural times to form the partition wall. A quarter wave plate or a half wave plate may be used as the retardation plate and may be designed to be able to control light. As the structure, the light-emitting element, the sealing substrate (sealing material), the retardation plates (a quarter wave plate ($\lambda/4$) and a half wave plate ($\lambda/2$)), and the polarizing plate are sequentially formed over a TFT substrate, and light delivered from the light-emitting element is transmitted therethrough and is delivered to an external portion from the polarizing plate side. The retardation plate or polarizing plate may be provided on a side to which light is delivered or may be provided on both sides in the case of a dual-emission display device in which light is delivered from the both sides. In addition, an anti-reflective film may be provided on the outer side of the polarizing plate. Accordingly, higher-definition and precise images can be displayed.

In this embodiment mode, the terminal electrode layer 178 is connected to an FPC 194 with an anisotropic conductive layer 196 interposed therebetween in the external terminal connection region 202, and is electrically connected to an external portion. In addition, as shown in FIG. 21A, which is a top plan view of the display device, the display device manufactured in this embodiment mode includes a peripheral driver circuit region 207 and a peripheral driver circuit region 208 each including a scan line driver circuit in addition to the peripheral driver circuit region 204 and the peripheral driver circuit region 209 each including a signal line driver circuit.

A circuit such as that described above is formed in this embodiment mode; however, the present invention is not limited thereto. An IC chip may be mounted by the aforementioned COG method or TAB method as the peripheral driver circuit. Further, one or a plurality of gate line driver circuits and source line driver circuits may be provided.

In the display device of the present invention, there is no particular limitation on a driving method for image display, and for example, a dot sequential driving method, a line sequential driving method, a frame sequential driving method, or the like may be used. Typically, a line sequential driving method may be used, and a time division gray scale driving method and an area gray scale driving method may be used as appropriate. Further, a video signal which is inputted to the source line of the display device may be an analog signal or a digital signal. The driver circuit and the like may be appropriately designed in accordance with the video signal.

In addition, a heat sink and a heat pipe which is a highly efficient thermal conductive device with a pipe shape, which are used for radiating heat to the external portion of the device, may be provided in contact with or adjacent to a substrate over which a TFT is formed, so that a heat radiation effect is enhanced.

By the present invention, a component such as a wiring included in a display device can be formed into a desired shape. In addition, since the number of complicated photolithography steps can be reduced and a display device can be manufactured through a simplified process, loss of materials and the cost can be reduced. Therefore, high-performance and highly reliable display devices can be manufactured with a high yield.

(Embodiment Mode 7)

A thin film transistor can be formed by the present invention, and a display device can be formed using the thin film transistor. When a light-emitting element is used and an n-channel transistor is used as a transistor for driving the light-emitting element, light is delivered from the light-emitting element in the following manner: bottom emission, top emission, or dual emission. Here, a stacked-layer structure of the light-emitting element in each case is described with reference to FIGS. 22A to 22C.

In this embodiment mode, channel protective thin film transistors 461, 471, and 481 to which the present invention is applied are used. The thin film transistor 481 is provided over a light-transmitting substrate 480 and includes a gate electrode layer 493, a gate insulating film 497, a semiconductor layer 494, an n-type semiconductor layer 495a, an n-type semiconductor layer 495b, a source electrode layer or drain electrode layer 487a, a source electrode layer or drain electrode layer 487b, a channel protective layer 496, an insulating layer 499, and a wiring layer 498.

In this embodiment mode, a gate electrode layer, a semiconductor layer, a source electrode layer, a drain electrode layer, a wiring layer, a first electrode layer, or the like included in a display device may be formed by discharging a liquid composition including a formation material by a plurality of steps. As described in Embodiment Mode 1, a frame-shaped first conductive layer is formed along a contour of a pattern of the conductive layer by a first discharging step, and a second conductive layer is formed so as to fill the frame of the first conductive layer by a second discharging step.

Thus, when the first conductive layer (insulating layer), which determines a contour of a region where the conductive layer (insulating layer) is formed, is formed by applying a composition with relatively high viscosity and low wettability with respect to a formation region, a side edge portion which becomes a contour of a desired pattern can be formed with high controllability. When a liquid composition with low viscosity and high wettability with respect to the formation region is applied inside the frame of the first conductive layer (insulating layer), space, unevenness, and the like due to bubbles and the like generated in or on the conductive layer are reduced, and the conductive layer (insulating layer) which has high planarity and uniformity can be formed. Therefore, by separate formation of an outer side and an inner side of a conductive layer (insulating layer), the conductive layer (insulating layer) that has a high level of planarity, less defects, and a desired pattern can be formed with high controllability. Accordingly, the process can be simplified and loss of materials can be prevented; therefore, the cost can be reduced.

In this embodiment mode, an amorphous semiconductor layer is used as the semiconductor layer. However, the present invention is not limited to this embodiment mode, and a crystalline semiconductor layer can be used as the semiconductor layer, and an n-type semiconductor layer can be used as the semiconductor layer having one conductivity type. Instead of formation of the n-type semiconductor layer, conductivity may be imparted to the semiconductor layer by plasma treatment with a $PH_3$ gas. When a crystalline semiconductor layer like polysilicon is used, the semiconductor layer having one conductivity type is not formed, and an impurity region having one conductivity type may be formed by the introduction (addition) of an impurity to the crystalline semiconductor layer. Alternatively, an organic semiconductor such as pentacene may be used. When the organic semiconductor is selectively formed by a droplet discharging method or the like, the process can be simplified.

The case where a crystalline semiconductor layer is used as the semiconductor layer is described. First, an amorphous semiconductor layer is crystallized to form a crystalline semiconductor layer. In a crystallization step, an element which promotes crystallization (also referred to as a catalytic element or a metal element) is added to the amorphous semiconductor layer, and crystallization is performed by heat treatment (at 550 to 750° C. for 3 minutes to 24 hours). As a metal element which promotes crystallization of silicon, one or a plurality of kinds of metals selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove the element which promotes crystallization from the crystalline semiconductor layer or reduce the amount of the element which promotes crystallization in the crystalline semiconductor layer, a semiconductor layer containing an impurity element is formed to be in contact with the crystalline semiconductor layer and is made to function as a gettering sink. As the impurity element, an impurity element imparting n-type conductivity, an impurity element imparting p-type conductivity, a rare gas element, or the like can be used. For example, one or a plurality of kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed to be in contact with the crystalline semiconductor layer containing the element which promotes crystallization, and heat treatment (at 550 to 750° C. for 3 minutes to 24 hours) is performed. The element which promotes crystallization contained in the crystalline semiconductor layer moves into the n-type semiconductor layer, and the element which promotes crystallization contained in the crystalline semiconductor layer is removed or reduced, and thereby the semiconductor layer is formed. Meanwhile, this n-type semiconductor layer becomes an n-type semiconductor layer containing a metal element which promotes crystallization, which is later formed into a desired shape to be an n-type semiconductor layer. Thus, the n-type semiconductor layer functions as a gettering sink of the semiconductor layer, and also as a source region or a drain region.

The crystallization step and the gettering step of the semiconductor layer may be performed by a plurality of heat treatments. Alternatively, the crystallization step and the gettering step may be performed by one heat treatment. In this case, heat treatment may be performed after formation of an amorphous semiconductor layer, addition of an element which promotes crystallization, and formation of a semiconductor layer which functions as a gettering sink.

In this embodiment mode, the gate insulating layer is formed by stacking of a plurality of layers, and a silicon nitride oxide film and a silicon oxynitride film are stacked on the gate electrode layer 493 side, as the gate insulating film 497 having a two-layer structure. The insulating layers which are stacked are preferably formed successively at the same temperature in the same chamber while reaction gases are changed while maintaining a vacuum state. When the films are successively formed while the vacuum state is maintained, an interface between the stacked films can be prevented from being contaminated.

The channel protective layer 496 may be formed by a droplet discharging method using polyimide, polyvinyl alcohol, or the like. As a result, a light exposure step can be omitted. The channel protective layer can be formed using one or a plurality of kinds of an inorganic material (such as silicon oxide, silicon nitride, silicon oxynitride, or silicon nitride oxide), a photosensitive or non-photosensitive organic material (organic resin material) (such as polyimide, acrylic, polyamide, polyimide amide, resist, or benzocyclobutene), a low-dielectric constant material, and the like, or a stacked layer structure thereof. Alternatively, a siloxane material may be used. As a manufacturing method, a vapor deposition method such as a plasma CVD method or a thermal CVD method, or a sputtering method can be used. Alternatively, a droplet discharging method, a dispenser method, or a printing method (a method for forming a pattern, such as screen printing or offset printing) may be used. An SOG film obtained by a coating method, or the like may be used.

First, the case where light is delivered to the substrate 480 side, that is, the case of bottom emission is described with reference to FIG. 22A. In this case, the wiring layer 498 is in contact with the source electrode layer or drain electrode layer 487b. The wiring layer 498, the first electrode layer 484, an electroluminescent layer 485, and a second electrode layer 486 are stacked sequentially so as to be electrically connected to the thin film transistor 481. It is necessary for the substrate 480 through which light is transmitted to have a light-transmitting property at least with respect to visible light.

The case where light is delivered to the side opposite to a substrate 460, that is, the case of top emission is described with reference to FIG. 22B. The thin film transistor 461 can be formed similarly to the thin film transistor 481 described above. A source electrode layer or drain electrode layer 462 electrically connected to the thin film transistor 461 is in contact with a first electrode layer 463 to be electrically connected. The first electrode layer 463, an electroluminescent layer 464, and a second electrode layer 465 are sequentially stacked. The source electrode layer or drain electrode layer 462 is a metal layer having reflectivity and reflects light, which is delivered from the light-emitting element, upward as shown by an arrow. The source electrode layer or drain electrode layer 462 and the first electrode layer 463 have a stacked-layer structure; therefore, even when the first electrode layer 463 is formed of a light-transmitting material and transmits light, the light is reflected on the source electrode layer or drain electrode layer 462 and is then delivered in the direction opposite to the substrate 460. It is needless to say that the first electrode layer 463 may also formed using a metal film having reflectivity. Since light from the light-emitting element is delivered through the second electrode layer 465, the second electrode layer 465 is formed using a material having a light-transmitting property at least with respect to visible light.

Then, the case where light is delivered to the substrate 470 side and to the side opposite to the substrate 470 side, that is, the case of dual emission is described with reference to FIG. 22C. The thin film transistor 471 is also a channel protective thin film transistor. A source electrode layer or drain electrode layer 477 electrically connected to a semiconductor layer of the thin film transistor 471 is electrically connected to a first electrode layer 472. The first electrode layer 472, an electroluminescent layer 473, and a second electrode layer 474 are sequentially stacked. At this time, when the first electrode layer 472 and the second electrode layer 474 are both formed using a material having a light-transmitting property at least with respect to visible light or are both formed to have thicknesses such that light can be transmitted, dual emission is realized. In this case, it is also necessary for the insulating layer and the substrate 470 through which light is transmitted to have a light-transmitting property at least with respect to visible light.

By the present invention, it is not necessary to use a complicated photolithography process including many steps for forming a contact hole; therefore, the steps can be simplified and productivity can be increased. Accordingly, loss of materials and the cost can be reduced. As a result, a high-performance and highly reliable display device can be manufactured with a high yield.

(Embodiment Mode 8)

In this embodiment mode, a structure of a light-emitting element which can be used as the display element of a display device, which is described in the aforementioned embodiment mode, is described with reference to FIGS. 23A to 23D.

FIGS. 23A to 23D each show an element structure of a light-emitting element where an electroluminescent layer 860 formed by mixing an organic compound and an inorganic compound is interposed between a first electrode layer 870 and a second electrode layer 850. As shown in the drawings, the electroluminescent layer 860 includes a first layer 804, a second layer 803, and a third layer 802 and in particular, has a significant feature in the first layer 804 and the third layer 802.

First, the first layer 804 is a layer which has a function of transporting holes to the second layer 803, and includes at least a first organic compound and a first inorganic compound showing an electron-accepting property with respect to the first organic compound. It is important that the first organic compound and the first inorganic compound are not simply mixed but the first inorganic compound has an electron-accepting property with respect to the first organic compound. With this structure, many hole-carriers are generated in the first organic compound having originally almost no inherent carriers, and a hole-injecting property and hole-transporting property which are extremely excellent are obtained.

Therefore, as for the first layer 804, not only an advantageous effect that is considered to be obtained by mixing an organic compound and an inorganic compound (such as improvement in heat resistance) but also excellent conductivity (in particular, a hole-injecting property and a hole-transporting property in the first layer 804) can be obtained. This excellent conductivity is an advantageous effect which cannot be obtained in a conventional hole-transporting layer in which an organic compound and an inorganic compound that do not electronically interact with each other are simply mixed. This advantageous effect can make a driving voltage lower than the conventional case. In addition, since the first layer 804 can be made thick without causing a rise in driving voltage, short circuit of the element due to dusts or the like can be suppressed.

It is preferable to use a hole-transporting organic compound as the first organic compound because hole carriers are generated in the first organic compound as described above. The hole-transporting organic compound includes, for example, phthalocyanine (abbreviation: $H_2Pc$), copper phthalocyanine (abbreviation: CuPc), vanadyl phthalocyanine (abbreviation: VOPc), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4''-tris(N-carbazolyl)triphenylamine (abbreviation: TCTA), and the like. However, the present invention is not limited thereto. Among the compounds described above, aromatic amine compounds typified by TDATA, MTDATA, m-MTDAB, TPD, NPB, DNTPD, and TCTA can easily generate hole carriers and are suitable compound groups for the first organic compound.

On the other hand, the first inorganic compound may be any material as long as the material can easily accept electrons from the first organic compound, and various kinds of metal oxides and metal nitrides may be used. Oxides of any of transition metals that belong to Groups 4 to 12 of the periodic table is preferable because an electron-accepting property is easily provided. Specifically, titanium oxide, zirconium oxide, vanadium oxide, molybdenum oxide, tungsten oxide, rhenium oxide, ruthenium oxide, zinc oxide, and the like can be given. Among the metal oxides described above, oxides of any of transition metals that belong to Groups 4 to 8 of the periodic table mostly has a high electron-accepting property and is a preferable group. In particular, vanadium oxide, molybdenum oxide, tungsten oxide, and rhenium oxide are preferable because they can be treated by vacuum evaporation and can be easily used.

It is to be noted that the first layer 804 may be formed by stacking of a plurality of layers each containing a combination of the organic compound and the inorganic compound described above, or may further contain another organic compound or inorganic compound.

Next, the third layer 802 is described. The third layer 802 is a layer having a function of transporting electrons to the second layer 803 and includes at least a third organic compound and a third inorganic compound showing an electron-donating property to the third organic compound. It is important that the third organic compound and the third inorganic compound are not simply mixed but the third inorganic compound has an electron-donating property with respect to the third organic compound. With this structure, many electron-carriers are generated in the third organic compound which has originally almost no inherent carriers, and an electron-injecting and an electron-transporting property which are highly excellent can be obtained.

Therefore, as for the third layer 802, not only an advantageous effect that is considered to be obtained by mixing an organic compound and an inorganic compound (such as improvement in heat resistance) but also excellent conductivity (in particular, a hole-injecting property and a hole-transporting property in the third layer 802) can be obtained. This excellent conductivity is an advantageous effect which cannot be obtained in a conventional hole-transporting layer in which an organic compound and an inorganic compound that do not electronically interact with each other are simply mixed. This advantageous effect can make a driving voltage lower than the conventional case. In addition, since the third layer 802 can be made thick without causing a rise in driving voltage, short circuit of the element due to dusts or the like can be suppressed.

It is preferable to use an electron-transporting organic compound as the third organic compound because electron carriers are generated in the third organic compound as described above. The electron-transporting organic compound includes, for example, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis [2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the present invention is not limited thereto. Among the compounds mentioned above, chelate metal complexes each having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron carriers and are suitable compound groups for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be treated by vacuum evaporation and can be easily used.

It is to be noted that the third layer 802 may be formed by stacking of a plurality of layers each containing a combination of the organic compound and the inorganic compound described above, or may further contain another organic compound or inorganic compound.

Then, the second layer 803 is described. The second layer 803 is a layer having a function of emitting light and includes a second organic compound having a light-emitting property. The second layer 803 may include a second inorganic compound. The second layer 803 may be formed using various light-emitting organic compounds and inorganic compounds. However, since it is considered that a current does not easily flows through the second layer 803 as compared to through the first layer 804 or the third layer 802, the thickness of the second layer 803 is preferably approximately 10 to 100 nm.

There are no particular limitations on the second organic compound as long as it is a light-emitting organic compound. The second organic compound includes, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)

perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Alternatively, a compound capable of emitting phosphorescence such as bis[2-(4',6'-difluorophenyl)pyridinato-N,$C^{2'}$]iridium (picolinate) (abbreviation: FIrpic), bis{2-[3',5'-bis(trifluoromethyl)phenyl]pyridinato-N,$C^{2'}$}iridium(picolinate) (abbreviation: Ir($CF_3$ppy)$_2$(pic)), tris(2-phenylpyridinato-N,$C^{2'}$) iridium (abbreviation: Ir(ppy)$_3$), bis(2-phenylpyridinato-N,$C^{2'}$)iridium(acetylacetonate) (abbreviation: Ir(ppy)$_2$(acac)), bis[2-(2'-thienyl)pyridinato-N,$C^{3'}$]iridium(acetylacetonate) (abbreviation: Ir(thp)$_2$(acac)), bis(2-phenylquinolinato-N,$C^{2'}$)iridium(acetylacetonate) (abbreviation: Ir(pq)$_2$(acac)), or bis[2-(2'-benzothienyl)pyridinato-N,$C^{3'}$]iridium(acetylacetonate) (abbreviation: Ir(btp)$_2$(acac)) may be used.

Further, a triplet excitation light-emitting material containing a metal complex or the like may be used for the second layer 803 in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature that light-emitting efficiency is favorable so that less power is consumed to obtain the same luminance. In other words, when a triplet excitation light-emitting material is used for the pixel emitting light of red, only a small amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element emitting light of green that has high visibility for a human eye with the use of a triplet excitation light-emitting material.

The second layer 803 may be added with not only the second organic compound described above, which emits light, but also another organic compound. An organic compound that can be added includes, for example, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited thereto. It is preferable that the organic compound which is added in addition to the second organic compound have larger excitation energy than the second organic compound and be added by larger amount than the second organic compound, in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure where color display is performed by formation of a light-emitting layer having a different emission wavelength range for each pixel. Typically, a light-emitting layer corresponding to each of R (red), G (green), and B (blue) is formed. Also in this case, color purity can be improved and a pixel portion can be prevented from having a mirror surface (reflecting) by provision of a filter which transmits light of the emission wavelength range on the light-emission side of the pixel. By provision of the filter, a circularly polarizing plate or the like that has been considered to be necessary can be omitted, and further, the loss of light delivered from the light-emitting layer can be eliminated. Further, change in color tone, which occurs when a pixel portion (display screen) is obliquely seen, can be reduced.

Either a low-molecular organic light-emitting material or a high-molecular organic light-emitting material may be used for a material of the second layer 803. A high-molecular organic light-emitting material has higher physical strength and higher durability of the element than a low-molecular material. In addition, since a high-molecular organic light-emitting material can be formed by coating, the element can be relatively easily formed.

The emission color is determined depending on a material forming the light-emitting layer; therefore, a light-emitting element which emits desired light can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO—PPV], poly(2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO—PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light emission of the second organic compound is not easily quenched by the inorganic compound, and various kinds of metal oxide and metal nitride may be used. In particular, a metal oxide having a metal that belongs to Group 13 or 14 of the periodic table is preferable because light emission of the second organic compound is not easily quenched, and specifically, aluminum oxide, gallium oxide, silicon oxide, and germanium oxide are preferable. However, the second inorganic compound is not limited thereto.

It is to be noted that the second layer 803 may be formed by stacking of a plurality of layers each containing a combination of the organic compound and the inorganic compound, which are described above, or may further contain another organic compound or inorganic compound. A layer structure of the light-emitting layer can be changed, and an electrode layer for injecting electrons may be provided or a light-emitting material may be dispersed, instead of provision of a specific electron-injecting region or light-emitting region. Such a change can be permitted unless it departs from the spirit of the present invention.

A light-emitting element formed using the above materials emits light by being forwardly biased. A pixel of a display device which is formed using a light-emitting element can be driven by a simple matrix mode or an active matrix mode. In any case, each pixel emits light by application of forward bias thereto at a specific timing; however, the pixel is in a non-emitting state for a certain period. Reliability of a light-emitting element can be improved by application of reverse bias in the non-emitting time. In a light-emitting element, there is a deterioration mode in which emission intensity is decreased under a constant driving condition or a deterioration mode in which a non-light-emitting region is increased in the pixel and luminance is apparently decreased. However, progression of deterioration can be slowed down by performing of alternating driving where bias is applied forwardly and reversely; thus, reliability of a light-emitting display device can be improved. In addition, either digital driving or analog driving can be applied.

A color filter (colored layer) may be formed over a sealing substrate. The color filter (colored layer) can be formed by an evaporation method or a droplet discharging method. High-definition display can be performed with the use of the color filter (colored layer). This is because a broad peak can be modified to be sharp in an emission spectrum of each of R, G, and B by the color filter (colored layer).

A material emitting light of a single color is formed and it is combined with a color filter or a color conversion layer, so that full color display can be performed. The color filter (colored layer) or the color conversion layer may be formed over, for example, the sealing substrate and attached to an element substrate.

It is needless to say that display of a single color emission may be performed. For example, an area color type display device may be formed using single color emission. The area color type display device is suitable for a passive matrix display portion and can mainly display characters and symbols.

Materials for the first electrode layer 870 and the second electrode layer 850 are necessary to be selected considering the work function. The first electrode layer 870 and the second electrode layer 850 can be either an anode or a cathode depending on the pixel structure. In a case where the polarity of a driving thin film transistor is a p-channel type, the first electrode layer 870 preferably serves as an anode and the second electrode layer 850 preferably serves as a cathode as shown in FIG. 22A. In the case where the polarity of the driving thin film transistor is an n-channel type, the first electrode layer 870 preferably serves as a cathode and the second electrode layer 850 preferably serves as an anode as shown in FIG. 22B. Materials that can be used for the first electrode layer 870 and the second electrode layer 850 are described below. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is superior in a hole-injecting property and a hole-transporting property and the third layer 802 is superior in an electron-injecting property and an electron transporting property, both the first electrode layer 870 and the second electrode layer 850 are scarcely restricted by a work function and various materials can be used.

Figure 22A:
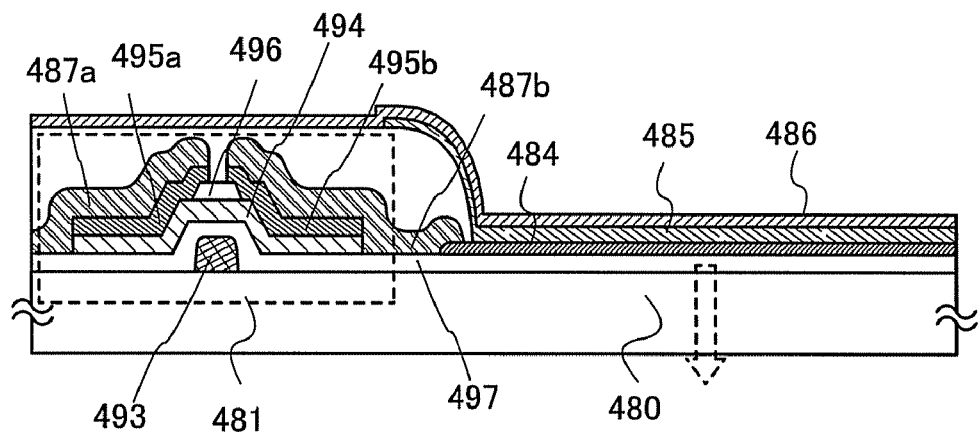
FIGS. 22A to 22C are views each showing a display device of the present invention.
Figure 22B:
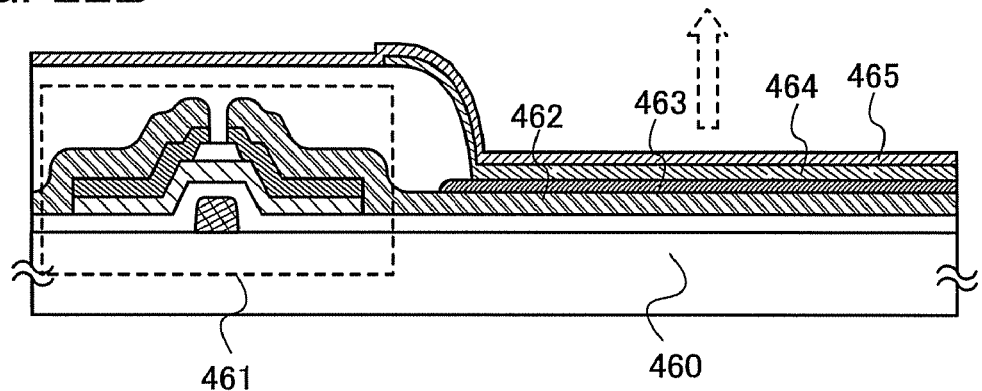
Figure 22C:
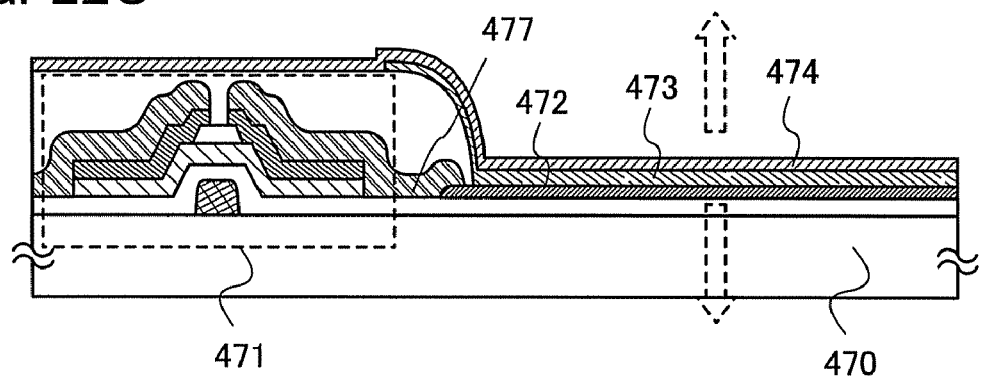

The light-emitting elements in FIGS. 22A and 22B each have a structure where light is extracted from the first electrode layer 870 and thus, the second electrode layer 850 is not necessary to have a light-transmitting property. The second electrode layer 850 may be formed from a film mainly containing an element selected from Ti, Ni, W, Cr, Pt, Zn, Sn, In, Ta, Al, Cu, Au, Ag, Mg, Ca, Li and Mo, or an alloy material or a compound material containing any of the above elements as its main component, such as TiN, $TiSi_xN_y$, $WSi_x$, $WN_x$, $WSi_xN_y$, or NbN; or a stacked film thereof with a total thickness of 100 to 800 nm.

The second electrode layer 850 can be formed by an evaporation method, a sputtering method, a CVD method, a printing method, a dispenser method, a droplet discharging method, or the like.

In addition, when the second electrode layer 850 is formed using a light-transmitting conductive material similarly to the material used for the first electrode layer 870, light can be extracted from the second electrode layer 850 as well, and a dual emission structure can be obtained, in which light delivered from the light-emitting element is delivered from both the first electrode layer 870 and the second electrode layer 850.

It is to be noted that the light-emitting element of the present invention can have variations by changing of types of the first electrode layer 870 and the second electrode layer 850.

FIG. 22B shows the case where the electroluminescent layer 860 is formed by stacking of the third layer 802, the second layer 803, and the first layer 804 in this order on the first electrode layer 870 side.

As described above, in the light-emitting element of the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions of a high carrier-injecting property and carrier-transporting property by mixing of an organic compound and an inorganic compound. Such functions as high carrier-injecting property and carrier-transporting property cannot be obtained from only either one of the organic compound or the inorganic compound. In addition, the first layer 804 and the third layer 802 are particularly necessary to be layers in which an organic compound and an inorganic compound are combined when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method for vaporizing both an organic compound and an inorganic compound by resistance heating. Alternatively, for co-evaporation, an inorganic compound may be vaporized by an electron beam (EB) while an organic compound is vaporized by resistance heating. Further alternatively, a method for sputtering an inorganic compound while vaporizing an organic compound by resistance heating to deposit the both at the same time. Instead, the electroluminescent layer 860 may be formed by a wet method.

In the same manner, for the first electrode layer 870 and the second electrode layer 850, an evaporation method by resistance heating, an EB evaporation method, a sputtering method, a wet method, or the like can be used.

Figure 23A:
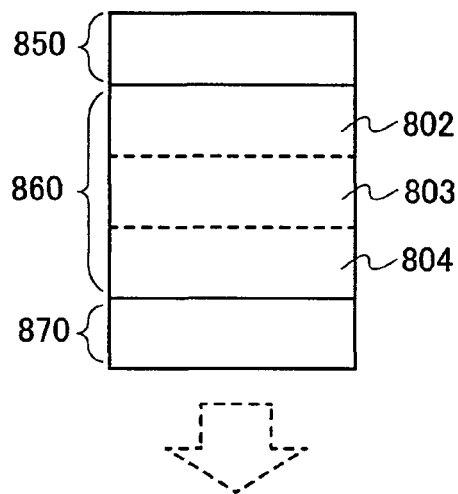
FIGS. 23A to 23D are views each showing a structure of a light-emitting element which can be applied to the present invention.
Figure 23B:
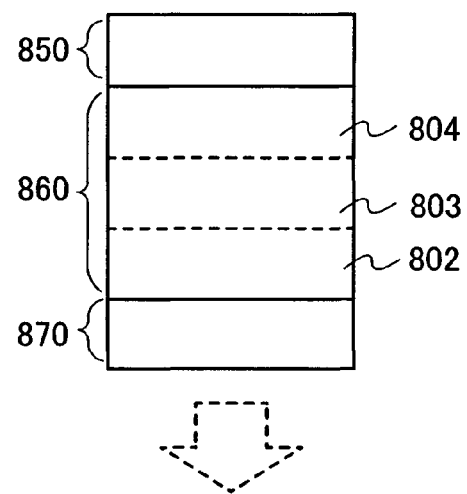
Figure 23C:
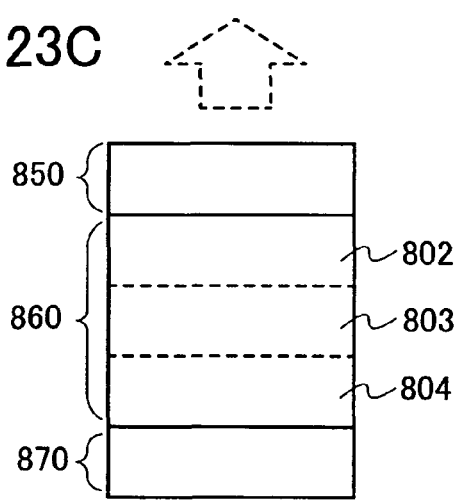
Figure 23D:
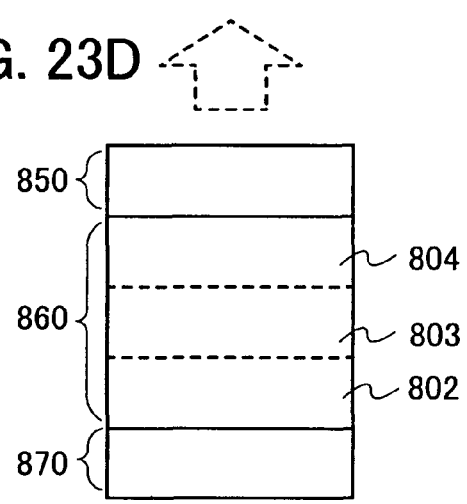

In FIG. 23C, an electrode layer having reflectivity is used for the first electrode layer 870, and an electrode layer having a light-transmitting property is used for the second electrode layer 850 in the structure of FIG. 23A. Light delivered from the light-emitting element is reflected off the first electrode layer 870, transmitted through the second electrode layer 850, and delivered. Similarly, in FIG. 23D, an electrode layer having reflectivity is used for the first electrode layer 870, and an electrode layer having a light-transmitting property is used for the second electrode layer 850 in the structure of FIG. 23B. Light delivered from the light-emitting element is reflected off the first electrode layer 870, transmitted through the second electrode layer 850, and delivered.

By the present invention, it is not necessary to use a complicated photolithography process including many steps for forming a contact hole; therefore, the steps can be simplified and productivity can be increased. Accordingly, loss of materials and the cost can be reduced. As a result, a high-performance and highly reliable display device can be manufactured with a high yield.

(Embodiment Mode 9)

In this embodiment mode, a structure of a light-emitting element which can be used as a display element of the display device which is described in any of the above embodiment mode, is described with reference to FIGS. 24A to 25C.

A light-emitting element utilizing electroluminescence is distinguished depending on whether a light-emitting material is an organic compound or an inorganic compound. In general, the former is called an organic EL element, and the latter is called an inorganic EL element.

The inorganic EL element is categorized into a dispersion inorganic EL element and a thin-film inorganic EL element depending on its element structure. The former and the latter are different in that the former has an electroluminescent layer where particles of a light-emitting material are dispersed in a binder, and the latter has an electroluminescent layer formed of a thin film of a light-emitting material. However, the former and the latter are the same in that electrons accelerated by a high electric field are necessary. It is to be noted that, as a mechanism of light emission that is obtained, there are donor-acceptor recombination light emission that utilizes a donor level and an acceptor level, and localized light emission that utilizes inner-shell electron transition of a metal ion. In many cases, it is general that a dispersion inorganic EL element has donor-acceptor recombination light emission and a thin-film inorganic EL element has localized light emission.

The light-emitting material that can be used in the present invention includes a base material and an impurity element to be a light-emission center. An impurity element that is contained is changed, so that light emission of various colors can be obtained. As a method for forming the light-emitting material, various methods such as a solid phase method and a liquid phase method (coprecipitation method) may be used. Alternatively, a spray pyrolysis method, a double decomposition method, a method by heat decomposition reaction of a precursor, a reversed micelle method, a method in which such a method is combined with high-temperature baking, a liquid phase method such as a lyophilization method, or the like may be used.

A solid phase method is a method in which a base material, and an impurity element or a compound containing an impurity element are weighed, mixed in a mortar, heated in an electric furnace, and baked to be reacted, so that the impurity element is contained in the base material. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state. Although the baking is necessary to be performed at relatively high temperature, the solid phase method is easy; therefore, high productivity can be achieved. Thus, the solid phase method is suitable for mass production.

A liquid phase method (coprecipitation method) is a method in which a base material or a compound containing a base material is reacted with an impurity element or a compound containing an impurity element in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, zinc oxide (ZnO), yttrium oxide ($Y_2O_3$), or the like can be used. As nitride, aluminum nitride (AlN), gallium nitride (GaN), indium nitride (InN), or the like can be used. Alternatively, zinc selenide (ZnSe), zinc telluride (ZnTe), or the like may be used, or a ternary mixed crystal such as calcium-gallium sulfide ($CaGa_2S_4$), strontium-gallium sulfide ($SrGa_2S_4$), or barium-gallium sulfide ($BaGa_2S_4$) may be used.

As a light-emission center of localized light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added. A halogen element can have a function of compensating a charge.

On the other hand, as a light-emission center of donor-acceptor recombination light emission, a light-emitting material containing a first impurity element which forms a donor level and a second impurity element which forms an acceptor level can be used. As the first impurity element, fluorine (F), chlorine (Cl), aluminum (Al), or the like can be used. As the second impurity element, copper (Cu), silver (Ag), or the like can be used.

In the case where the light-emitting material of donor-acceptor recombination light emission is synthesized by a solid phase method, a base material, the first impurity element or a compound containing a first impurity element, and the second impurity element or a compound containing the second impurity element are weighed in each, mixed in a mortar, heated in an electric furnace, and baked. As the base material, any of the above described base materials can be used. As the first impurity element or the compound containing the first impurity element, fluorine (F), chlorine (Cl), aluminum sulfide ($Al_2S_3$), or the like can be used. As the second impurity element or the compound containing the second impurity element, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state.

As the impurity element in the case of utilizing solid reaction, the compounds containing the first impurity element and the second impurity element may be combined. In this case, since the impurity element is easily diffused and solid reaction progresses easily, a uniform light-emitting material can be obtained. Further, since an unnecessary impurity element is not mixed therein, a light-emitting material having high purity can be obtained. As the compounds containing the first impurity element and the second impurity element, copper chloride (CuCl), silver chloride (AgCl), or the like can be used.

It is to be noted that the concentration of these impurity elements may be 0.01 to 10 atomic % with respect to the base material and is preferably 0.05 to 5 atomic %.

In the case of a thin-film inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 24A:
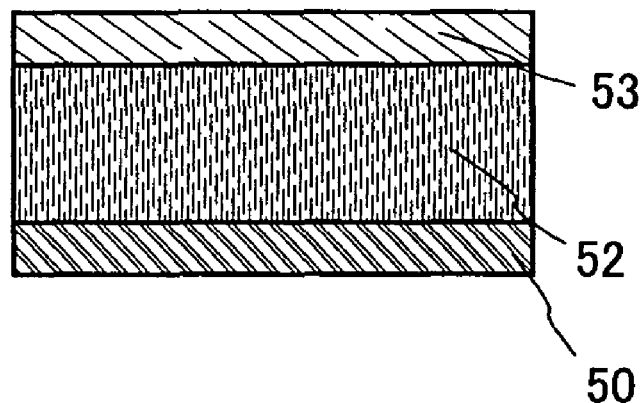
FIGS. 24A to 24C are views each showing a structure of a light-emitting element which can be applied to the present invention.
Figure 24B:
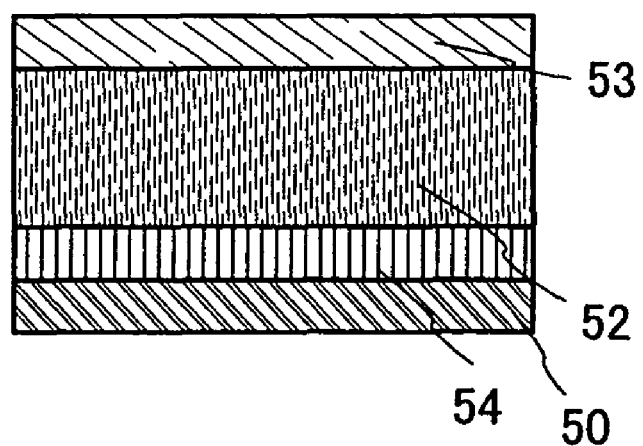
Figure 24C:
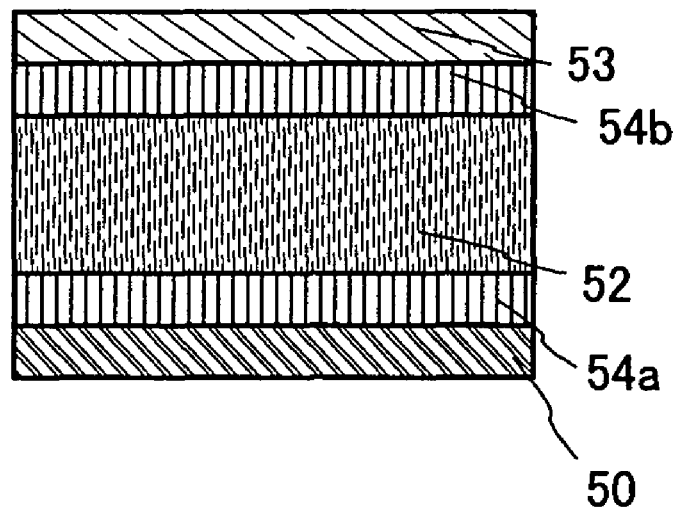

FIGS. 24A to 24C each show an example of a thin-film inorganic EL element that can be used as a light-emitting element. In FIGS. 24A to 24C, each light-emitting element includes a first electrode layer 50, an electroluminescent layer 52, and a second electrode layer 53.

The light-emitting elements shown in FIGS. 24B and 24C each have a structure where an insulating layer is provided between the electrode layer and the electroluminescent layer of the light-emitting element of FIG. 24A. The light-emitting element shown in FIG. 24B has an insulating layer 54 between the first electrode layer 50 and the electroluminescent layer 52. The light-emitting element shown in FIG. 24C includes an insulating layer 54a between the first electrode layer 50 and the electroluminescent layer 52, and an insulating layer 54b between the second electrode layer 53 and the electroluminescent layer 52. Thus, the insulating layer may be provided between the electroluminescent layer and one of the electrode layers that sandwich the electroluminescent layer, or the insulating layer may be provided between the electroluminescent layer and the first electrode layer and between the electroluminescent layer and the second electrode layer. Further, the insulating layer may have a single-layer structure or a stacked-layer structure including a plurality of layers.

In addition, although the insulating layer 54 is provided so as to be in contact with the first electrode layer 50 in FIG. 24B, the insulating layer 54 may be provided so as to be in contact with the second electrode layer 53 by reversing of the positions of the insulating layer and the electroluminescent layer.

In the case of a dispersion inorganic EL element, a film-shaped electroluminescent layer where particles of a light-emitting material are dispersed in a binder is formed. When particles with desired grain sizes cannot be obtained by a manufacturing method of a light-emitting material, a light-emitting material may be processed into a particle state by being crushed in a mortar or the like. The binder is a substance for fixing particles of a light-emitting material in a dispersed state to keep a shape of an electroluminescent layer. The light-emitting material is uniformly dispersed and fixed in the electroluminescent layer by the binder.

In the case of a dispersion inorganic EL element, as a formation method of an electroluminescent layer, a droplet discharging method which can selectively form an electroluminescent layer, a printing method (such as screen printing or offset printing), a coating method such as a spin coating method, a dipping method, a dispenser method, or the like can be used. There are no particular limitations on the thickness of the electroluminescent layer; however, a thickness of 10 to 1000 nm is preferable. In addition, in the electroluminescent layer containing a light-emitting material and a binder, a ratio of the light-emitting material is preferably 50 to 80 wt %.

Figure 25A:
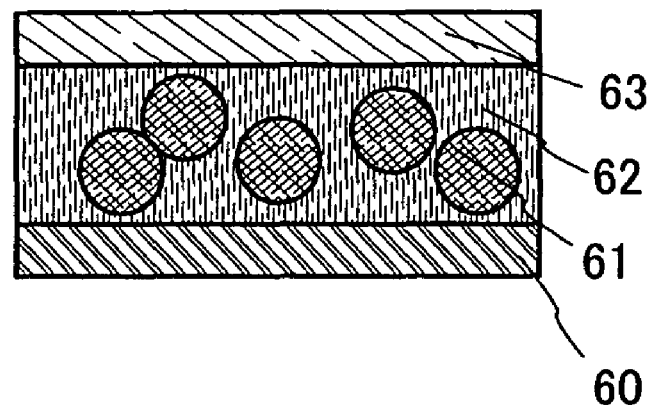
FIGS. 25A to 25C are views each showing a structure of a light-emitting element which can be applied to the present invention.
Figure 25B:
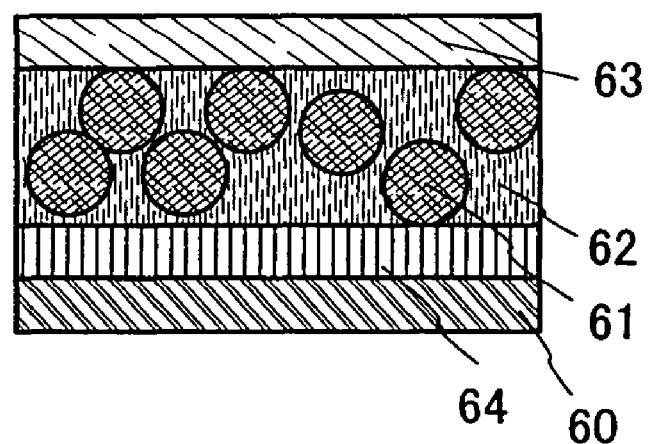
Figure 25C:
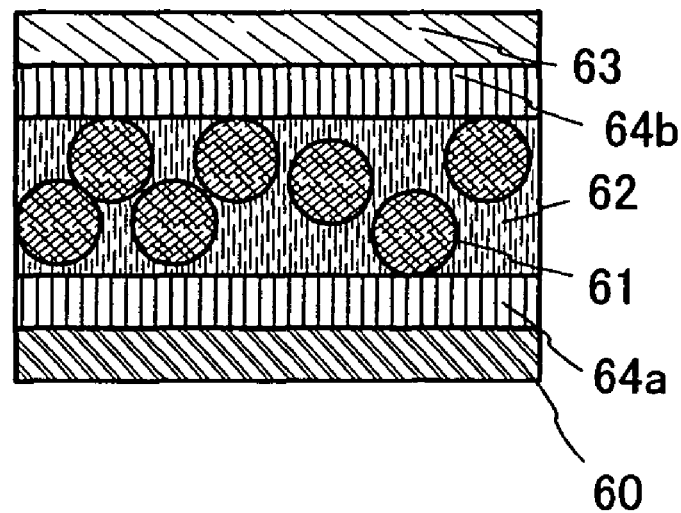

FIGS. 25A to 25C each show an example of a dispersion inorganic EL element that can be used as a light-emitting element. In FIG. 25A, the light-emitting element has a stacked-layer structure of a first electrode layer 60, an electroluminescent layer 62, and a second electrode layer 63, in which a light-emitting material 61 held by a binder is contained in the electroluminescent layer 62.

As the binder that can be used in this embodiment mode, an organic material or an inorganic material can be used, or a mixed material of an organic material and an inorganic material may be used. As the organic material, a polymer having a relatively high dielectric constant like a cyanoethyl cellulose-based resin, or a resin such as polyethylene, polypropylene, a polystyrene-based resin, a silicone resin, an epoxy resin, or vinylidene fluoride can be used. Alternatively, a heat-resistant high molecular such as aromatic polyamide or polybenzimidazole, or a siloxane resin may be used. A siloxane resin corresponds to a resin containing a Si—O—Si bond. Siloxane is composed of a skeleton structure formed by the bond of silicon (Si) and oxygen (O). As a substituent thereof, an organic group containing at least hydrogen (such as an alkyl group or aromatic hydrocarbon) is used. Instead, a fluoro group, or a fluoro group and an organic group containing at least hydrogen may be used as the substituent. Further alternatively, a resin material such as a vinyl resin, for example, polyvinyl alcohol or polyvinyl butyral, a phenol resin, a novolac resin, an acrylic resin, a melamine resin, a urethane resin, or an oxazole resin (polybenzoxazole) may be used. A dielectric constant can be controlled by mixing of these resins with high-dielectric constant microparticles of barium titanate ($BaTiO_3$), strontium titanate ($SrTiO_3$), or the like as appropriate.

As the inorganic material contained in the binder, a material selected from silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other substances containing an inorganic insulating material can be used. By mixing of the organic material with a high-dielectric constant inorganic material (by addition or the like), a dielectric constant of an electroluminescent layer containing a light-emitting material and a binder can be controlled much better and further increased. When a mixed layer of an inorganic material and an organic material is used for the binder to have a high dielectric constant, a larger electric charge can be induced by the light-emitting material.

In a manufacturing process, the light-emitting material is dispersed in a solution containing a binder. As a solvent of the solution containing a binder that can be used in this embodiment mode, it is preferable to select a solvent that dissolves a binder material and can make a solution with the viscosity appropriate for a method for forming the electroluminescent layer (various wet processes) and for a desired film thickness. An organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 25B and 25C each have a structure where an insulating layer is provided between the electrode layer and the electroluminescent layer of the light-emitting element of FIG. 25A. The light-emitting element shown in FIG. 25B has an insulating layer 64 between the first electrode layer 60 and the electroluminescent layer 62. The light-emitting element shown in FIG. 25C includes an insulating layer 64a between the first electrode layer 60 and the electroluminescent layer 62, and an insulating layer 64b between the second electrode layer 63 and the electroluminescent layer 62. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Further, the insulating layer may have a single-layer structure or a stacked-layer structure including a plurality of layers.

In addition, although the insulating layer 64 is provided so as to be in contact with the first electrode layer 60 in FIG. 25B, the insulating layer 64 may be provided so as to be in contact with the second electrode layer 63 by reversing of the positions of the insulating layer and the electroluminescent layer.

Although the insulating layer 54 in FIGS. 24B and 24C and the insulating layer 64 in FIGS. 25B and 25C are not particularly limited, such insulating layers are preferably dense films with high dielectric strength, and more preferably, with a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked-layer film of two or more kinds thereof can be used. These insulating films can be formed by sputtering, evaporation, CVD, or the like. Alternatively, the insulating layers may be formed by dispersing of particles of these insulating materials in a binder. The binder material may be formed of the same material and by the same method as the binder contained in the electroluminescent layer. A thickness of the insulating layer is not particularly limited, and a thickness of 10 to 1000 nm is preferable.

The light-emitting element described in this embodiment mode can emit light by application of a voltage between the pair of electrodes which sandwich the electroluminescent layer, and can be operated by direct current driving or alternating current driving.

By the present invention, it is not necessary to use a complicated photolithography process including many steps for forming a contact hole; therefore, the steps can be simplified and productivity can be increased. Accordingly, loss of materials and the cost can be reduced. As a result, a high-performance and highly reliable display device can be manufactured with a high yield.

(Embodiment Mode 10)

In this embodiment mode, a liquid crystal display device using a liquid crystal element for a display element is described.

Figure 26A:
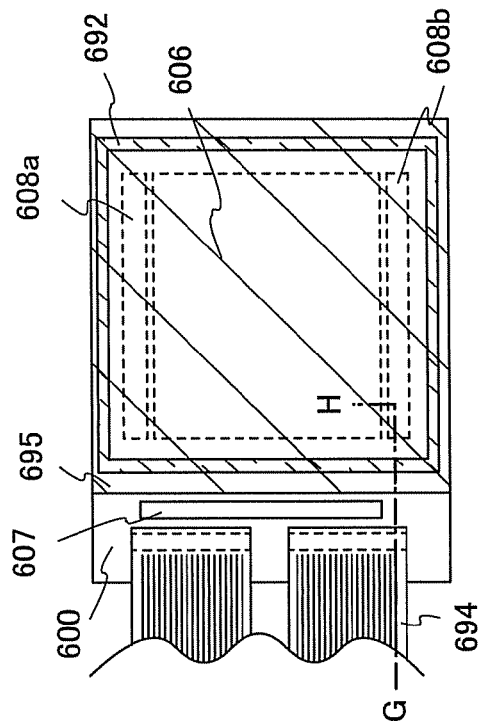
FIGS. 26A and 26B are views showing a display device of the present invention.
Figure 26B:
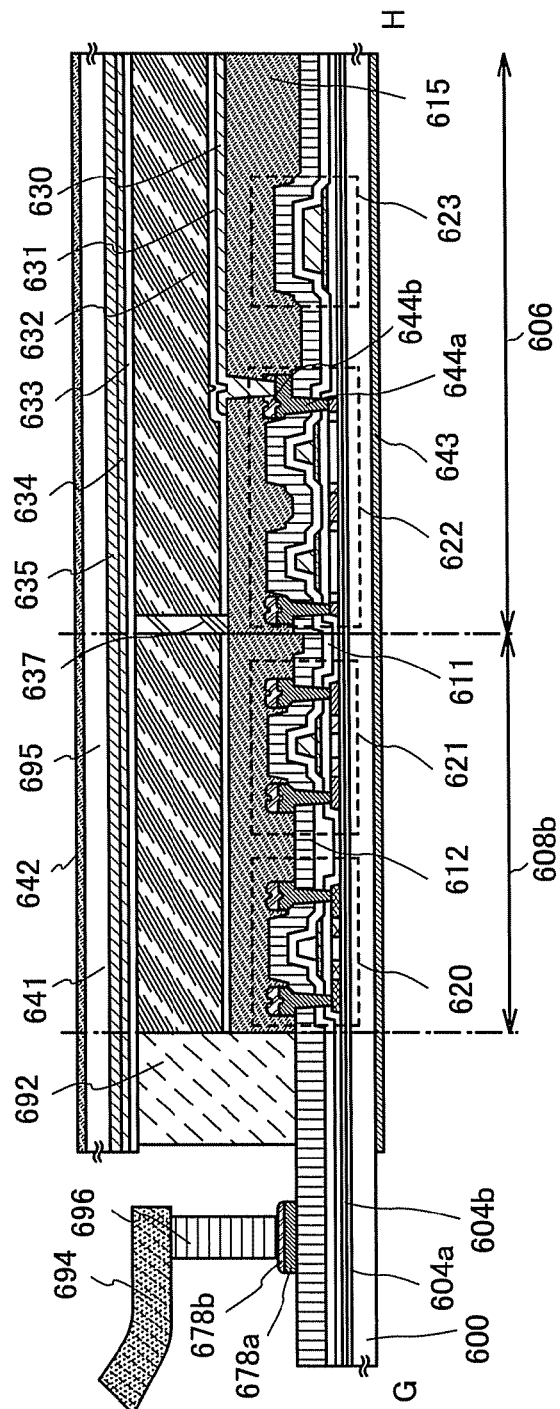

FIG. 26A is a top plan view of a liquid crystal display device, and FIG. 26B is a cross-sectional view taken along a dashed dotted line G-H of FIG. 26A. In the top plan view of FIG. 26A, an anti-reflective film is omitted.

As shown in FIG. 26A, a pixel region 606, a driving circuit region 608a and a driving circuit region 608b which are scan line driving regions are sealed between a substrate 600 and a counter substrate 695 with a sealing material 692. A driving circuit region 607 which is a signal line driver region formed with an IC driver is provided over the substrate 600. A transistor 622 and a capacitor 623 are provided in the pixel region 606. A driver circuit having transistors 620 and 621 is provided in the driving circuit region 608b. An insulating substrate can be used as the substrate 600 as in the above embodiment modes. Although there is a concern that a substrate formed of a synthetic resin generally has a lower temperature limit than other substrates, the substrate formed of a synthetic resin can be used when a manufacturing process is performed using a substrate with high heat resistance and then the substrate formed of a synthetic resin displaces the substrate with high heat resistance.

In this embodiment mode, a gate electrode layer, a semiconductor layer, a source electrode layer, a drain electrode layer, a wiring layer, a first electrode layer, and the like included in a display device may be formed by discharging a liquid composition including a formation material by a plurality of steps. For example, a frame-shaped first conductive layer is formed along a contour of a pattern of the conductive layer by a first discharging step, and a second conductive layer is formed so as to fill the frame of the first conductive layer by a second discharging step. In that case, when the first conductive layer (insulating layer), which determines a contour of a region where the conductive layer (insulating layer) is formed, is formed by applying a composition with relatively high viscosity and low wettability with respect to the formation region, a side edge portion which becomes a contour of a desired pattern can be formed with high controllability. When a liquid composition with low viscosity and high wettability with respect to the formation region is applied inside the frame of the first conductive layer (insulating layer), space, unevenness, and the like due to bubbles and the like generated in or on the conductive layer are reduced, and the conductive layer (insulating layer) which has high planarity and uniformity can be formed. Therefore, by separate formation of an outer side and an inner side of a conductive layer (insulating layer), the conductive layer (insulating layer) that has a high level of planarity, less defects, and a desired pattern can be formed with high controllability. Accordingly, the process can be simplified and loss of materials can be prevented; therefore, the cost can be reduced.

Further, the gate electrode layer, the semiconductor layer, the source electrode layer, the drain electrode layer, the wiring layer, the first electrode layer, or the like included in the display device may be obtained by forming a conductive film by a sputtering method or a CVD method and selectively etching the conductive film.

In the pixel region 606, the transistor 622 which is to be a switching element is provided with base films 604a and 604b interposed therebetween. In this embodiment mode, a multi-gate thin film transistor (TFT) is used as the transistor 622, which includes a semiconductor layer having impurity regions serving as a source region and a drain region, a gate insulting layer, a gate electrode layer having a stacked-layer structure of two layers, a source electrode layer, and a drain electrode layer. The source electrode layer or drain electrode layer is in contact with and electrically connected to an impurity region of the semiconductor layer and a pixel electrode layer 630.

The source electrode layer and drain electrode layer have a stacked-layer structure, and the source electrode layers or drain electrode layers 644a and 644b are electrically connected to the pixel electrode layer 630 through an opening formed in an insulating layer 615. The opening formed in the insulating layer 615 can be formed by irradiation with laser light as described in Embodiment Modes 1 to 3. In this embodiment mode, the source electrode layer or drain electrode layer 644b is formed using a low-melting point metal that is relatively easily vaporized (chromium in this embodiment mode), and the source electrode layer or drain electrode layer 644a is formed using a high-melting point metal that is not easily vaporized compared to the source electrode layer or drain electrode layer 644b (tungsten in this embodiment mode). The source electrode layers or drain electrode layers 644a and 644b are selectively irradiated with laser light from the insulating layer 615 side, and then an irradiated region of the source electrode layer or drain electrode layer 644b is vaporized by irradiation energy. Then, the insulating layer 615 over the irradiated region of the source electrode layer or the drain electrode layers 644b is removed to form the opening. The pixel electrode layer 630 is formed in the opening where the source electrode layers or drain electrode layers 644a and 644b are exposed, and the source electrode layers or drain electrode layers 644a and 644b and the pixel electrode layer 630 can be electrically connected to each other.

The thin film transistor can be manufactured by various methods. For example, a crystalline semiconductor film is used for an active layer, a gate electrode is formed over the crystalline semiconductor film with a gate insulating film interposed therebetween, and an impurity element can be added to the active layer with use of the gate electrode. Thus, when the gate electrode is used for adding the impurity element, a mask for adding the impurity element is not necessarily formed. The gate electrode can have a single-layer structure or a stacked-layer structure. The impurity region can be a high-concentration impurity region or a low-concentration impurity region with its concentration being controlled. A structure of a thin film transistor having a low-concentration impurity region is called an LDD (Light Doped Drain) structure. Alternatively, the low-concentration impurity region may be formed so as to overlap with the gate electrode and a structure of such a thin film transistor is called a GOLD (Gate Overlapped LDD) structure. The polarity of the thin film transistor is an n type when phosphorus (P) or the like is used for the impurity region. The polarity of the thin film transistor is a p type when boron (B) or the like is added. After that, insulating films 611 and 612 covering the gate electrode and the like are formed. A dangling bond of the crystalline semiconductor film can be terminated by a hydrogen element mixed into the insulating film 611 (and the insulating film 612).

In order to further improve planarity, the insulating layer 615 may be formed as an interlayer insulating layer. For the insulating layer 615, an organic material, an inorganic material, or a stacked-layer structure thereof can be used. For example, a material selected from silicon oxide, silicon nitride, silicon oxynitride, silicon nitride oxide, aluminum nitride, aluminum oxynitride, aluminum nitride oxide containing more nitrogen than oxygen, aluminum oxide, diamond-like carbon (DLC), polysilazane, nitrogen-containing carbon (CN), PSG (phosphorous silicate glass), BPSG (boron phosphorous silicate glass), alumina, or any other substance containing an inorganic insulating material can be used. Alternatively, an organic insulating material may be used. As the organic material, either a photosensitive or nonphotosensitive material can be used, and polyimide, acrylic, polyamide, polyimide amide, resist, benzocyclobutene, a siloxane resin, or the like can be used. It is to be noted that a siloxane resin is a resin containing a Si—O—Si bond. The skeletal structure of siloxane is formed of a bond of silicon (Si) and oxygen (O). As a substituent, an organic group containing at least hydrogen (such as an alkyl group or aromatic hydrocarbon) is used. Instead, a fluoro group or a fluoro group and an organic group containing at least hydrogen may be used as the substituent.

The pixel region and the driver circuit region can be formed over one substrate when the crystalline semiconductor film is used. In this case, a transistor in the pixel portion and a transistor in the driver circuit region 608b are formed at the same time. The transistor used in the driver circuit region 608b forms a CMOS circuit. Although a thin film transistor included in the CMOS circuit has a GOLD structure, it may have an LDD structure like the transistor 622.

A structure of the thin film transistor in the pixel region is not limited to those in this embodiment mode, and a single-gate structure in which one channel formation region is formed, a double-gate structure in which two channel formation regions are formed, or a triple-gate structure in which three channel formation regions are formed may be employed. A thin film transistor in a peripheral driver circuit region may also have a single-gate structure, a double-gate structure, or a triple-gate structure.

It is to be noted that a method for manufacturing a thin film transistor is not limited to those described in this embodiment mode. The thin film transistor may have a top gate structure (such as a staggered type), a bottom gate structure (such as a inverse staggered type), a dual gate structure in which two gate electrode layers are arranged above or below a channel formation region, each with a gate insulating film interposed therebetween, or another structure.

Then, an insulating layer 631 called an alignment film is formed by a printing method or a droplet discharging method so as to cover the pixel electrode layer 630. It is to be noted that the insulating layer 631 can be selectively formed by a screen printing method or an off-set printing method. Thereafter, rubbing treatment is performed. This rubbing treatment is not performed in some cases when a liquid crystal mode is, for example, a VA mode. An insulating layer 633 serving as an alignment film is similar to the insulating layer 631. Then, the sealing material 692 is formed in a peripheral region of the pixels by a droplet discharging method.

After that, the counter substrate 695 provided with the insulating layer 633 serving as the alignment film, a conductive layer 634 serving as a counter electrode, a colored layer 635 serving as a color filter, a polarizer 641 (also referred to as a polarizing plate), and a polarizer 642 is attached to the substrate 600 which is a TFT substrate with a spacer 637 interposed therebetween. A liquid crystal layer 632 is provided in a space therebetween. Since the liquid crystal display device of this embodiment mode is a transmissive type, a polarizer (polarizing plate) 643 is also provided on a side of the substrate 600, which is opposite to a side where an element is formed. The polarizer can be provided over the substrate with the use of an adhesive layer. A filler may be mixed into the sealing material, and a shielding film (black matrix) or the like may be formed over the counter substrate 695. It is to be noted that a color filter or the like may be formed of materials which exhibit red (R), green (G), and blue (B) when the liquid crystal display device performs full-color display, and the colored layer may be omitted or may be formed of a material which exhibits at least one color when the liquid crystal display device performs single-color display.

It is to be noted that when RGB light-emitting diodes (LEDs) or the like are provided in a backlight and a field sequential method for performing color display by time division is employed, there is the case where a color filter is not provided. The black matrix may be provided so as to overlap with the transistor and the CMOS circuit because the black matrix reduces the reflection of external light by the wiring in the transistor and the CMOS circuit. Alternatively, the black matrix may be provided so as to overlap with the capacitor. It is because the black matrix can prevent reflection due to a metal film included in the capacitor.

As a method for forming the liquid crystal layer, a dispenser method (dripping method) or an injection method by which the substrate 600 provided with an element and the counter substrate 695 are attached and then a liquid crystal is injected with the use of capillary phenomenon can be used. A dripping method may be employed when a large substrate to which an injection method is difficult to be applied is used.

A spacer may be provided by a method by which particles each having a size of several μm are sprayed. In this embodiment mode, a method by which a resin film is formed over the entire surface of the substrate and then etched is employed. A material for the spacer is applied by a spinner and then, light exposure and developing treatment are performed to form a predetermined pattern. Further, the material is heated at 150 to 200° C. in a clean oven or the like to be cured. The spacer manufactured in this manner can have various shapes depending on the conditions of light exposure and the developing treatment. It is preferable that the spacer have a columnar shape with a flat top so that mechanical strength of the liquid crystal display device can be secured when the counter substrate is attached. The shape of the spacer is not particularly limited and may be conical, pyramidal, or the like.

Then, an FPC 694, which is a wiring board for connection, is provided over terminal electrode layers 678a and 678b electrically connected to the pixel region, with an anisotropic conductive layer 696 interposed therebetween. The FPC 694 transmits an external signal and an external potential. Through the aforementioned steps, a liquid crystal display device having a display function can be manufactured.

The wiring and the gate electrode layer, which are included in the transistor, the pixel electrode layer 630, and the conductive layer 634 serving as the counter electrode layer can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such metals; or metal nitride thereof.

A retardation plate may be provided between the polarizing plate and the liquid crystal layer.

Note that in this embodiment mode, a TN liquid crystal panel is described; however, the above process can be similarly applied to liquid crystal panels of other modes. For example, this embodiment mode can be applied to a liquid crystal panel of an in-plane switching mode in which liquid crystals are aligned by application of an electric field in a direction parallel to the glass substrate. Further, this embodiment mode can also be applied to a VA (Vertical Alignment) mode liquid crystal panel.

Figure 27:
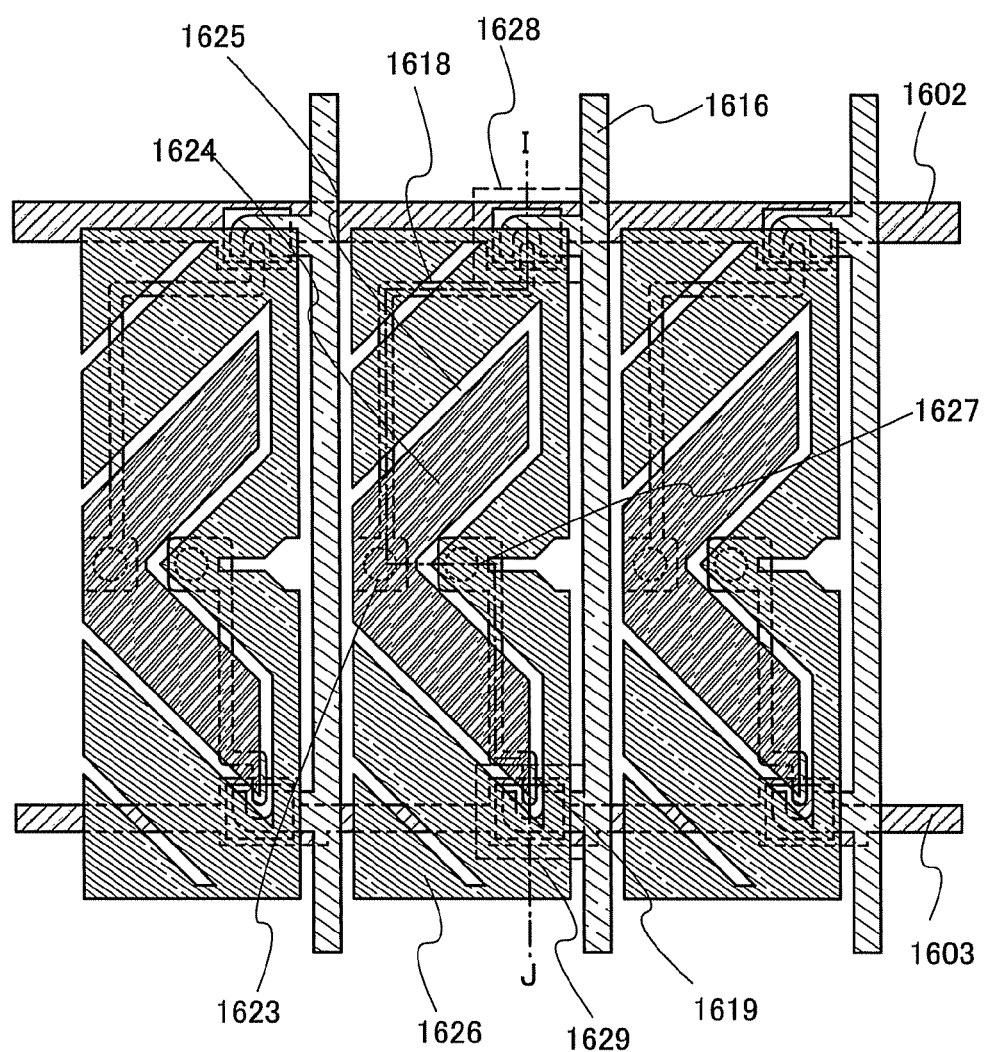
FIG. 27 is a view showing a display device of the present invention.
Figure 28:
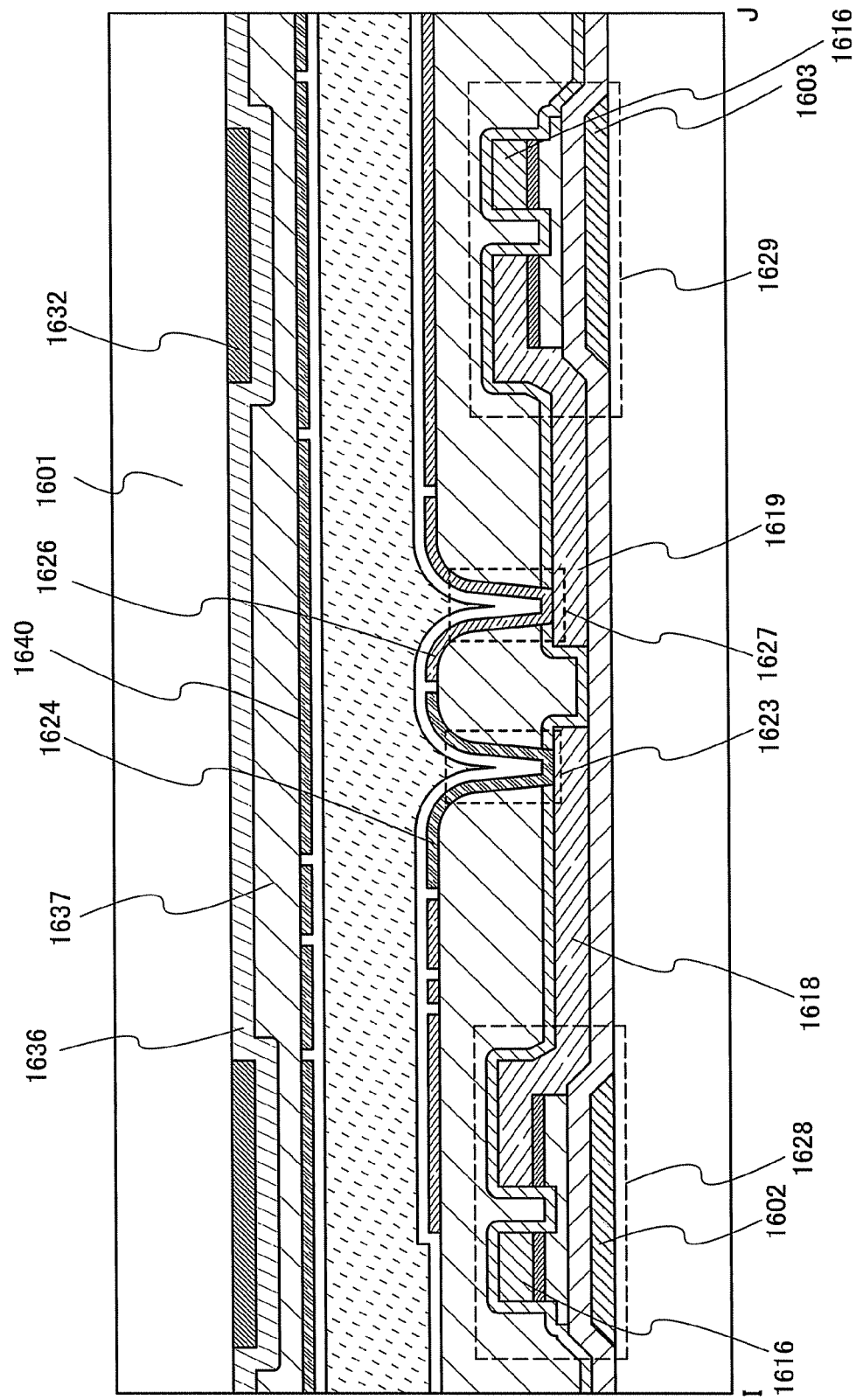
FIG. 28 is a view showing a display device of the present invention.

FIGS. 27 and 28 each show a pixel structure of a VA liquid crystal panel. FIG. 27 is a plan view, and FIG. 28 shows a cross-sectional structure taken along a line I-J. In the following description, both of these drawings are used.

In this pixel structure, a plurality of pixel electrodes are provided in one pixel, and each pixel electrode is connected to a TFT. Each TFT is constituted so as to be driven by a different gate signal. In other words, a multi-domain pixel has a structure in which a signal applied to each pixel electrode is independently controlled.

A pixel electrode layer 1624 is connected to a TFT 1628 with a wiring layer 1618 through an opening (contact hole) 1623. In addition, a pixel electrode layer 1626 is connected to a TFT 1629 with a wiring layer 1619 through an opening (contact hole) 1627. A gate wiring layer 1602 of the TFT 1628 and a gate electrode layer 1603 of the TFT 1629 are separated so as to be able to receive different gate signals. On the other hand, a wiring layer 1616 functioning as a data line is used in common by the TFTs 1628 and 1629.

A first composition including a conductive material is discharged along a contour of a pattern of each of a pixel electrode layer 1624 and a pixel electrode layer 1626 by a first droplet discharging step so that a frame-shaped first conductive layer is formed. A second composition including a conductive material is discharged so as to fill the frame-shaped first conductive layer so that a second conductive layer is formed. The first conductive layer and the second conductive layer can be used as a continuous pixel electrode layer, so that the pixel electrode layers 1624 and 1626 can be formed. Thus, since the process can be simplified and loss of materials can be prevented by the present invention, a display device can be manufactured at low cost with high productivity.

Figure 29:
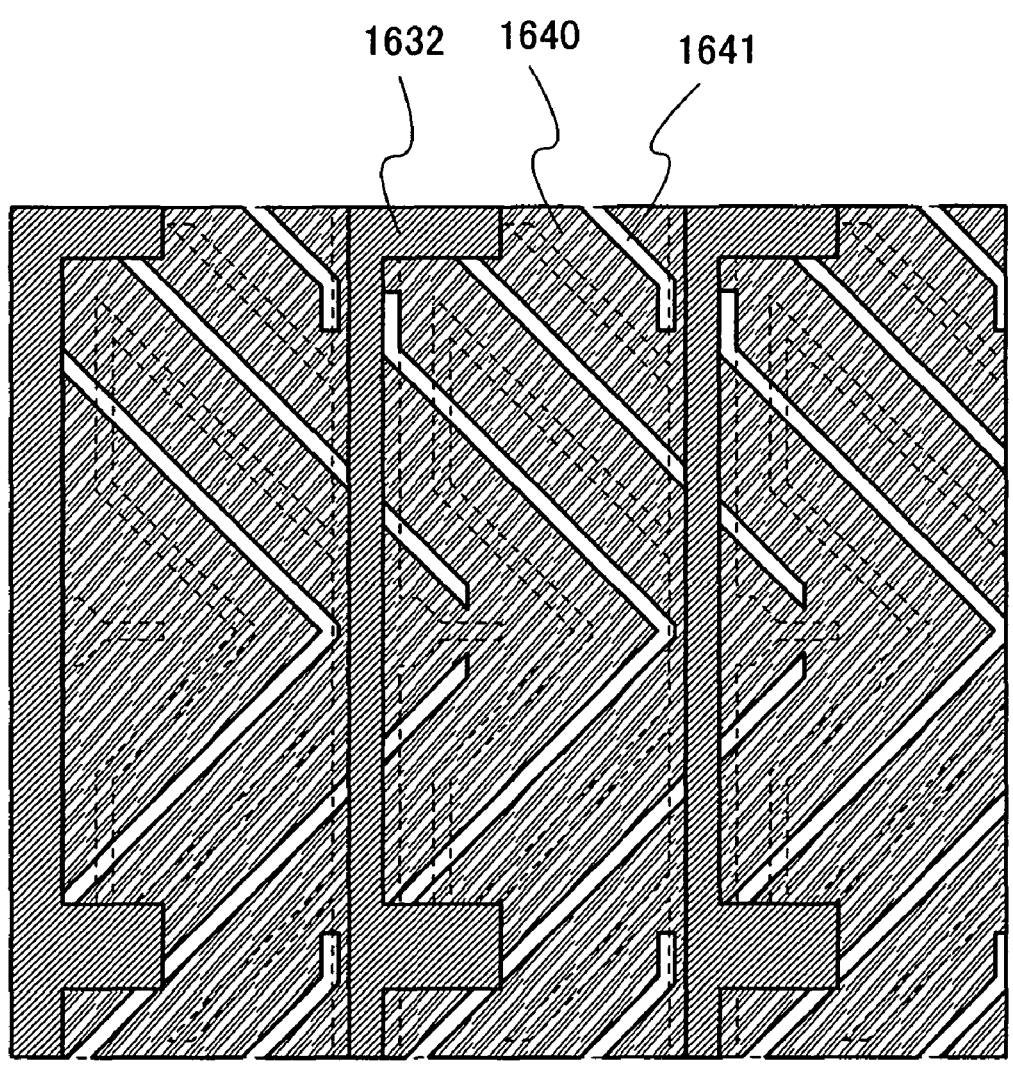
FIG. 29 is a view showing a display device of the present invention.

The shapes of the pixel electrode layers 1624 and 1626 are different, and the pixel electrode layers 1624 and 1626 are separated by a slit 1625. The pixel electrode layer 1626 is formed so as to surround the pixel electrode layer 1624 that is extended into a V shape. Timings of application of voltage to the pixel electrode layers 1624 and 1626 are made different in the TFTs 1628 and 1629, thereby controlling alignment of liquid crystals. A light-shielding film 1632, a colored layer 1636, and a counter electrode layer 1640 are formed over a counter substrate 1601. A planarization film 1637 is formed between the colored layer 1636 and the counter electrode layer 1640 so that disordered alignment of liquid crystals is prevented. FIG. 29 shows a structure on the counter substrate side. The counter electrode layer 1640 is used in common by different pixels, and a slit 1641 is formed. The slit 1641 and the slit 1625 on the side of the pixel electrode layers 1624 and 1626 are arranged so as to alternately interdigitate, and thus an oblique electric field can be effectively generated to control alignment of liquid crystals. Accordingly, an alignment direction of the liquid crystals can be varied depending on a place; therefore, the viewing angle can be widened.

Thus, a liquid crystal panel can be manufactured using a composite material of an organic compound and an inorganic compound for a pixel electrode layer. With the use of such a pixel electrode layer, it is not necessary to use a transparent conductive film containing indium as its main component and bottlenecks of materials can be resolved.

By the present invention, it is not necessary to use a complicated photolithography process including many steps for forming a contact hole; therefore, the steps can be simplified and productivity can be increased. Accordingly, loss of materials and the cost can be reduced. As a result, a high-performance and highly reliable display device can be manufactured with a high yield.

(Embodiment Mode 11)

Figure 30:
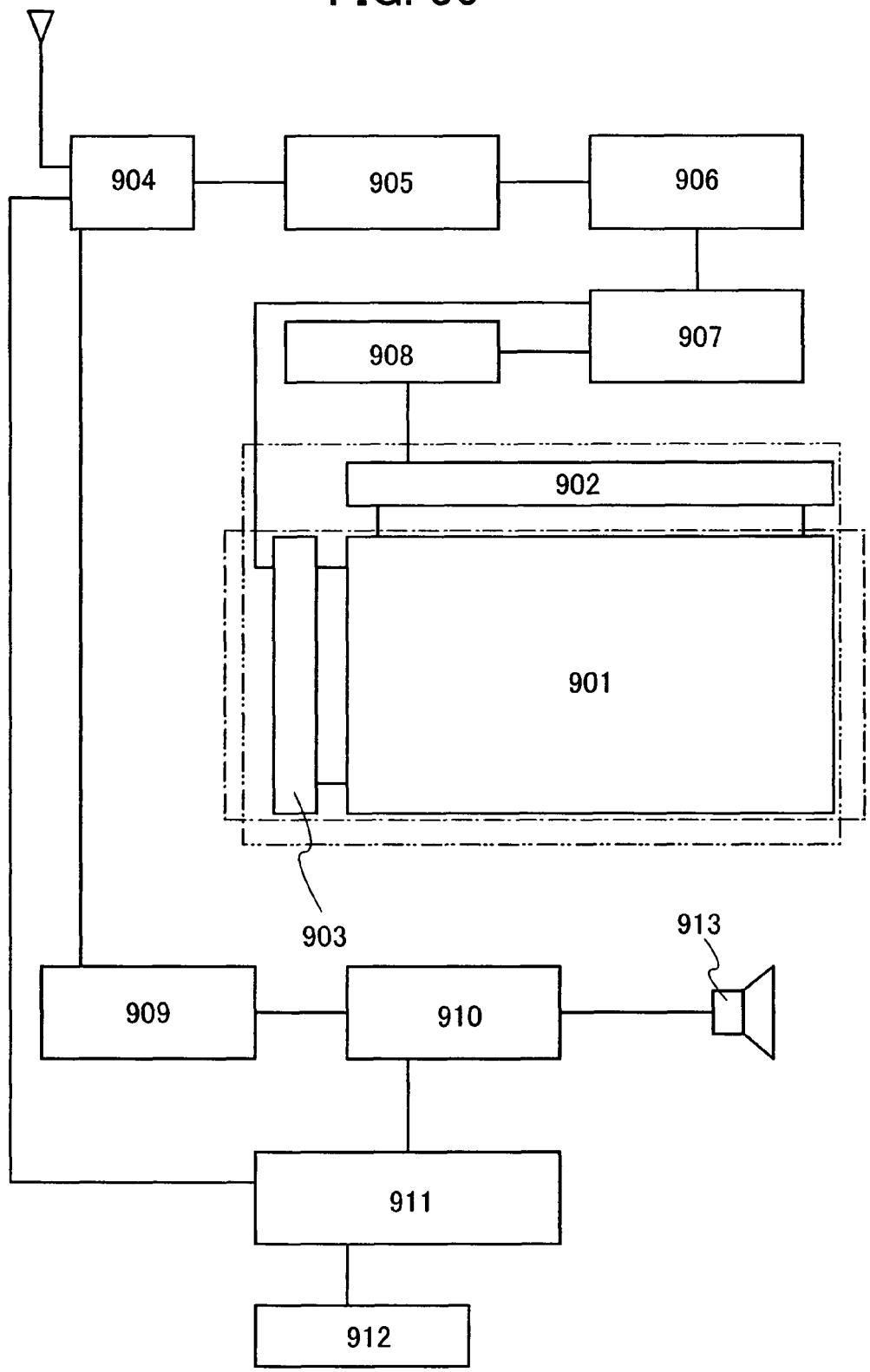
FIG. 30 is a block diagram showing a main structure of an electronic appliance to which the present invention is applied.

A television set (also referred to as a TV simply or a television receiver) can be completed using a display device formed by the present invention. FIG. 30 is a block diagram showing a main structure of a television set.

In FIG. 30, any of following modes may be employed: the mode in which only a pixel portion 901 is formed and a scan line driver circuit 903 and a signal line driver circuit 902 are mounted by a TAB method or by a COG method; the mode where a pixel portion 901 and a scan line driver circuit 903 are formed over a substrate and a signal line driver circuit 902 is separately mounted as a driver IC; the mode where a pixel portion 901, a signal line driver circuit 902, and a scan line driver circuit 903 are formed over one substrate; and the like.

In FIG. 30, as a structure of other external circuits, a video signal amplifier circuit 905 for amplifying a video signal among signals received by a tuner 904, a video signal processing circuit 906 for converting the signals outputted from the video signal amplifier circuit 905 into chrominance signals corresponding to colors of red, green, and blue respectively, a control circuit 907 for converting the video signal so as to be inputted to a driver IC, and the like are provided on an input side of the video signal. The control circuit 907 outputs signals to both a scan line side and a signal line side. In the case of digital driving, a signal dividing circuit 908 may be provided on the signal line side and an input digital signal may be split into m pieces to be supplied.

Among signals received by the tuner 904, an audio signal is transmitted to an audio signal amplifier circuit 909, and the output thereof is supplied to a speaker 913 through an audio signal processing circuit 910. A control circuit 911 receives control information on a receiving station (receiving frequency) or sound volume from an input portion 912 and transmits the signal to the tuner 904 or the audio signal processing circuit 910.

Figure 31A:
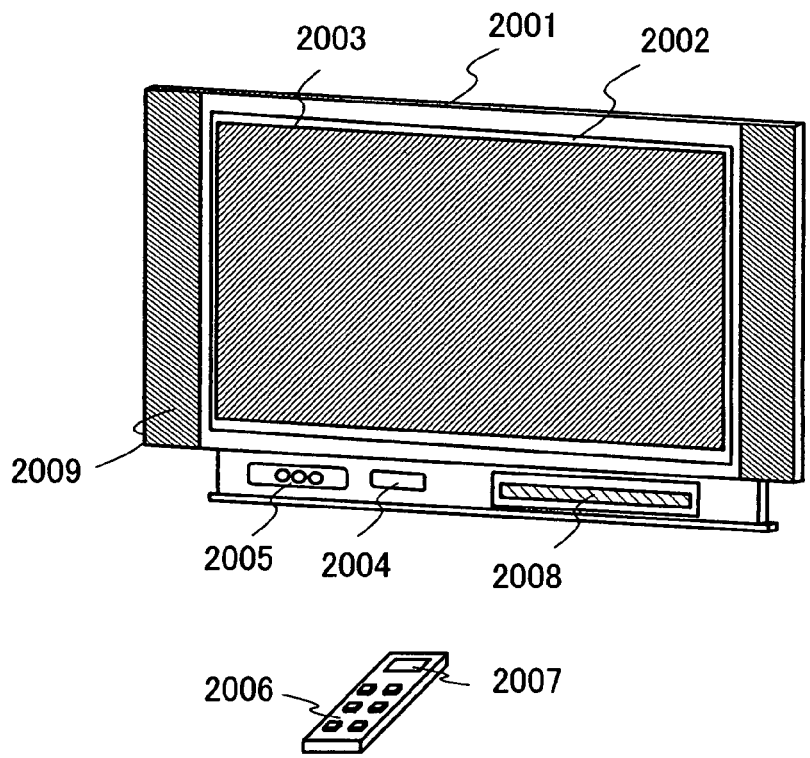
FIGS. 31A and 31B are views each showing an electronic appliance to which the present invention is applied.
Figure 31B:
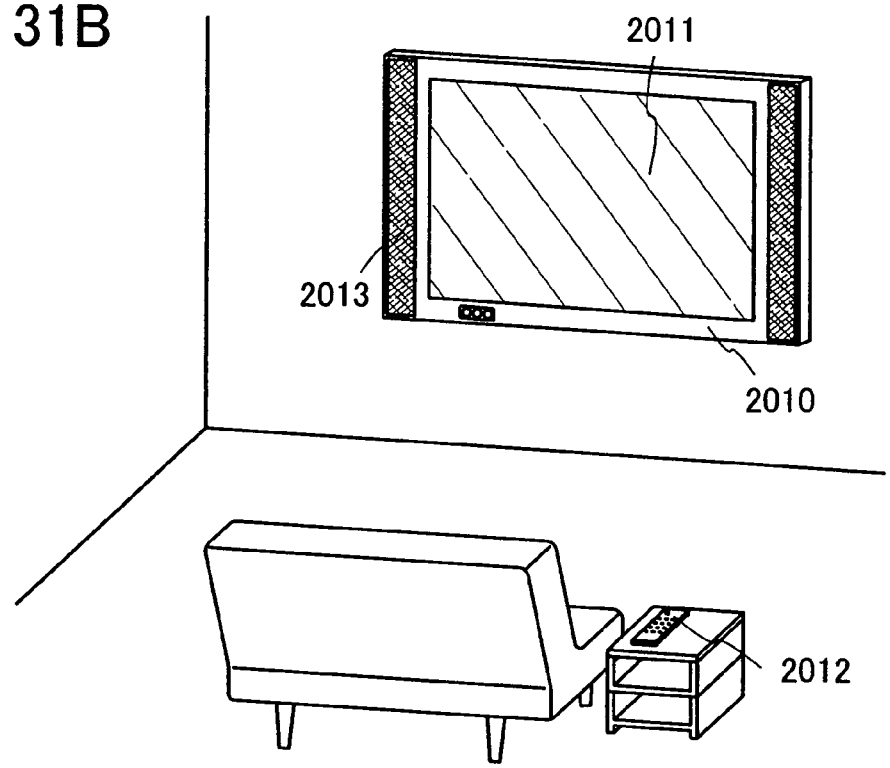

A television set can be completed by incorporating of the display module into a chassis as shown in FIGS. 31A and 31B. When a liquid crystal display module is used as a display module, a liquid crystal television set can be manufactured. When an EL display module is used, an EL television set can be manufactured. Alternatively, a plasma television, electronic paper, or the like can be manufactured. In FIG. 31A, a main screen 2003 is formed using the display module, and a speaker portion 2009, an operation switch, and the like are provided as its accessory equipment. Thus, a television set can be completed by the present invention.

A display panel 2002 is incorporated in a chassis 2001. With the use of a receiver 2005, in addition to reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the chassis or by a remote control device 2006 separated from the main body. A display portion 2007 that displays information to be outputted may also be provided in this remote control device.

In addition, in the television set, a structure for displaying a channel, sound volume, or the like may be additionally provided by formation of a subscreen 2008 with a second display panel in addition to the main screen 2003. In this structure, the main screen 2003 and the subscreen 2008 can be formed using a liquid crystal display panel of the present invention. Alternatively, the main screen 2003 may be formed using an EL display panel superior in a viewing angle, and the subscreen 2008 may be formed using a liquid crystal display panel capable of displaying with low power consumption. In order to prioritize low power consumption, a structure in which the main screen 2003 is formed using a liquid crystal display panel, the subscreen 2008 is formed using an EL display panel, and the sub-screen is able to flash on and off may be employed. By the present invention, a highly reliable display device can be manufactured even with the use of such a large substrate, many TFTs, and electronic components.

FIG. 31B shows a television set having a large display portion, for example, 20-inch to 80-inch display portion, which includes a chassis 2010, a display portion 2011, a remote control device 2012 which is an operation portion, a speaker portion 2013, and the like. The present invention is applied to manufacture of the display portion 2011. The television set shown in FIG. 31B is a wall-hanging type, and does not need a wide space.

It is necessary to say that the present invention is not limited to the television set and is also applicable to various uses as, in particular, a display medium with a large area, for example, a monitor of a personal computer, an information display board at a train station, an airport, or the like, or an advertisement display board on the street.

(Embodiment Mode 12)

Electronic appliances of the present invention include a television set (also referred to as a TV simply or a television receiver), cameras such as a digital camera and a digital video camera, a mobile phone set (also simply referred to as a mobile phone simply), a portable information terminal such as a PDA, a portable game machine, a monitors for a computer, a computer, an audio reproducing device such as a car audio set, an image reproducing device provided with a recording medium, such as a home-use game machine, and the like. Specific examples thereof is described with reference to FIGS. 32A to 32E.

Figure 32A:
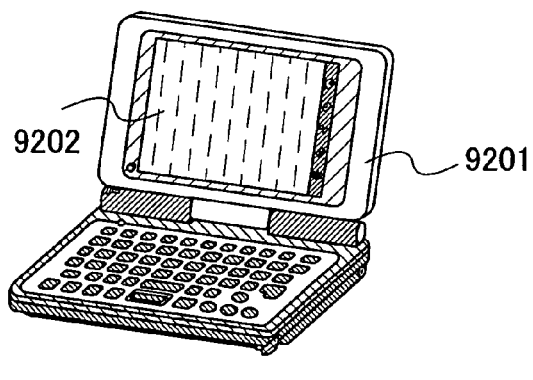
FIGS. 32A to 32E are views each showing an electronic appliance to which the present invention is applied.

A portable information terminal shown in FIG. 32A includes a main body 9201, a display portion 9202, and the like. The display device of the present invention can be applied to the display portion 9202. Accordingly, being manufactured through a simplified process at low cost, a portable information terminal which is highly reliable can be provided at low cost.

Figure 32B:
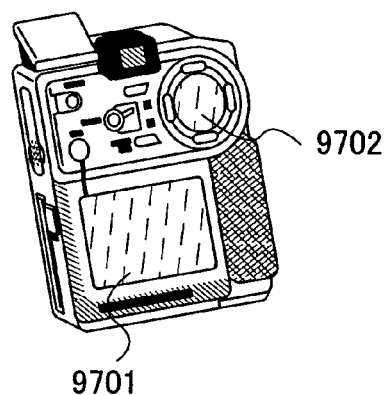

A digital video camera shown in FIG. 32B includes a display portion 9701, a display portion 9702, and the like. The display device of the present invention can be applied to the display portion 9701. Accordingly, being manufactured through a simplified process at low cost, a digital video camera which is highly reliable can be provided at low cost.

Figure 32C:
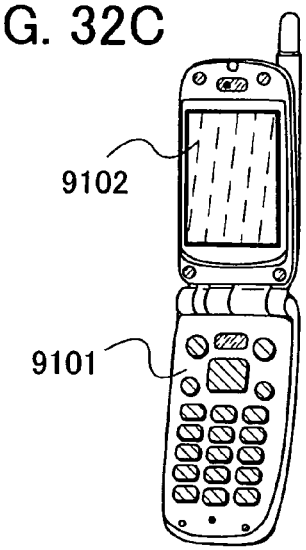

A mobile phone shown in FIG. 32C includes a main body 9101, a display portion 9102, and the like. The display device of the present invention can be applied to the display portion 9102. Accordingly, being manufactured through a simplified process at low cost, a mobile phone which is highly reliable can be provided at low cost.

Figure 32D:
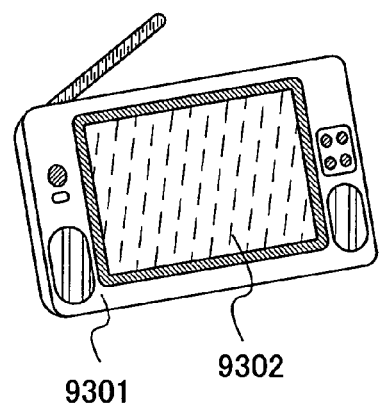

A portable television set shown in FIG. 32D includes a main body 9301, a display portion 9302, and the like. The display device of the present invention can be applied to the display portion 9302. Accordingly, being manufactured through a simplified process at low cost, a portable television set which is highly reliable can be provided at low cost. The display device of the present invention can be applied to various types of television sets including a small-sized one mounted on a portable terminal such as a mobile phone, a medium-sized one that is portable, and a large-sized one (for example, 40 inches or more in size).

Figure 32E:
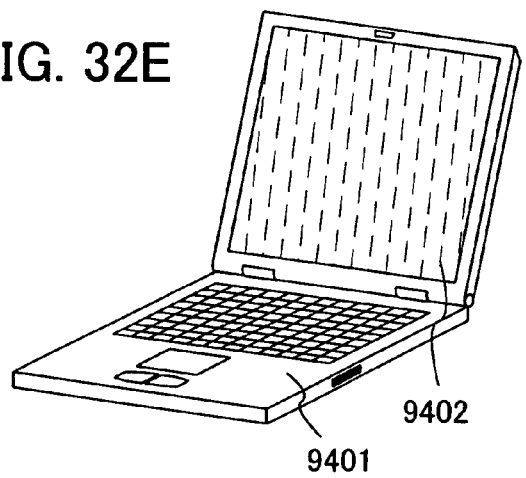

A portable computer shown in FIG. 32E includes a main body 9401, a display portion 9402, and the like. The display device of the present invention can be applied to the display portion 9402. Accordingly, being manufactured through a simplified process at low cost, a portable computer which is highly reliable can be provided at low cost.

As described above, with the use of the display device of the present invention, high-performance electronic appliances that can display an image with high quality and excellent visibility can be provided.

This application is based on Japanese Patent Application serial no. 2006-235522 filed in Japan Patent Office on 31, Aug., 2006, the entire contents of which are hereby incorporated by reference.

What is claimed is:

1. A method for manufacturing a semiconductor device comprising:
    forming a light absorbing layer;
    forming a light-transmitting layer on the light absorbing layer;
    homogenizing energy distribution of a linear laser beam;
    emitting the linear laser beam with a homogenized energy onto a mask and thereby splitting the linear laser beam;
    emitting the split linear laser beam onto the light-transmitting layer on the light absorbing layer in a first period, and thereby forming a first opening in the light-transmitting layer and the light absorbing layer;
    emitting the split linear laser beam onto the light-transmitting layer on the light absorbing layer in a second period, and thereby forming a second opening in the light-transmitting layer and the light absorbing layer; and
    shielding the light-transmitting layer from the split linear laser beam during a period between the first period and the second period.

2. The method for manufacturing a semiconductor device according to claim 1, wherein the mask is a mask having a plurality of hole, a binary mask, or a phase shift mask.

3. A method for manufacturing a semiconductor device comprising:
    forming a light absorbing layer;
    forming a light-transmitting layer on the light absorbing layer;
    homogenizing energy distribution of a linear laser beam;
    emitting the linear laser beam with a homogenized energy onto a mask and thereby splitting the linear laser beam into a plurality of laser beams;
    condensing each of the plurality of laser beams through a micro lens array comprising a plurality of lenses so as to form a plurality of condensed laser beams; and
    emitting the plurality of condensed laser beams onto the light-transmitting layer on the light absorbing layer and thereby forming a plurality of openings in the light-transmitting layer and the light absorbing layer,
    wherein the micro lens array is arranged at a position so that one of the plurality of laser beams is incident on one of the plurality of lenses included in the micro lens array.

4. The method for manufacturing a semiconductor device according to claim 3, wherein the mask is a mask having a plurality of hole, a binary mask, or a phase shift mask.

5. A method for manufacturing a semiconductor device comprising:
    forming a first conductive layer;
    forming an insulating layer on the first conductive layer;
    homogenizing energy distribution of a linear laser beam;
    emitting the linear laser beam with a homogenized energy onto a mask and thereby splitting the linear laser beam;
    emitting the split linear laser beam onto the insulating layer on the first conductive layer in a first period, and thereby forming a first opening in the insulating layer and the first conductive layer;
    emitting the split linear laser beam onto the insulating layer on the first conductive layer in a second period, and thereby forming a second opening in the insulating layer and the first conductive layer;
    shielding the insulating layer from the split linear laser beam during a period between the first period and the second period; and
    forming a second conductive layer in the first and second openings and on the insulating layer,
    wherein the second conductive layer is electrically connected to the first conductive layer in the first and second openings,
    wherein the first conductive layer is a light absorbing layer, and
    wherein the insulating layer is a light-transmitting layer.

6. The method for manufacturing a semiconductor device according to claim 5, wherein the mask is a mask having a plurality of hole, a binary mask, or a phase shift mask.

7. A method for manufacturing a semiconductor device comprising:
    forming a first conductive layer;
    forming an insulating layer on the first conductive layer;
    homogenizing energy distribution of a linear laser beam;
    emitting the linear laser beam with a homogenized energy onto a mask and thereby splitting the linear laser beam into a plurality of laser beams;
    condensing each of the plurality of laser beams through a micro lens array comprising a plurality of lenses so as to form a plurality of condensed laser beams;
    emitting the plurality of condensed laser beams onto the insulating layer on the first conductive layer, and thereby forming a plurality of openings in the insulating layer and the first conductive layer; and
    forming a second conductive layer in the plurality of openings and on the insulating layer,
    wherein the micro lens array is arranged at a position so that one of the plurality of laser beams is incident on one of the plurality of lenses included in the micro lens array,
    wherein the second conductive layer is electrically connected to the first conductive layer in the plurality of openings,
    wherein the first conductive layer is a light absorbing layer, and
    wherein the insulating layer is a light-transmitting layer.

8. The method for manufacturing a semiconductor device according to claim 7, wherein the mask is a mask having a plurality of hole, a binary mask, or a phase shift mask.

* * * * *